(12) United States Patent
Tomimatsu

(10) Patent No.: US 9,076,857 B2
(45) Date of Patent: Jul. 7, 2015

(54) SEMICONDUCTOR DEVICE AND MANUFACTURING METHOD THEREOF

(71) Applicant: Renesas Electronics Corporation, Kanagawa (JP)

(72) Inventor: Takahiro Tomimatsu, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 13/740,783

(22) Filed: Jan. 14, 2013

(65) Prior Publication Data

US 2013/0207203 A1 Aug. 15, 2013

(30) Foreign Application Priority Data

Feb. 10, 2012 (JP) .................................. 2012-027720

(51) Int. Cl.
| | |
|---|---|
| *H01L 29/51* | (2006.01) |
| *H01L 29/78* | (2006.01) |
| *H01L 29/66* | (2006.01) |
| *H01L 21/8238* | (2006.01) |
| *H01L 21/28* | (2006.01) |

(52) U.S. Cl.
CPC .......... *H01L 29/78* (2013.01); *H01L 29/66477* (2013.01); *H01L 21/823857* (2013.01); *H01L 21/28185* (2013.01); *H01L 29/513* (2013.01); *H01L 29/518* (2013.01); *H01L 29/66545* (2013.01)

(58) Field of Classification Search
CPC .............................. H01L 29/513; H01L 29/518
USPC ........................................... 257/411, E21.192
See application file for complete search history.

(56) References Cited

U.S. PATENT DOCUMENTS

| | | | |
|---|---|---|---|
| 5,798,278 A | * | 8/1998 | Chan et al. .................... 438/300 |
| 7,989,283 B2 | | 8/2011 | Yamanari et al. |
| 2005/0082625 A1 | * | 4/2005 | Kim et al. ..................... 257/412 |

(Continued)

FOREIGN PATENT DOCUMENTS

| | | |
|---|---|---|
| JP | 2010103130 | 5/2010 |
| JP | 2010-287752 | 12/2010 |
| JP | 2011077421 | 4/2011 |

OTHER PUBLICATIONS

Japanese Office Action, dated Apr. 21, 2015, in corresponding Japanese Patent Application No. 2012-027720.

* cited by examiner

*Primary Examiner* — Amar Movva
(74) *Attorney, Agent, or Firm* — Young & Thompson

(57) ABSTRACT

Over a semiconductor substrate, a gate insulating film including an interfacial layer, a HfON film, and a HfSiON film is formed. Then, over the HfSiON film, an Al-containing film and a mask layer are formed. Subsequently, the mask layer and the Al-containing film are selectively removed from an n-channel MISFET formation region. Then, a rare-earth-element-containing film is formed over the HfSiON film in the n-channel MISFET formation region and over the mask layer in a p-channel MISFET formation region. Heat treatment is performed to cause a reaction between each of the HfON film and the HfSiON film and the rare-earth-element-containing film in the n-channel MISFET formation region and cause a reaction between each of the HfON film and the HfSiON film and the Al-containing film in the p-channel MISFET formation region. Thereafter, the unreacted rare-earth-element-containing film and the mask layer are removed, and then metal gate electrodes are formed.

5 Claims, 25 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2012-027720 filed on Feb. 10, 2012 including the specification, drawings and abstract is incorporated herein by reference in its entirety.

BACKGROUND

The present invention relates to a semiconductor device and a manufacturing method thereof, and particularly to a technology which is effective when applied to a semiconductor device including a MISFET having a high-dielectric-constant gate insulating film and a metal gate electrode and to a manufacturing method thereof.

By forming a gate insulating film over a semiconductor substrate, forming a gate electrode over the gate insulating film, and forming source/drain regions by ion implantation or the like, a MISFET (Metal Insulator Semiconductor Field Effect Transistor) can be formed. For the gate electrode, a polysilicon film is typically used.

However, in recent years, as a MISFET element has been scaled down, a gate insulating film has been increasingly thinned, and the influence of the depletion of a gate electrode when a polysilicon film is used for the gate electrode cannot be ignored any longer. Accordingly, there is a technique which uses a metal gate electrode as the gate electrode to suppress the phenomenon of depletion of the gate electrode.

When the gate insulating film is increasingly thinned as a result of the scaling down of a MISFET element and a thin silicon oxide film is used as the gate insulating film, between the channel portion of the MISFET and the gate electrode thereof, electrons and holes tunnel through a barrier formed by the silicon oxide film. As a result, a so-called tunnel current is produced to undesirably increase a gate leakage current. Accordingly, there is a technique which uses a material (high-dielectric-constant film) having a dielectric constant higher than that of the silicon oxide film to increase the physical film thickness and thereby reduce a leakage current despite the same capacitance.

Japanese Unexamined Patent Publication No. 2010-287752 (Patent Document 1) discloses a technique which uses a hafnium-containing material for a High-k film.

RELATED ART DOCUMENT

Patent Document

[Patent Document 1]
Japanese Unexamined Patent Publication No. 2010-287752

SUMMARY

As a result of conducting study, the present inventors have made the following findings.

As a high-dielectric-constant film (High-k film) for a gate insulating film, a Hf-based gate insulating film which is a high-dielectric-constant film containing Hf is excellent. However, when the Hf-based gate insulating film is used, to ensure each of enhanced performance of a transistor in a semiconductor device and the reliability thereof, it is important to control the diffusion of nitrogen into an IL (Inter Layer)/High-k interface (in which IL is a $SiO_2$ film for improving the characteristics of the interface between the High-k gate insulating film and a Si substrate). Therefore, it is necessary to improve the step of forming the Hf-based gate insulating film and a configuration.

An object of the present invention is to provide a technology which can enhance the performance of a semiconductor device and improve the reliability thereof.

The above and other objects and novel features of the present invention will become apparent from a statement in the present specification and the accompanying drawings.

The following is a brief description of the outline of a representative aspect of the invention disclosed in the present application.

A semiconductor device according to a representative embodiment includes a Hf-based gate insulating film containing hafnium, oxygen, nitrogen, and silicon. The concentration distribution of silicon in the thickness direction of the Hf-based gate insulating film is higher in the upper part thereof than in the lower part thereof.

A manufacturing method of a semiconductor device according to the representative embodiment uses a laminate film including a HfON film and a HfSiON film stacked thereover to form a high-dielectric-constant gate insulating film.

The following is a brief description of effects achievable by the representative aspect of the invention disclosed in the present application.

According to the representative embodiment, the performance of the semiconductor device can be improved.

DETAILED DESCRIPTION

Figure 1:
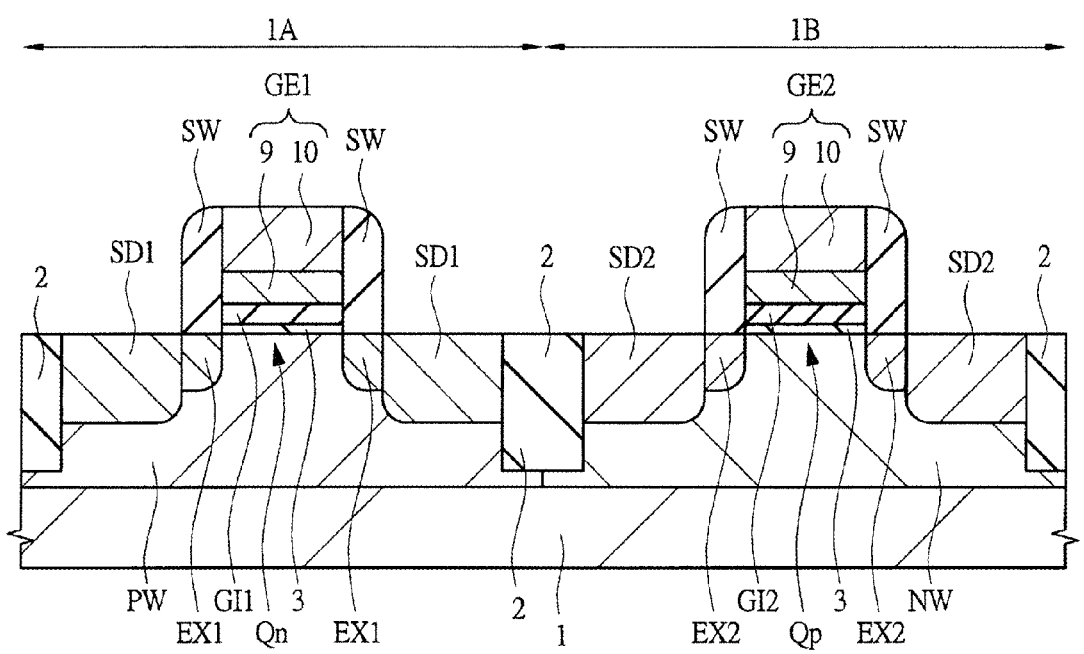
FIG. 1 is a main-portion cross-sectional view of a semiconductor device as an embodiment of the present invention.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others. When the number and the like (including the number, numerical value, amount, range, and the like) of elements are referred to in the following embodiments, they are not limited to specific numbers unless particularly explicitly described otherwise or unless they are obviously limited to specific numbers in principle. The number and the like of the elements may be not less than or not more than specific numbers. In the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments of the present invention will be described in detail with reference to the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

(Embodiment 1)

A semiconductor device of the present embodiment will be described with reference to the drawings.

FIG. 1 is a main-portion cross-sectional view of a semiconductor as an embodiment of the present invention, which is a semiconductor device having a CMISFET (Complementary Metal Insulator Semiconductor Field Effect Transistor) herein.

As shown in FIG. 1, the semiconductor device of the present embodiment has an n-channel MISFET (Metal. Insulator Semiconductor Field Effect Transistor) Qn formed in an n-channel MISFET formation region 1A of a semiconductor substrate 1 and a p-channel MISFET Qp formed in a p-channel MISFET formation region 1B of the semiconductor substrate 1.

That is, the semiconductor substrate 1 made of p-type single-crystal silicon or the like has the n-channel MISFET formation region 1A and the p-channel MISFET formation region 1B defined by an isolation region 2 and electrically isolated from each other. In the semiconductor substrate 1 in the n-channel MISFET formation region 1A, a p-type well PW is formed while, in the semiconductor substrate 1 in the p—channel MISFET formation region 1B, an n-type well NW is formed. Over the surface of the p-type well PW in the n-channel MISFET formation region 1A, a gate electrode (metal gate electrode) GE1 of the n-channel MISFET Qn is formed via a Hf-containing insulating film (high-dielectric-constant gate insulating film) GI1 functioning as the gate insulating film of the n-channel MISFET Qn. On the other hand, over the surface of the n-type well NW in the p-channel. MISFET formation region 1B, a gate electrode (metal gate electrode) GE2 of the p-channel MISFET Op is formed via a Hf-containing insulating film (high-dielectric-constant gate insulating film) GI2 functioning as the gate insulating film of the p-channel MISFET Qp.

The Hf-containing insulating films GI1 and GI2 can also be formed directly on the surface (silicon surface) of the semiconductor substrate 1 (each of the p-type well PW and the n-type well NW) (i.e., an interfacial layer 3 can be omitted). However, it is more preferable to provide the insulating interfacial layer 3 comprised of a thin silicon oxide film or silicon oxynitride at each of the interface between the Hf-containing insulating film GI1 and the semiconductor substrate 1 (p-type well PW) and the interface between the Hf-containing insulating film GI2 and the semiconductor substrate 1 (n-type well PW). By providing the interfacial layer (insulating layer or insulating film) 3 comprised of a thin silicon oxide film or silicon oxynitride, the interface between the gate insulating film and the semiconductor substrate (the silicon surface thereof) is formed into a $SiO_2/Si$ (or $SiON/Si$) structure to reduce the number of defects such as trap levels and allow improvements in driving ability and reliability.

The Hf-containing insulating films GI1 and GI2 are insulating material films each having a dielectric constant (specific permittivity) higher than that of a silicon oxide, i.e., so-called High-k films (high-dielectric-constant films). Note that, when a High-k film, a high-dielectric-constant film, or a high-dielectric-constant gate insulating film is mentioned in the present application, it means a film having a dielectric constant (specific permittivity) higher than that of a silicon oxide ($SiO_x$ represented by $SiO_2$). In the present application, a gate insulating film containing Hf may be referred to also as a Hf-based gate insulating film.

The Hf-containing insulating films GI1 and GI2 are each made of an insulating material containing Hf (hafnium), O (oxygen), N (nitrogen), and Si (silicon) as main components thereof. It is more preferable that the Hf-containing insulating film GI1 functioning as the gate insulating film (high-dielectric-constant gate insulating film) of the n-channel MISFET Qn further contains a rare earth element (particularly preferably La (lanthanum)) as an element for achieving a lower threshold. It is also more preferable that the Hf-containing insulating film GI2 functioning as the gate insulating film (high-dielectric-constant gate insulating film) of the p-channel MISFET Qp further contains Al (aluminum) as an element for achieving a lower threshold.

Accordingly, if the rare earth element contained in the Hf-containing insulating film GI1 is represented by Ln, as the Hf-containing insulating film GI1, a HfLnSiON film can be used appropriately. On the other hand, as the Hf-containing insulating film GI2, a HfAlSiON film can be used appropriately. Here, the HfLnSiON film is an insulating material film including hafnium (Hf), the rare earth element (Ln), silicon (Si), oxygen (O), and nitrogen (N), while the HfAlSiON film is an insulating material film including hafnium (Hf), aluminum (Al), silicon (Si), oxygen (O), and nitrogen (N). As the rare earth element Ln contained in the Hf-containing insulating film GI1 to reduce the threshold of the n-channel MISFET Qn, La (lanthanum) is particularly preferred.

Note that, in the present application, rare earths or rare earth elements are assumed to indicate lanthanoids, i.e., lanthanum (La) to lutecium (Lu) and additional scandium (Sc) and yttrium (Y). A reduction in the threshold of a MISFET corresponds to reducing (lowering) the absolute value of the threshold (threshold voltage) of the MISFET. An increase in the threshold of a MISFET corresponds to increasing (enlarging) the absolute value of the threshold (threshold voltage) of the MISFET. In the case of using the notation of the HfAlSiON film (or HfAlSiON), the atomic ratio between Hf, Al, Si, O, and N in the HfAlSiON film (or HfAlSiON) is not limited to 1:1:1:1:1. This also similarly applies to a HfO film, a HfSiO film, a HfON film, a HfSiON film, a HfLnSiON film, a HfLaSiON film, a TiN film, a TaN film, a WN film, or the like.

Each of the gate electrodes GE1 and GE2 is comprised of a laminate film (laminate structure) including a metal film (metal layer or metal gate film) 9 formed over the gate insulating film (which is the Hf-containing insulating film GI1 in the n-channel MISFET formation region LA and the Hf-containing insulating film GI2 in the p-channel MISFET formation region 1B) to be in contact with the gate insulating film (which is the Hf-containing insulating film GI1 in the n-channel MISFET formation region 1A and the Hf-containing insulating film GI2 in the p-channel MISFET formation region 1B), and a silicon film 10 stacked over the metal, film 9. Of the gate electrodes GE1 and GE2, the gate electrode GE1 is formed in the n-channel MISFET formation region 1A and the gate electrode GE2 is formed in the p-channel MISFET formation region 1B.

The gate electrode GE1 has the metal film 9 in contact with the Hf-containing insulating film GI1 as the high-dielectric-constant gate insulating film. The gate electrode GE2 has the metal film 9 in contact with the Hf-containing insulating film GI2 as the high-dielectric-constant gate insulating film. Each of the gate electrodes GE1 and GE2 is a so-called metal gate electrode (metallic gate electrode).

Note that, in the present application, a metal film (metal layer) refers to a conductive film (conductive layer) showing metallic conduction and is assumed to include not only a single-element metal film (pure metal film) or an alloy film, but also a metal compound film (such as a metal nitride film or a metal carbide film) showing metallic conduction.

Accordingly, the metal film 9 is a conductive film showing metallic conduction and has a resistivity as low as that of a metal.

Preferably, the metal film 9 is made of a metal nitride (i.e., a metal nitride film), and a titanium nitride (TiN) film, a tantalum nitride (TaN) film, or a tungsten nitride (WN) film is preferred. Among them, the titanium nitride (TiN) film is particularly preferred as the metal film 9.

In the p-type well PW in the n-channel MISFET formation region 1A, as the source/drain regions of the n-channel MISFET Qn having an LDD (Lightly doped Drain) structure, n$^-$-type semiconductor regions (extension regions or LDD regions) EX1 and n$^+$-type semiconductor regions (source/drain regions) SD1 having impurity concentrations higher than those of the N$^-$-type semiconductor regions EX1 are formed. On the other hand, in the n-type well NW in the p-channel MISFET formation region 1B, as the source/drain regions of the p-channel MISFET Op having an LDD structure, p$^-$-type semiconductor regions (extension regions or LDD regions) EX2 and p$^+$-type semiconductor regions (source/drain regions) SD2 having impurity concentrations higher than those of the p$^-$-type semiconductor regions EX2 are formed. The n$^+$-type semiconductor regions SD1 have impurity concentrations higher than those of the n$^-$-type semiconductor regions EX1 and junction depths deeper than those of the n$^-$-type semiconductor regions EX1. The p$^+$-type semiconductor regions SD2 have impurity concentrations higher than those of the p$^-$-type semiconductor regions EX2 and junction depths deeper than those of the p$^-$-type semiconductor regions EX2.

Over the side walls of the gate electrodes GE1 and GE2, sidewall spacers (side wall spacers, side wall insulating films, or sidewalls) SW each made of an insulator (insulating film) are formed. In the n-channel MISFET formation region 1A, the n$^-$-type semiconductor regions EX1 are formed by alignment with the gate electrode GE1 and the n$^+$-type semiconductor regions SD1 are formed by alignment with the sidewall spacers SW provided over the side walls of the gate electrode GE1. In the p-channel MISFET formation region 1B, the p$^-$-type semiconductor regions EX2 are formed by alignment with the gate electrode GE2 and the p$^+$-type semiconductor regions SD2 are formed by alignment with the sidewall spacers SW provided over the side walls of the gate electrode GE2. That is, the n$^-$-type semiconductor regions EX1 are located under the sidewall spacers SW formed over the side walls of the gate electrode GE1 to be interposed between the channel region of the n-channel MISFET Qn and the n$^+$-type semiconductor regions SD1, while the p$^-$-type semiconductor regions EX2 are located under the sidewall spacers SW formed over the side walls of the gate electrode GE2 to be interposed between the channel region of the p-channel MISFET Qp and the p$^+$-type semiconductor regions SD2. Over the surfaces of the n$^+$-type semiconductor regions SD1, the p$^+$-type semiconductor regions SD2, and the silicon film 10, using a salicide (Self Aligned Silicide) technique, a metal silicide layer (not shown) such as a cobalt silicide layer or a nickel silicide layer can also be formed.

In the case where offset spacers OS are formed as will be described later, it follows that the offset spacers OS described later are interposed between the sidewall spacers SW and the gate electrodes GE1 and GE2 (See FIG. 21 described later). In the case where offset spacers OS1 described later are formed, the n$^-$-type semiconductor regions EX1 are formed by alignment with the offset spacers OS1 over the side walls of the gate electrode GE1. In the case where offset spacers OS1 and OS2 described later are formed, the p$^+$-type semiconductor regions EX2 are formed by alignment with the offset spacers OS2 over the side walls of the gate electrode GE2.

There are also formed an insulating film (interlayer insulating film) 11, contact holes CNT, plugs PG, an insulating film 12, interconnect wires M1 (See FIGS. 21 and 22 described later) each described later, and a multilayer interconnect structure in upper layers. However, the illustration and description thereof is omitted here.

Next, the manufacturing steps of the semiconductor device of the present embodiment will be described with reference to the drawings.

Figure 2:
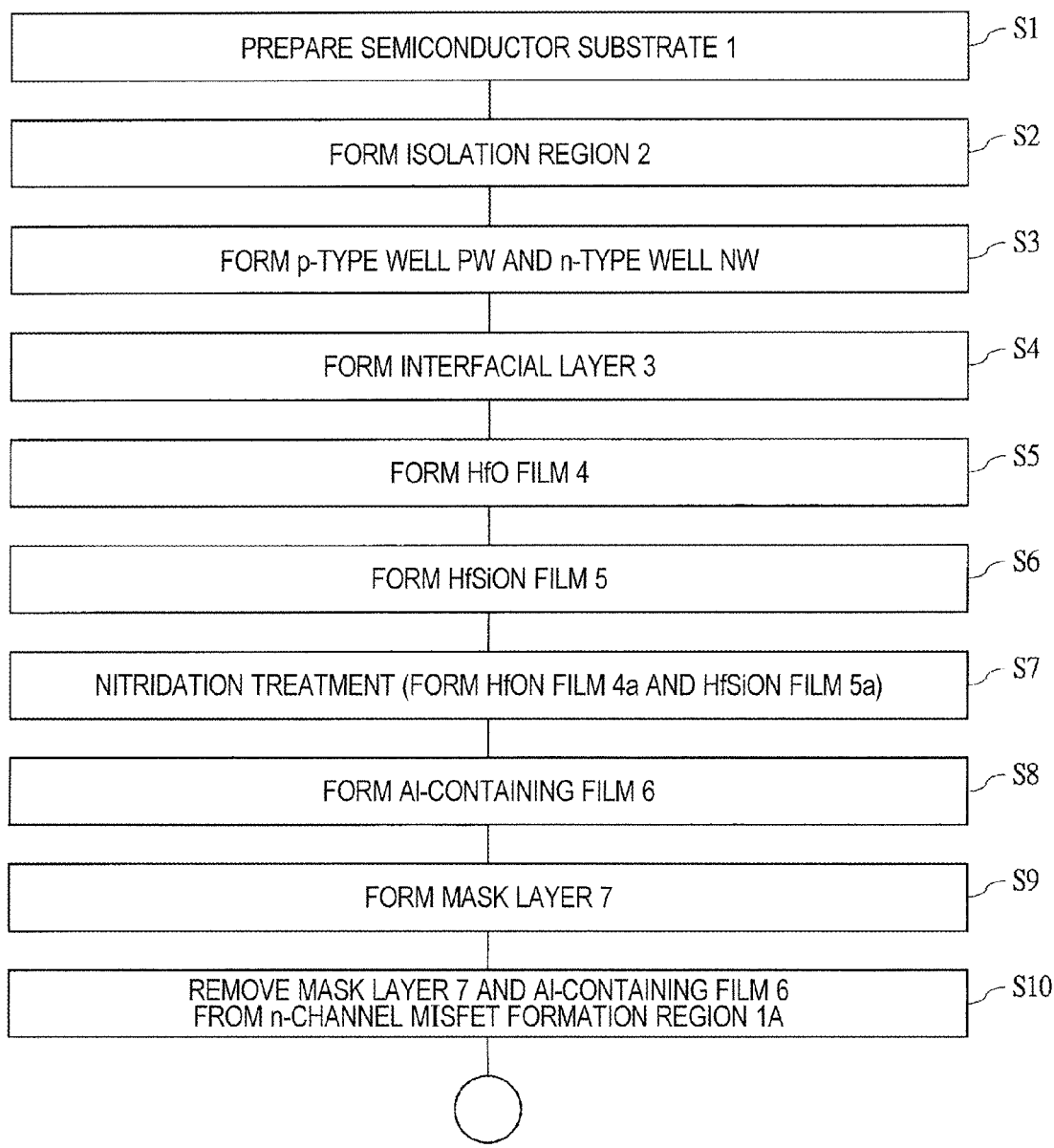
FIG. 2 is a manufacturing process flow chart showing some of the manufacturing steps of the semiconductor device as the embodiment of the present invention.
Figure 3:
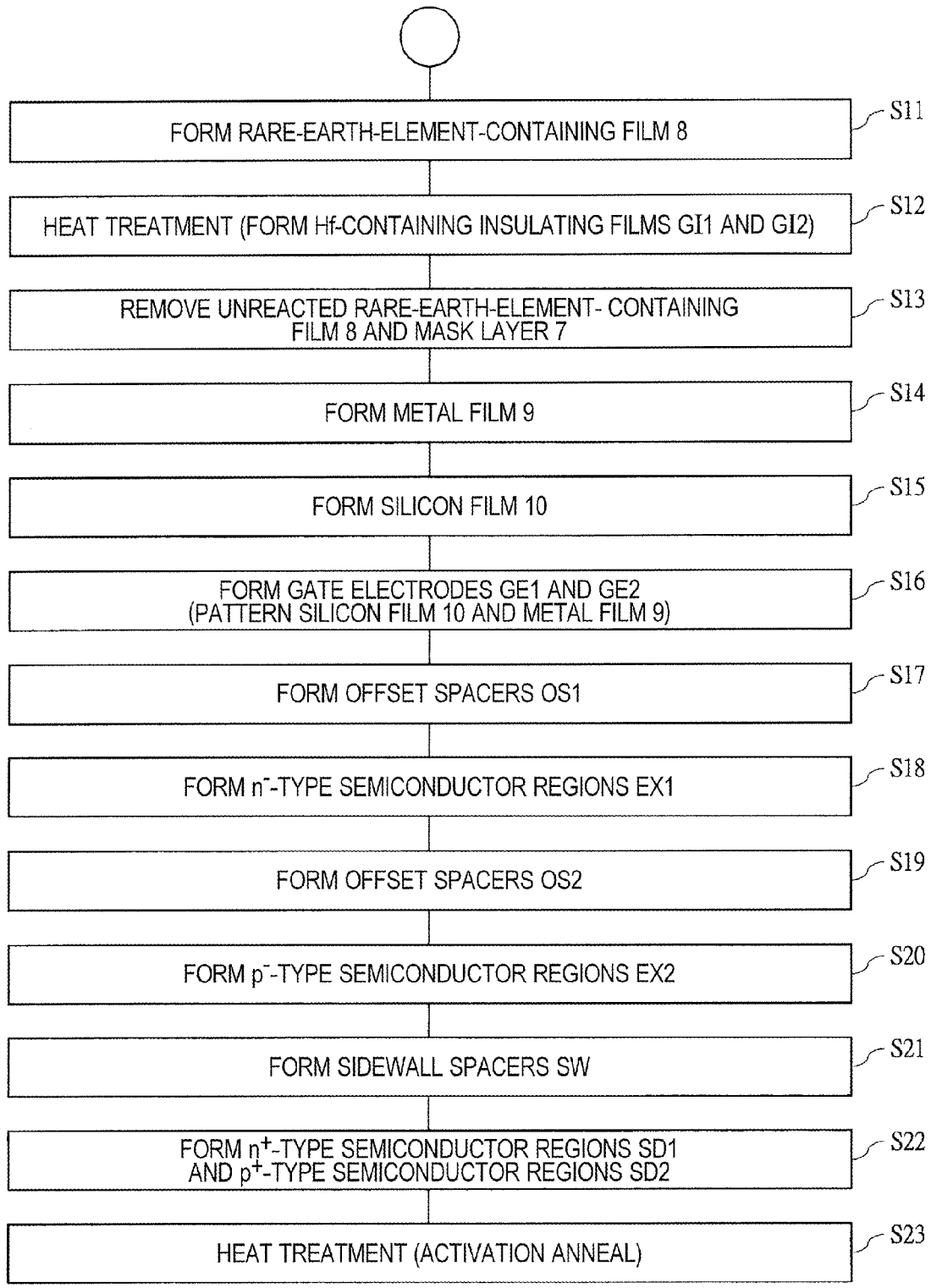
FIG. 3 is a manufacturing process flow chart showing some of the manufacturing steps of the semiconductor device as the embodiment of the present invention.

FIGS. 2 and 3 are manufacturing process flow charts each showing some of the manufacturing step of the semiconductor device of the present embodiment, which is a semiconductor device having a CMISFET. FIGS. 4 to 22 are main-portion cross-sectional views of the semiconductor device of the present embodiment, which is the semiconductor device having the CMISFET, during the manufacturing steps thereof.

Figure 4:
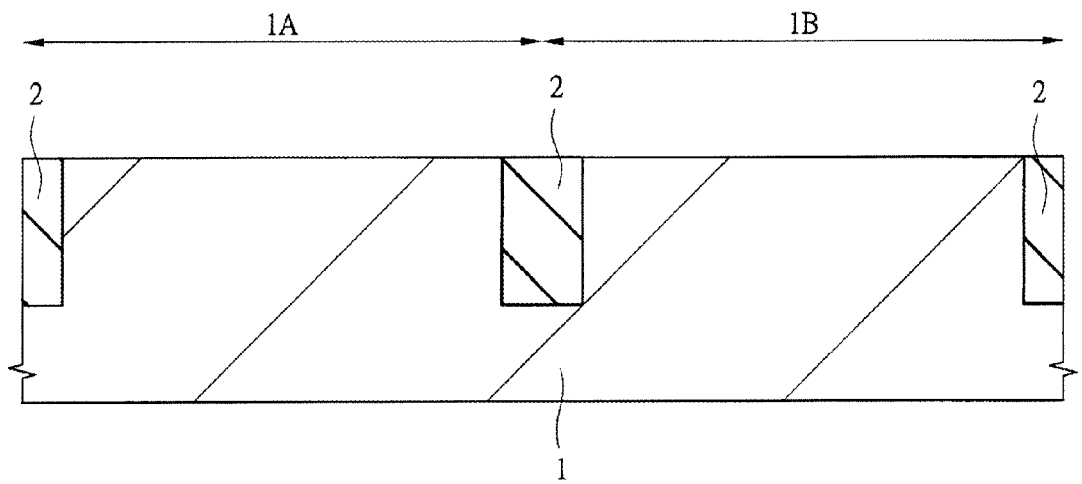
FIG. 4 is a main-portion cross-sectional view of the semiconductor device as the embodiment of the present invention during the manufacturing steps thereof.

First, as shown in FIG. 4, the semiconductor substrate (semiconductor wafer) 1 made of p-type single-crystal silicon having a specific resistance of, e.g., about 1 to 10 Ωcm is prepared (made ready) (Step S1 in FIG. 2). Then, the isolation region 2 is formed in the main surface of the semiconductor substrate 1 (Step S2 in FIG. 2). The isolation region 2 is made of an insulator such as a silicon oxide and formed by, e.g., a STI (Shallow Trench isolation) method. For example, an isolation trench (trench for isolation) is formed in the semiconductor substrate 1, and then an insulating film (preferably a silicon oxide film) is embedded in the isolation trench to form the isolation region 2 made of the insulating film (preferably a silicon oxide film) embedded in the isolation trench. By the isolation region 2, the n-channel MISFET formation region 1A as the region (active region) where the n-channel MISFET Qn is to be formed and the p-channel MISFET formation region 1B as the region (active region) where the p-channel MISFET Qp is to be formed are defined.

Figure 5:
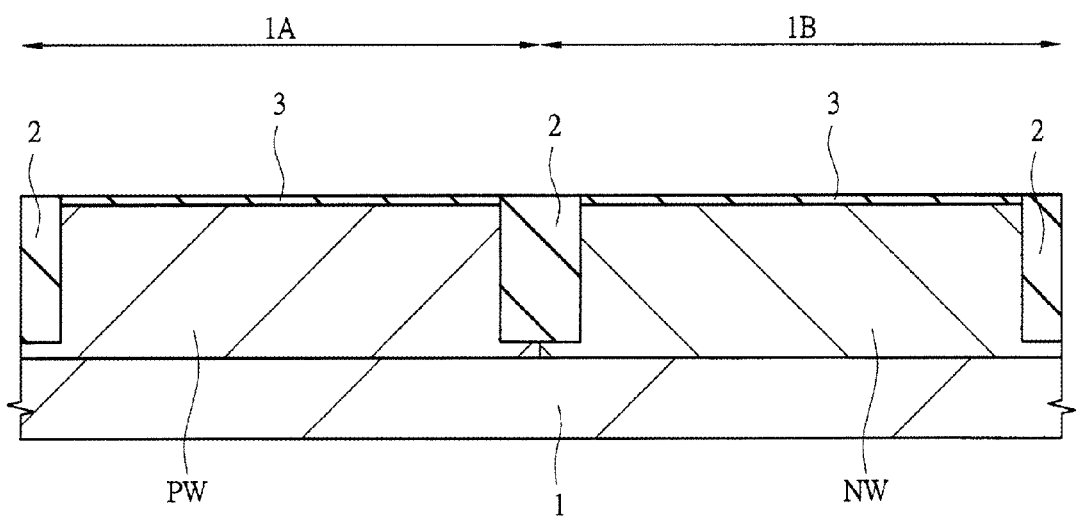
FIG. 5 is a main-portion cross-sectional view of the semiconductor device during the manufacturing steps thereof, which is subsequent to FIG. 4.

Next, as shown in FIG. 5, in the n-channel MISFET formation region 1A, the p-type well (p-type semiconductor region) PW is formed to a predetermined depth from the main surface of the semiconductor substrate 1 and, in the p-channel MISFET formation region 1B, the n-type well (n-type semiconductor region) NW is formed to a predetermined depth from the main surface of the semiconductor substrate 1 (Step S3 in FIG. 2). The p-type well PW can be formed using a photoresist film (not shown) covering the p-channel MISFET formation region 1B as an ion implantation inhibiting mask by ion implantation of a p-type impurity such as, e.g., boron (B) into the semiconductor substrate 1 in the n-channel MISFET formation region 1A or the like. The n-type well NW can be formed using another photoresist film (not shown) covering the n-channel MISFET formation region 1A as an ion implantation inhibiting mask by ion implantation of an n-type impurity such as, e.g., phosphorus (P) into the semiconductor substrate 1 in the p-channel MISFET formation region 1B or the like. Either of the p-type well PW and the n-type well NW may be formed first. After or before the formation of the p-type well PW and the n-type well NW, ion implantation for adjusting the thresholds of MISFETs formed later (so-called channel dope ion implantation) may also be performed as necessary into the upper layer portion of the semiconductor substrate 1.

Next, by wet etching or the like using, e.g., an aqueous hydrofluoric acid (HF) solution, a natural oxide film over the surface of the semiconductor substrate 1 is removed to clean (wash) the surface of the semiconductor substrate 1. As a result, the surface (silicon surface) of the semiconductor substrate 1 (each of the p-type well PW and the n-type well NW) is exposed.

Next, over the surface (i.e., the surface of each of the p-type well PW and the n-type well NW) of the semiconductor substrate 1, the interfacial layer (insulating layer or insulating film) 3 made of a silicon oxide film or a silicon oxynitride film is formed as the insulating film (Step S4 in FIG. 2).

The film thickness of the interfacial layer 3 is small and can be controlled to be preferably 0.5 to 2 nm, e.g., about 1 nm. In Step S4, the interfacial layer 3 can be formed using, e.g., a thermal oxidation method or the like. In the case where the interfacial layer 3 is formed of a silicon oxynitride film, it can be formed by, e.g., a high-temperature shore-time oxidation method using $N_2O$, $O_2$, and $H_2$, a method of forming a silicon oxide film and then performing nitridation treatment (plasma nitridation) thereon in a plasma, or the like.

By forming the interfacial layer 3 in Step S4 and subsequently forming a Hf-based insulating film (corresponding to each of the Hf-containing insulating films GI1 and GI2) over the interfacial layer 3, a dense and compact oxide film (natural oxide film) having a smaller number of defects such as trap levels is formed to allow improvements in driving ability and reliability.

Figure 6:
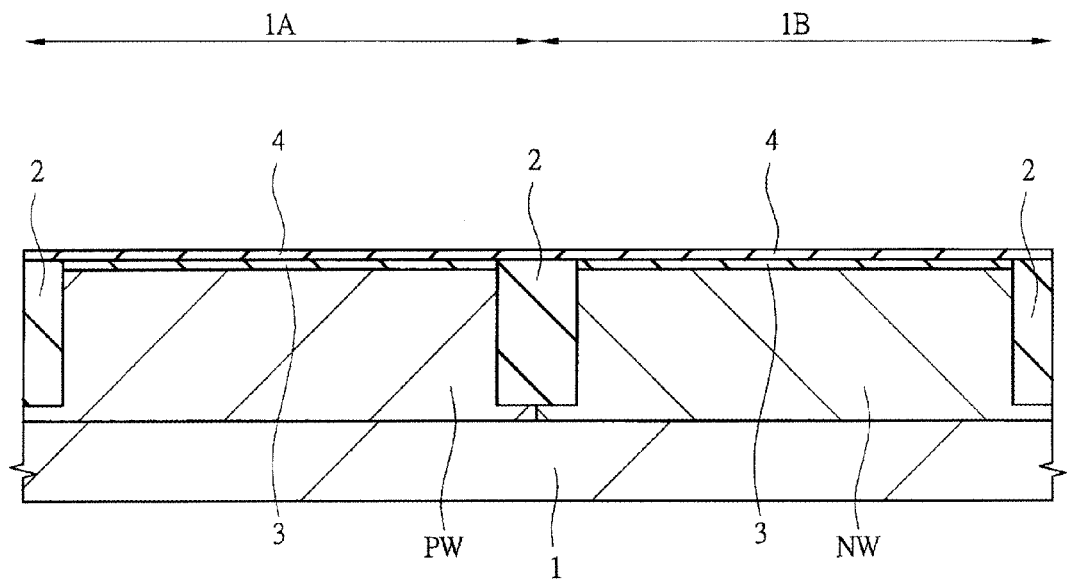
FIG. 6 is a main-portion cross-sectional view of the semiconductor device during the manufacturing steps thereof, which is subsequent to FIG. 5.
Figure 7:
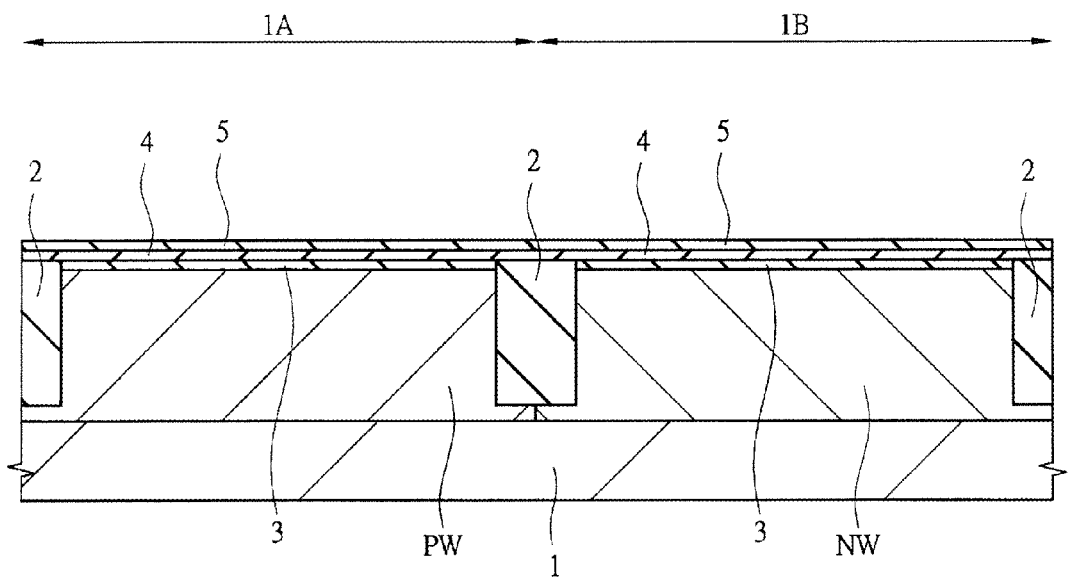
FIG. 7 is a main-portion cross-sectional view of the semiconductor device during the manufacturing steps thereof, which is subsequent to FIG. 6.

Next, as shown in FIG. 6, over the main surface of the semiconductor substrate 1, i.e., over the interfacial layer 3, a HfO (hafnium oxide) film 4 which is a hafnium oxide film is formed (Step S5 of FIG. 2). The HfO film 4 and a HfSiO film described later are films (insulating films) for forming high-dielectric-constant gate insulating films (Hf-based gate insulating films).

The HfO film is an insulating material film comprised of hafnium (Hf) and oxygen (O) (i.e., a hafnium oxide film). Even when the notation of the HfO film is used, the atomic ratio between Hf and O in the HfO film is not limited to 1:1. A representative of the HfO film is a $HfO_2$ (hafnium dioxide) film.

The HfO film 4 can be formed using, e.g., an ALD (Atomic Layer Deposition) method or a CVD (Chemical Vapor Deposition) method. In Step S5, the HfO film 4 is formed over the entire main surface of the semiconductor substrate 1. Accordingly, the HfO film 4 is formed in each of the n-channel MISFET formation region 1A and the p-channel MISFET formation region LB. Preferably, the thickness of the HfO film 4 can be controlled to be about 0.6 to 0.85 nm.

After the HfO film 4 is formed in Step S5 described above, as shown in FIG. 7, over the main surface of the semiconductor substrate 1, i.e., over the HfO film 4, a HfSiO film 5 which is a hafnium silicate film is formed (Step S6 in FIG. 2).

The HfSiO film is an insulating material film comprised of hafnium (Hf), silicon (Si) and oxygen (O) (i.e., the hafnium silicate film). Even when the notation of the HfSiO film is used, the atomic ratio between Hf, Si, and O is not limited to 1:1:1.

The HfSiO film 5 can be formed using, e.g., an ALD method or a CVD method. In Step S6, the HfSiO film 5 is formed over the entire main surface of the semiconductor substrate 1. Accordingly, the HfSiO film 5 is formed over the HfO film 4 in each of the n-channel MISFET formation region 1A and the p-channel MISFET formation region 1B. The thickness of the HfSiO film can be controlled to be preferably about 0.2 to 0.55 nm.

At the stage at which the HfSiO film 5 is formed in Step S6, in the n-channel MISFET formation region 1A, the state is achieved in which the interfacial layer 3, the HfO film 4, and the HfSiO film 5 are successively stacked in ascending order over the semiconductor substrate 1 (p-type well PW). On the other hand, in the p-channel MISFET formation region 1B, the state is achieved in which the interfacial layer 3, the HfO film 4, and the HfSiO film 5 are successively stacked in ascending order over the semiconductor substrate 1 (n-type well NW).

After the HfO film 4 is formed in Step S5 described above and the HFSiO film 5 is formed in Step S6 described above, the HfSiO film 5 and the HfO film 4 are subjected to nitridation treatment (Step S7 in FIG. 2). For the nitridation treatment in Step S7, plasma nitridation (plasma nitridation treatment) is preferably used.

Figure 8:
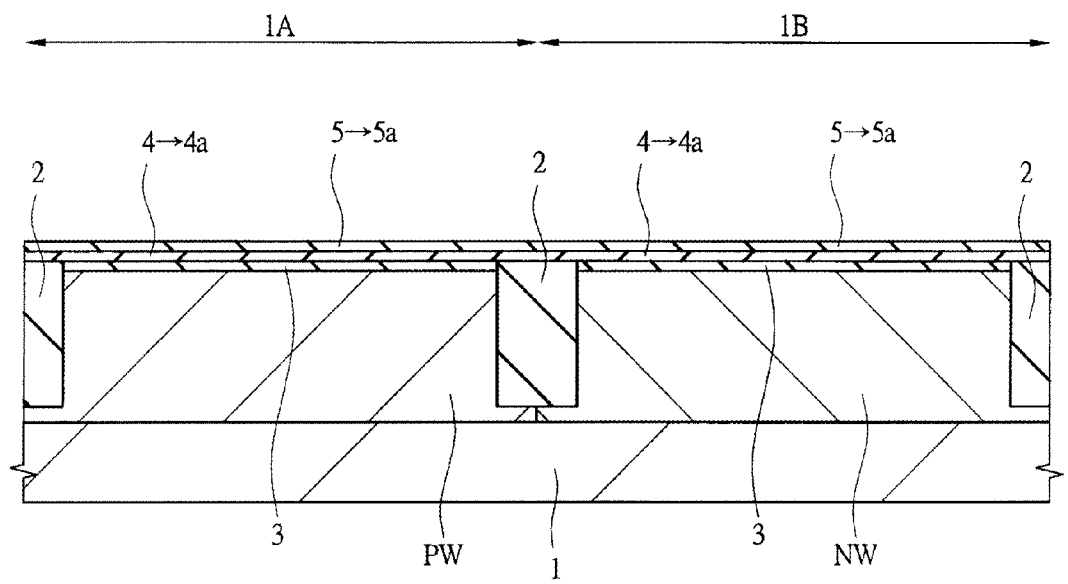
FIG. 8 is a main-portion cross-sectional view of the semiconductor device during the manufacturing steps thereof, which is subsequent to FIG. 7.
Figure 9:
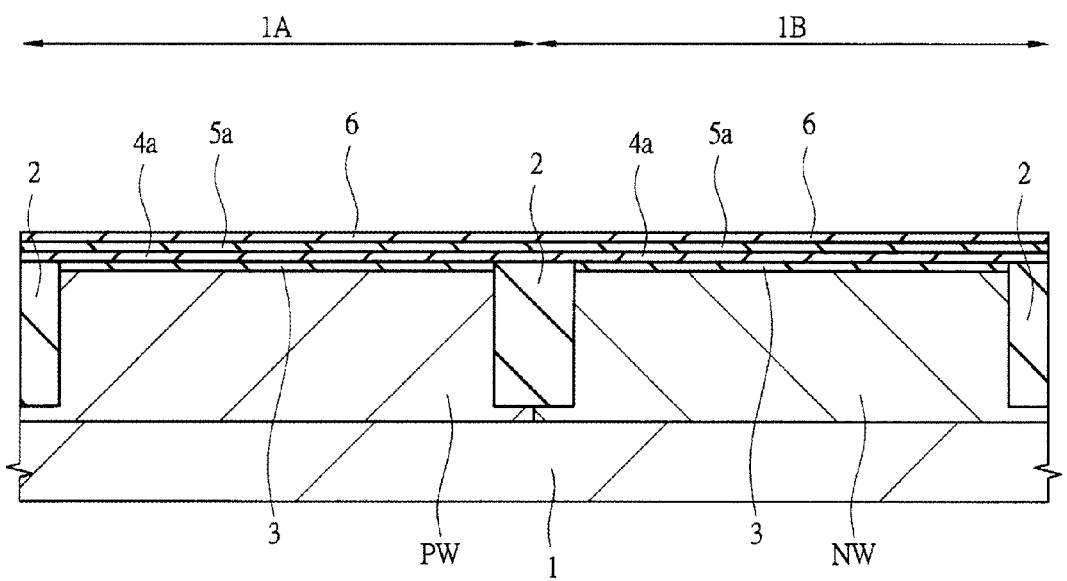
FIG. 9 is a main-portion cross-sectional view of the semiconductor device during the manufacturing steps thereof, which is subsequent to FIG. 8.

By nitriding the HfO film 4 and the HfSiO film 5 in Step S7, as shown in FIG. 8, the HfO film 4 is nitrided to form a HfON film 4a and the HfSiO film 5 is nitrided to form a HfSiON film 5a. That is, a laminate film including the HfO film 4 and the HfSiO film 5 stacked thereover which are formed in Steps S5 and S6 are changed to a laminate film including the HfON film 4a and the HfSiON film 5a stacked thereover by the nitridation treatment in Step S7.

The HfON film (hafnium oxynitride film) is an insulating material film comprised of hafnium (Hf), oxygen (O), and nitrogen (N). The HfSiON film (hafnium silicon oxynitride film) is an insulating material film comprised of hafnium (Hf), silicon (Si), oxygen (O), and nitrogen (N). Even when the notation of the HfON film is used, the atomic ratio between Hf, O, and N in the HfON film is not limited to 1:1:1. Also, even when the notation of the HfSiON film is used, the atomic ratio between Hf, Si, O, and N in the HfSiON film is not limited to 1:1:1:1.

After the nitridation treatment in Step S7 described above, as shown in FIG. 9, over the main surface of the semiconductor substrate 1, i.e., over the HfSiON film 5a, an Al-containing film (Al-containing film) 6 is formed (Step S8 in FIG. 2). The Al-containing film 6 is formed mainly to achieve a reduction in the threshold of the p-channel MISFET.

The Al-containing film 5 is a material film containing Al (aluminum), and contains Al (aluminum) as a main component. As the Al-containing film 6, an aluminum oxide film (AlO film represented by an $Al_2O_3$ film) is most preferred, but besides, an aluminum film (Al film or single-element film of Al) or the like can also be used. The Al-containing film 6 can be formed by a PVD (Physical Vapor Deposition) method, an ALD method, or the like. In Step S8, the Al-containing film 6 is formed over the entire main surface of the semiconductor substrate 1. Accordingly, the Al-containing film 6 is formed over the HfSiON film 5a in each of the n-channel MISFET formation region 1A and the p-channel MISFET formation region 1B. The thickness of the Al-containing film 6 can be controlled to be preferably about 0.5 to 1.0 nm.

Figure 10:
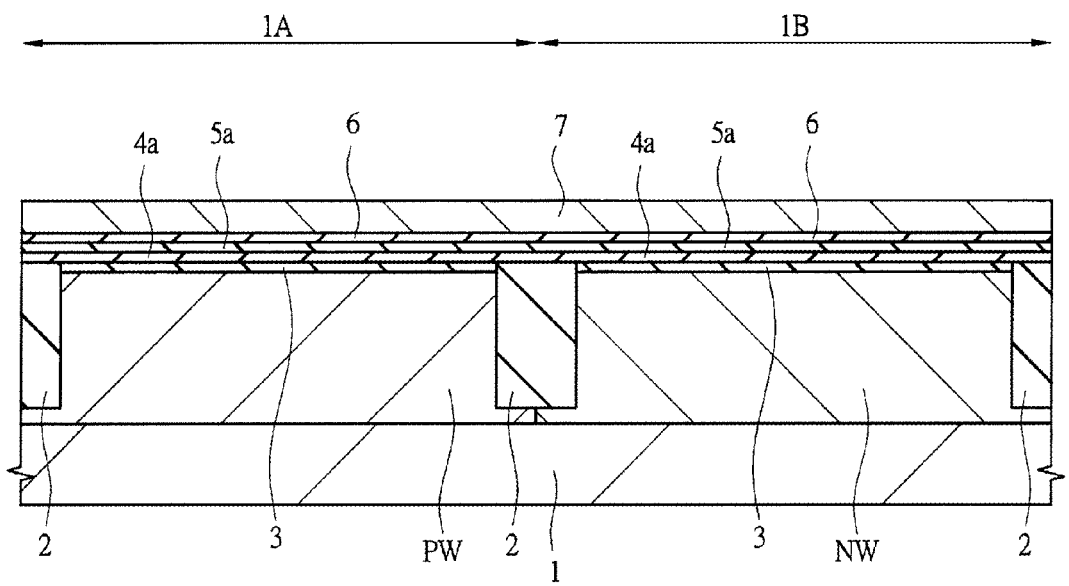
FIG. 10 is a main-portion cross-sectional view of the semiconductor device during the manufacturing steps thereof, which is subsequent to FIG. 9.

Next, as shown in FIG. 10, over the main surface of the semiconductor substrate 1, i.e., over the Al-containing film 6, a mask layer 7 is formed (Step S9 of FIG. 2).

In Step S9, the mask layer 7 is formed over the entire main surface of the semiconductor substrate 1. Accordingly, the mask layer 7 is formed over the Al-containing film 6 in each of the n-channel MISFET formation region 1A and the p-channel MISFET formation region 1B. The mask layer 7 can be formed using, e.g., a PVD method such as a sputtering method, an ALD method, or the like. The film thickness of the mask layer 7 can be controlled to be preferably 5 to 20 nm, e.g., about 10 nm.

Preferably, the mask layer 7 is comprised of a metal nitride film. More preferably, the mask layer 7 is comprised of a titanium nitride (TiN) film or a tantalum nitride (TaN) film. Of the titanium nitride (TiN) film and the tantalum nitride (TaN) film, the titanium nitride (TiN) film is particularly preferred. The mask layer 7 is formed so as to inhibit or prevent a rare-earth-element-containing film 8 formed later from reacting with the Al-containing film 6, the HfSiON film 5a, and the HfON film 4a in the p-channel MISFET formation region 1B. If consideration is given to the reaction preventing function, easiness of processing, and easiness of removal each desired for the mask layer 7, the foregoing materials are appropriate for the mask layer 7.

At the stage at which the mask layer 7 is formed in Step S9, in each of the n-channel MISFET formation region 1A and the p-type MISFET formation region 1B, the state is achieved in which the interfacial layer 3, the HfON film 4a, the HfSiON film 5a, the Al-containing film 6, and the mask layer 7 are successively stacked in ascending order over the semiconductor substrate 1 (well region).

Figure 11:
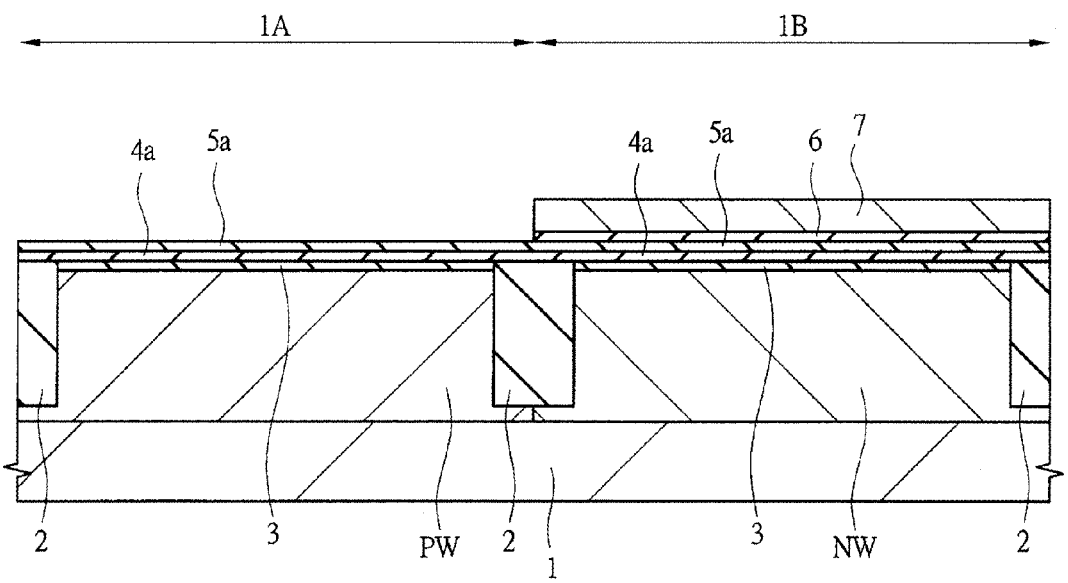
FIG. 11 is a main-portion cross-sectional view of the semiconductor device during the manufacturing steps thereof, which is subsequent to FIG. 10.

Next, as shown in FIG. 11, the mask layer 7 and the Al-containing film 6 in the n-channel MISFET formation region 1A are selectively removed by etching (preferably using wet etching or a combination of dry etching and wet etching), while the mask layer 7 and the Al-containing film 6 in the p-channel MISFET formation region 1B are left (Step S10 in FIG. 2). As a result, in the n-channel MISFET formation region 1A, the HfSiON film 5a is exposed while, in the p-channel MISFET formation region 1B, the state is maintained in which the Al-containing film 6 and the mask layer 7 stacked thereover are formed over the HfSiON film 5a.

Specifically, in Step S10, a photoresist pattern (not shown) covering the p-channel MISFET formation region 1B and exposing the n-channel MISFET formation region 1A is formed first over the mask layer 7. Then, using the photoresist pattern as an etching mask, the mask layer 7 in the n-channel MISFET formation region 1A is removed by etching (preferably by wet etching). Subsequently, the Al-containing film 6 in the n-channel MISFET formation region 1A is removed by etching (preferably by wet etching). Thereafter, the photoresist pattern is removed.

In the case where the titanium nitride film is used as the mask layer 7, as an etchant for removing the mask layer 7 in the n-channel MISFET formation region 1A in Step S10, e.g., aqueous hydrogen peroxide or the like can be used. It is also possible that, after the mask layer 7 in the n-channel MISFET formation region LA is removed by etching (preferably by wet etching) using the photoresist pattern (not shown) as an etching mask, the photoresist pattern is removed, and then the Al-containing film 6 in the n-channel MISFET formation region 1A is removed by etching (preferably by wet etching) using the remaining mask layer 7 as an etching mask. It is also possible that, when the mask layer 7 in the n-channel MISFET formation region 1A is subjected to wet etching using the photoresist pattern (not shown) as an etching mask, by adjusting the etchant, the Al-containing film 6 in the n-channel MISFET formation region 1A is also simultaneously subjected to wet etching.

Figure 12:
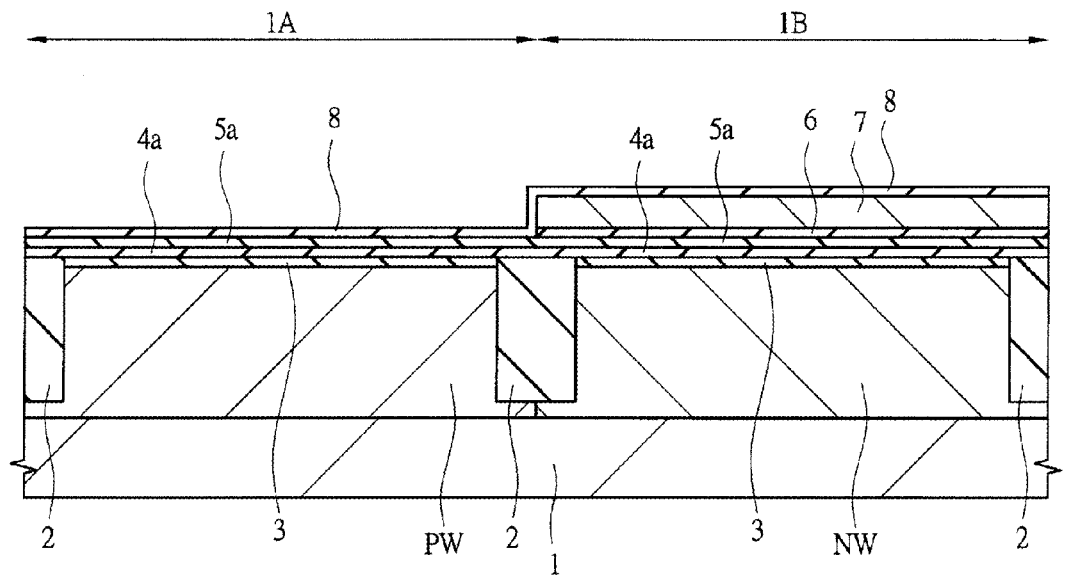
FIG. 12 is a main-portion cross-sectional view of the semiconductor device during the manufacturing steps thereof, which is subsequent to FIG. 11.

Next, as shown in FIG. 12, over the main surface of the semiconductor substrate 1, the rare-earth-element-containing film (rare-earth-element-containing layer) 8 is formed (Step S11 in FIG. 3). In Step S11, the rare-earth-element-containing film 8 is formed over the entire main surface of the semiconductor substrate 1. Accordingly, the rare-earth-element-containing film 8 is formed in each of the n-channel MISFET formation region 1A and the p-channel MISFET formation region 1B. The rare-earth-element-containing film 8 is formed mainly to achieve a reduction in the threshold of the n-channel MISFET.

In the etching step in Step S10 described above, the mask layer 7 and the Al-containing film 6 in the n-channel MISFET formation region 1A are removed and the mask layer 7 and the Al-containing film 6 in the p-channel MISFET formation region 1B are left. Therefore, in Step S11, the rare-earth-element-containing film 8 is formed over the HfSiON film 5a in the n-channel MISFET formation region 1A and formed over the mask layer 7 in the p-channel MISFET formation region 1B. As a result, the state is achieved in which, in the n-channel MISFET formation region 1A, the rare-earth-element-containing film 8 is in contact with the HfSiON film 5a and, in the p-channel MISFET formation region 1B, the rare-earth-element-containing film 8 is not in contact with the Al-containing film 6 (and with the HfSiON film 5a) due to the mask layer 7 interposed therebetween.

The rare-earth-element-containing film 8 is a material film containing a rare earth element and contains a rare earth element as a main component. Particularly preferably, the rare-earth-element-containing film 8 contains La (lanthanum). In terms of stability, the rare-earth-element-containing film 8 is preferably a rare earth element oxide film, and particularly preferably a lanthanum oxide film (a representative of the lanthanum oxide is $La_2O_3$). The thickness of the rare-earth-element-containing film 8 can be controlled to be preferably about 0.3 to 1.0 nm.

At the stage at which the rare-earth-element-containing film 8 is formed in Step S11, in the n-channel MISFET formation region 1A, the state is achieved in which the interfacial layer 3, the HfON film 4a, the HfSiON film 5a, and the rare-earth-element-containing film 8 are successively stacked in ascending order over the semiconductor substrate (p-type well PW). On the other hand, in the p-channel MISFET formation region 1B, the state is achieved in which the interfacial layer 3, the HfON film 4a, the HfSiON film 5a, the Al-containing film 6, the mask layer 7, and the rare-earth-element-containing film 8 are successively stacked in ascending order over the semiconductor substrate (n-type well NW).

Next, the semiconductor substrate 1 is subjected to heat treatment (Step S12 in FIG. 3). Preferably, the heat treatment step in Step S12 is performed at a heat treatment temperature within the range of 650 to 850° C., e.g., about 750° C. and in an inert gas atmosphere (which may also be a nitrogen gas atmosphere).

By the heat treatment in Step S12, in the n-channel MISFET formation region 1A, a reaction is caused between each of the HfON film 4a and the HfSiON film 5a and the rare-earth-element-containing film 8 and, in the p-channel MISFET formation region 1B, a reaction is caused between each of the HfON film 4a and the HfSiON film 5a and the Al-containing film 6.

Figure 13:
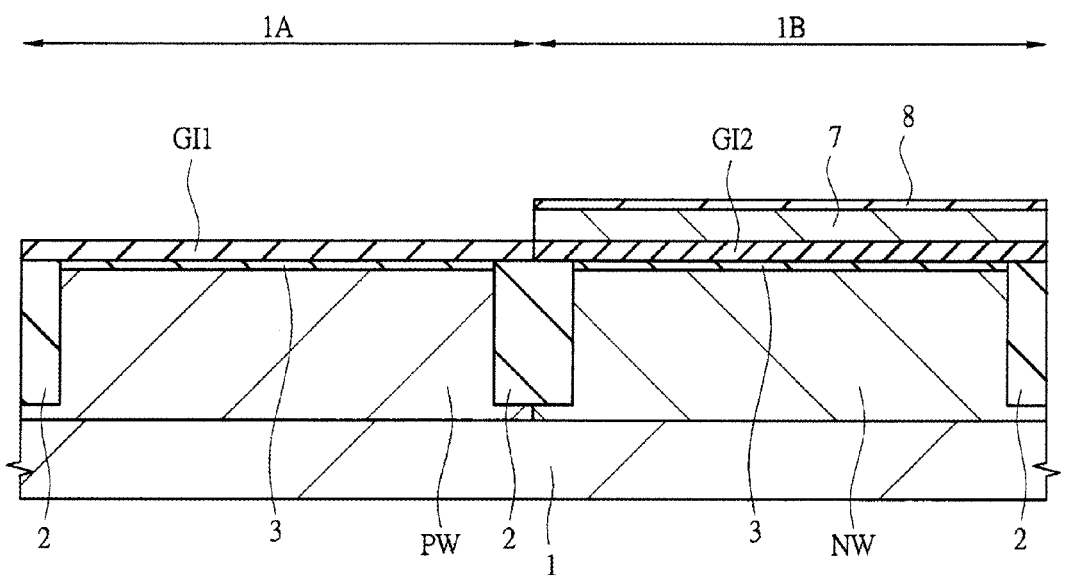
FIG. 13 is a main-portion cross-sectional view of the semiconductor device during the manufacturing steps thereof, which is subsequent to FIG. 12.

By the heat treatment in Step S12, in the n-channel MISFET formation region 1A, the reaction (mixture, mixing, or interdiffusion) is caused between each of the HfON film 4a and the HfSiON film 5a and the rare-earth-element-containing film 8 to form the Hf-containing insulating film GI1 which is a reaction layer (mixture layer or mixing layer) between each of the HfON film 4a and the HfSiON film 5a and the rare-earth-element-containing film 8, as shown in FIG. 13. Also by the heat treatment in Step S12, in the p-channel MISFET formation region 1B, the reaction (mixture, mixing, or interdiffusion) is caused between each of the HfON film 4a and the HfSiON film 5a and the Al-containing film 6 to form the Hf-containing insulating film GI2 which is a reaction layer (mixture layer or mixing layer) between each of the HfON film 4a and the HfSiON film 5a and the Al-containing film 6, as shown in FIG. 13.

In the p-channel MISFET formation region 1B, the rare-earth-element-containing film 8 is formed over the mask layer 7. Accordingly, the rare-earth-element-containing film 8 in the p-channel MISFET formation region 1B is less likely to react with the mask layer 7 and therefore remains over the mask layer 7 after the heat treatment in Step S12. Even when the rare-earth-element-containing film 8 in the p-channel MISFET formation region 1B has reacted with the mask layer 7 in the heat treatment in Step S12, the reacted portion thereof is removed by an etching step in Step S13 described later.

During the heat treatment in Step S12, it is preferable to inhibit the reaction between each of the HfON film 4a and the HfSiON film 5a and the interfacial layer 3 located thereunder and leave the silicon oxide film or silicon oxynitride film as the interfacial layer 3. That is, in the n-channel MISFET formation region 1A, the silicon oxide film or silicon oxynitride film as the interfacial layer 3 is preferably left between the Hf-containing insulating film GI1 and the semiconductor substrate 1 (p-type well PW) and, in the p-channel MISFET formation region 1B, the silicon oxide film or silicon oxynitride film as the interfacial layer 3 is preferably left between the Hf-containing insulating film GI2 and the semiconductor substrate 1 (n-type well NW). This allows production of an excellent device in which the degradation of a driving force or reliability is inhibited.

In the case where the Al-containing film 6 is an aluminum oxide film or an aluminum film, the Hf-containing insulating film GI2 formed through the reaction between each of the HfON film 4a and the HfSiON film 5a and the Al-containing film 6 is a HfAlSiON film. Here, the HfAlSiON film (hafnium aluminum silicon oxynitride film) is an insulating material film comprised of hafnium (Hf), aluminum (Al), silicon (Si), oxygen (O), and nitrogen (N). Even when the notation of the HfAlSiON film is used, the atomic ratio between Hf, Al, Si, O, and N in the HfAlSiON film is not limited to 1:1:1:1:1.

In the case where the rare-earth-element-containing film 8 is a rare earth element oxide film or a rare earth element film, if the rare earth element contained in the rare-earth-element-containing film 8 is represented by Ln, the Hf-containing insulating film GI1 formed through the reaction between each of the HfON film 4a and the HfSiON film 5a and the rare-earth-element-containing film 8 is a HLnSiON film. In the case where the rare-earth-element-containing film 8 is a lanthanum oxide film or a lanthanum film, the Hf-containing insulating film GI1 formed through the reaction between each of the HfON film 4a and the HfSiON film 5a and the rare-earth-element-containing film 8 is a HfLaSiON film. Here, the HfLnSiON film (hafnium rare earth element silicon oxynitride film) is an insulating material film comprised of hafnium (Ha), a rare earth element (Ln), silicon (Si), oxygen (O), and nitrogen (N), and the HfLaSiON film (hafnium lanthanum silicon oxynitride film) is an insulating material film comprised of hafnium (Ha), lanthanum (La), silicon (Si), oxygen (O), and nitrogen (N). Even when the notation of the HfLnSiON film is used, the atomic ratio between Hf, Ln, Si, N, and O in the HfLnSiON film is not limited to 1:1:1:1:1. Also, even when the notation of the HfLaSiON film is used, the atomic ratio between Hf, La, Si, O, and N in the HfLaSiON film is not limited to 1:1:1:1:1.

Figure 14:
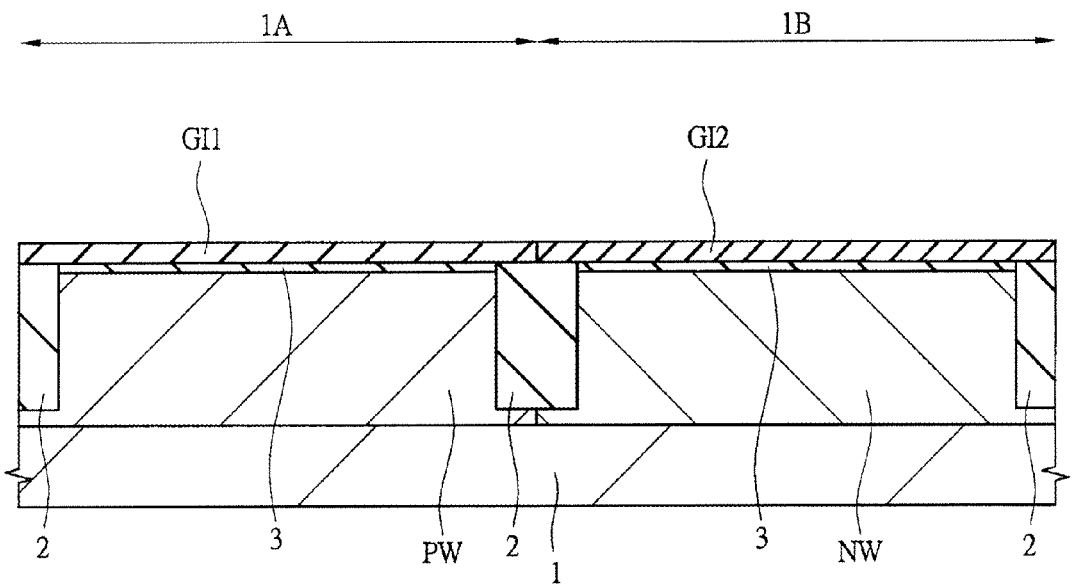
FIG. 14 is a main-portion cross-sectional view of the semiconductor device during the manufacturing steps thereof, which is subsequent to FIG. 13.

After the heat treatment step in Step S12 is performed, as shown in FIG. 14, the rare-earth-element-containing film 8 which has not reacted in the heat treatment step in Step S12 (unreacted rare-earth-element-containing film 8, particularly the rare-earth-element-containing film 8 remaining over the mask layer 7) is removed by etching (preferably by wet etching), and then the mask layer 7 is removed by etching (preferably by wet etching) (Step S13 in FIG. 3). In another embodiment, in Step S13, the rare-earth-element-containing film 8 which has not reacted in the heat treatment step in Step S12 (unreacted rare-earth-element-containing film 8, particularly the rare-earth-element-containing film 8 remaining over the mask layer 7) and the mask layer 7 can also be simultaneously removed (preferably removed by wet etching). In the case where the rare-earth-element-containing film 8 in the p-channel MISFET formation region 1B has reacted with the mask layer 7 in the heat treatment in Step S12, the reacted portion thereof is removed in the etching step in Step S13.

By the etching step of S13, the state is achieved in which the Hf-containing insulating film GI1 is exposed in the n-channel MISFET formation region 1A and the Hf-containing insulating film GI2 is exposed in the p-channel MISFET formation region 1B. For the etching (wet etching) in Step S13, a mixed solution of e.g., a sulfuric acid and hydrogen peroxide or the like can be used appropriately.

Figure 15:
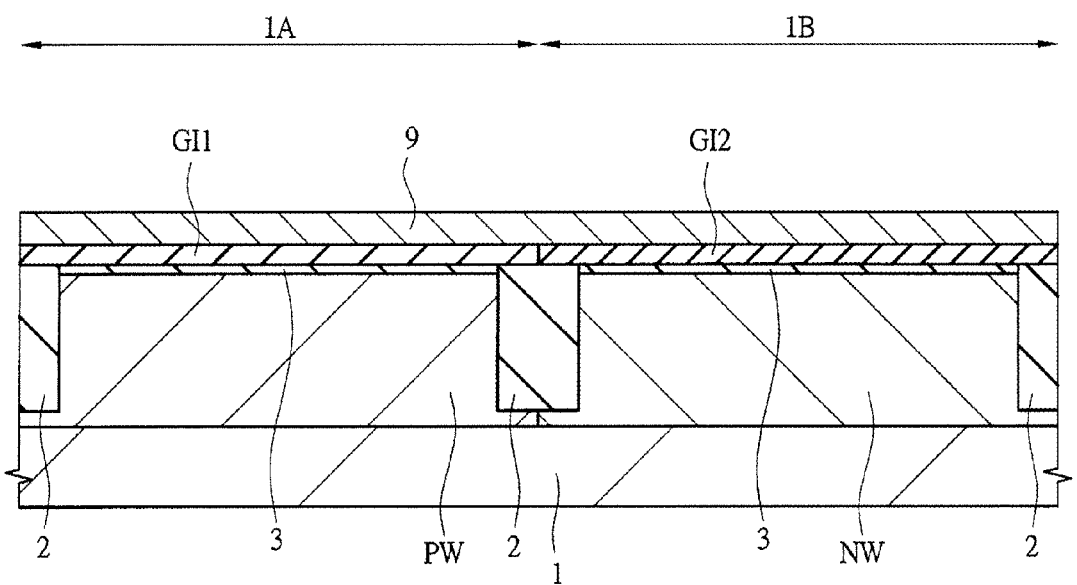
FIG. 15 is a main-portion cross-sectional view of the semiconductor device during the manufacturing steps thereof, which is subsequent to FIG. 14.

Next, as shown in FIG. 15, over the main surface of the semiconductor substrate 1 including the n-channel MISFET formation region 1A and the p-channel MISFET formation region 1B, i.e., over the Hf-containing insulating film GI1 in the n-channel MISFET formation region 1A and the Hf-containing insulating film GI2 in the p-channel MISFET formation region 1B, a metal film (metal layer or metal gate film) 9 for metal gates (metal gate electrodes) is formed (Step S14 in FIG. 3).

The metal film 9 is preferably comprised of a metal nitride (i.e., a metal nitride film), and a titanium nitride (TiN) film, a tantalum nitride (TaN) film, or a tungsten nitride (WN) film is preferred. As the metal film 9, the titanium nitride film (TiN) film is particularly preferred. The metal film 9 can be formed by, e.g., a sputtering method or the like. The thickness of the metal film 9 (thickness of the formed film) can be controlled to be, e.g., about 5 to 20 nm.

Figure 16:
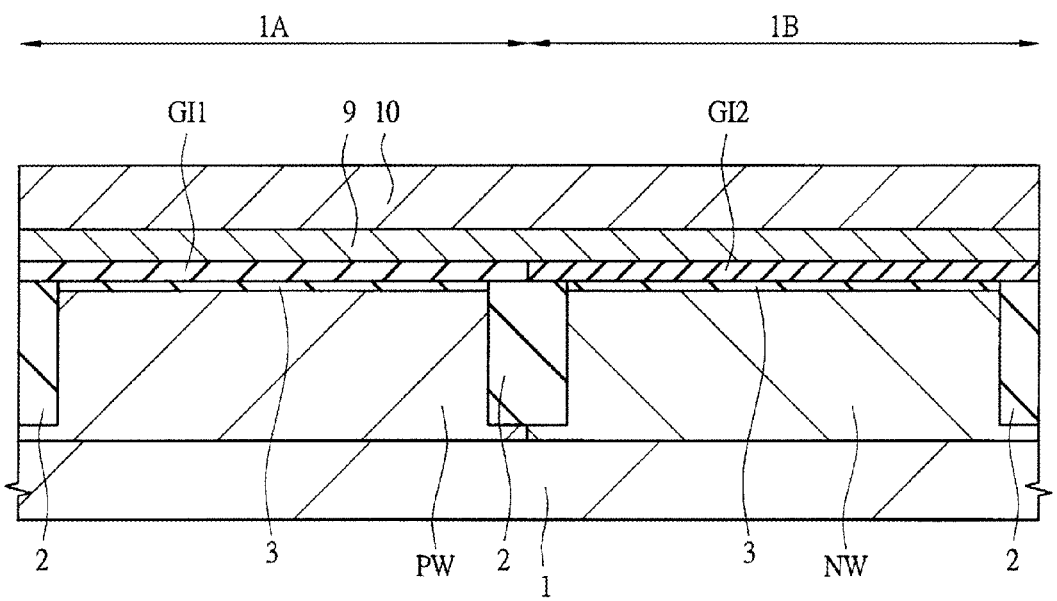
FIG. 16 is a main-portion cross-sectional view of the semiconductor device during the manufacturing steps thereof, which is subsequent to FIG. 15.

Next, as shown in FIG. 16, over the main surface of the semiconductor substrate 1, i.e., over the metal film 9, a silicon film 10 is formed (Step S15 in FIG. 3). The silicon film 10 can be formed of a polysilicon film or an amorphous silicon film. Even when the silicon film 10 is an amorphous silicon film during the deposition thereof, the amorphous silicon film is changed to a polysilicon film by heat treatment (e.g., heat treatment for activation anneal in Step S23 described later) after the deposition. The thickness of the silicon film 10 can be controlled to be, e.g., about 40 to 60 nm.

By increasing the thickness of the metal film 9 formed in Step S14, the step of forming the silicon film 10 in Step S15 can also be omitted (i.e., the gate electrodes can also be formed of the metal film 9 without the silicon film 10). However, it is more preferable to form the silicon film 10 over the metal film 9 in Step S15 (i.e., form each of the gate electrodes of a laminate film including the metal film 9 and the silicon film 10 stacked thereover). The reason for this is that, if the thickness of the metal film 9 is excessively large, the problem of the easy-to-peel metal film 9 or the problem of damage given to the substrate by over-etching when the metal film 9 is patterned may occur. However, by forming each of the gate electrodes of the laminate film including the metal film 9 and the silicon film 10, the thickness of the metal film 9 can be reduced to be smaller than in the case where each of the gate electrodes is formed only of the metal film 9, which lessens the foregoing problem. When the silicon film 10 is formed over the metal film 9, a related-art processing method for polysilicon gate electrodes (gate electrodes made of polysilicon) and the process thereof can be succeeded. This also offers advantages in terms of microfabricability, manufacturing cost, and production yield.

Figure 17:
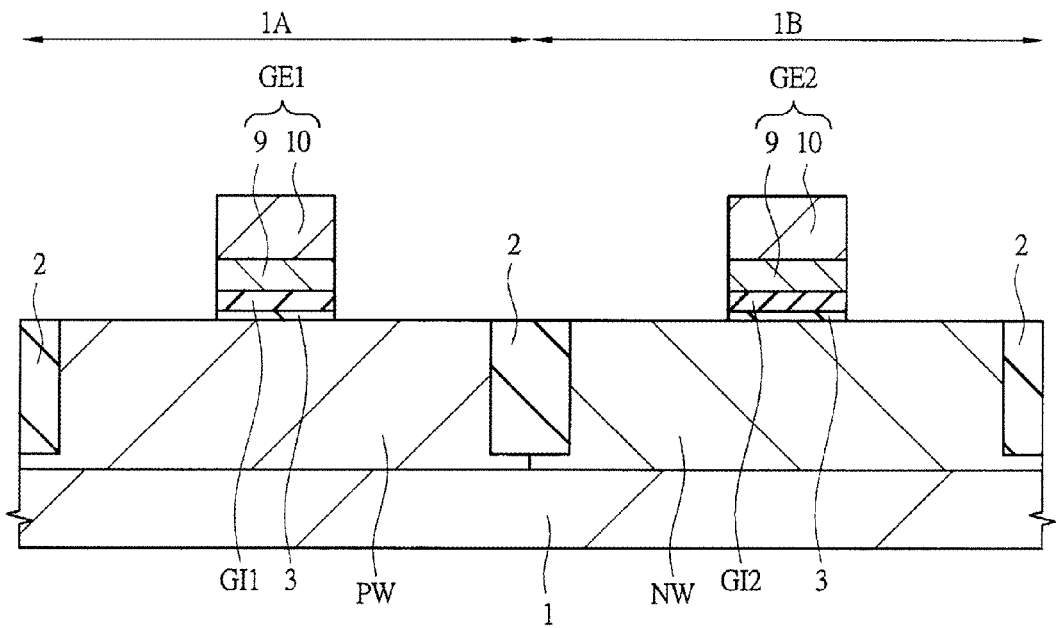
FIG. 17 is a main-portion cross-sectional view of the semiconductor device during the manufacturing steps thereof, which is subsequent to FIG. 16.

Next, by patterning the laminate film including the silicon film 10 and the metal film 9, as shown in FIG. 17, the gate electrodes GE1 and GE2 each including the metal film 9 and the silicon film 10 stacked thereover are formed (Step S16 in FIG. 3). The patterning step (step of forming the gate electrodes GE1 and GE2) in Step S16 can be performed by, e.g., forming a photoresist pattern (not shown) over the silicon film 10 using a photolithographic method and then patterning the laminate film including the silicon film 10 and the metal film 9 by etching (preferably by dry etching) using the photoresist pattern as an etching mask. Thereafter, the photoresist pattern is removed.

The gate electrode GE1 is formed over the Hf-containing insulating film GI1 in the n-channel MISFET formation region 1A, and the gate electrode GE2 is formed over the Hf-containing insulating film GI2 in the p-channel MISFET formation region 1B. That is, the gate electrode GE1 including the metal film 9 and the silicon film 10 stacked over the metal film 9 is formed over the surface of the p-type well PW in the n-channel MISFET formation region 1A via the Hf-containing insulating film GI1 (the interfacial layer 3 and the Hf-containing insulating film GI1), and the gate electrode GE2 including the metal film 9 and the silicon film stacked over the metal film 9 is formed over the surface of the n-type well NW in the p-channel MISFET formation region 1B via the Hf-containing insulating film GI2 (the interfacial layer 3 and the Hf-containing insulating film GI2).

After the dry etching step for patterning the silicon film 10 and the metal film 9 in Step S16, wet etching for removing the portion of the Hf-containing insulating film GI1 which is uncovered with the gate electrode GE1 and the portion of the Hf-containing insulating film GI2 which is uncovered with the gate electrode GE2 is more preferably performed. The Hf-containing insulating film GI1 located under the gate electrode GE1 and the Hf-containing insulating film GI2 located under the gate electrode GE2 remain without being removed by the dry etching in Step S16 and the subsequent wet etching to form high-dielectric-constant gate insulating films. On the other hand, the portion of the Hf-containing insulating film GI1 which is uncovered with the gate electrode GE1 and the portion of the Hf-containing insulating film GI2 which is uncovered with the gate electrode GE2 are removed by the dry etching when the silicon film 10 and the metal film 9 are patterned in Step S16 and by the subsequent wet etching.

The Hf-containing insulating film GI1 remaining under the gate electrode GE1 functions as the gate insulating film of the n-channel MISFET, and the Hf-containing insulating film GI2 remaining under the gate electrode GE2 functions as the gate insulating film of the p-channel MISFET. Each of the Hf-containing insulating films GI1 and GI2 has a dielectric constant (specific permittivity) higher than that of a silicon oxide and functions as a high-dielectric-constant gate insulating film.

Each of the HfO film 4, the HfON film 4a, the HfSiO film 5, the HfSiON film 5a, and the Hf-containing insulating films GI1 and GI2 described above is an insulating material film having a dielectric constant (specific permittivity) higher than that of a silicon oxide, i.e., a so-called High-k film (high-dielectric-constant film).

Figure 18:
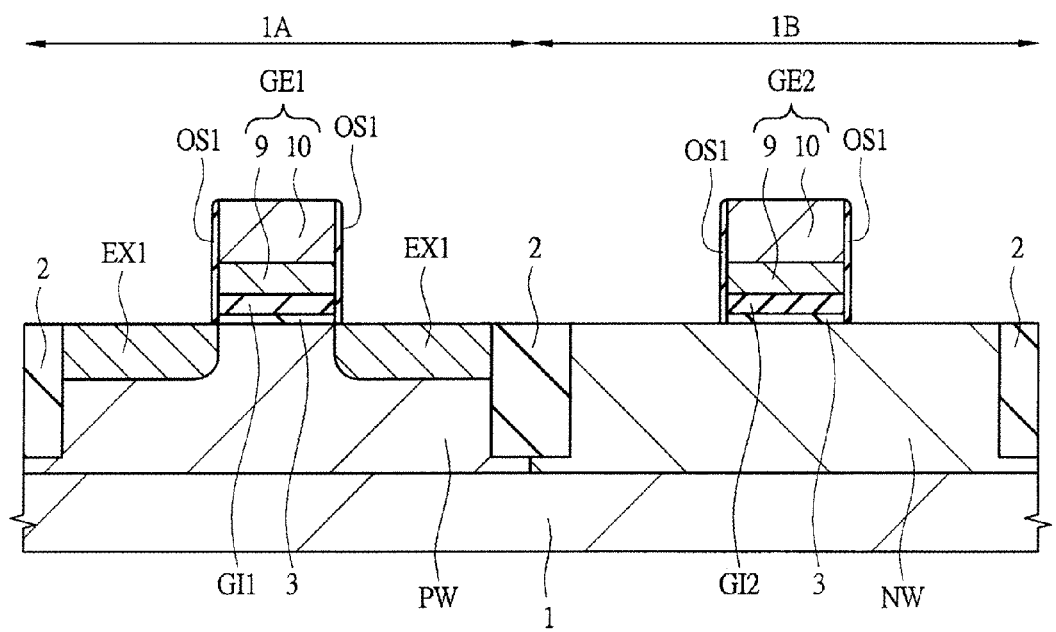
FIG. 18 is a main-portion cross-sectional view of the semiconductor device during the manufacturing steps thereof, which is subsequent to FIG. 17.

Next, as shown in FIG. 18, over the side walls of the gate electrodes GE1 and GE2, the offset spacers (offset sidewall spacers or side wall insulating films) OS1 each made of an insulator (insulating film) such as a silicon nitride film are formed (Step S17 in FIG. 3). By, e.g., forming the silicon nitride film over the semiconductor substrate 1 so as to cover the gate electrodes GE1 and GE2 and then anisotropically etching (etching back) the silicon nitride film, the offset spacers OS1 comprised of the silicon nitride films remaining over the side walls of the gate electrodes GE1 and GE2 can be formed. The thickness of each of the offset spacers OS1 can be controlled to be, e.g., about 10 nm.

Next, in the state in which the p-channel MISFET formation region 1B is covered with a photoresist film (resist film for introducing n-type source/drain extension regions, which is not shown here) using a photolithographic technique, an n-type impurity such as phosphorus (P) or arsenic (As) is ion-implanted into the regions of the p-type well PW located on both sides of the gate electrode GE1 (and the offset spacers OS1) in the n-channel MISFET formation region 1A to form the n⁻-type semiconductor regions EX1 (Step S18 in FIG. 3). During the ion implantation for forming the n⁻-type semiconductor regions EX1, the p-channel MISFET formation region 1B is covered with the foregoing photoresist film (not shown) as an ion implantation inhibiting mask so that the n-type impurity is ion-implanted into the semiconductor substrate 1 (p-type well PW) in the n-channel MISFET formation region 1A using the gate electrode GEL and the offset spacers OS1 as a mask.

Figure 19:
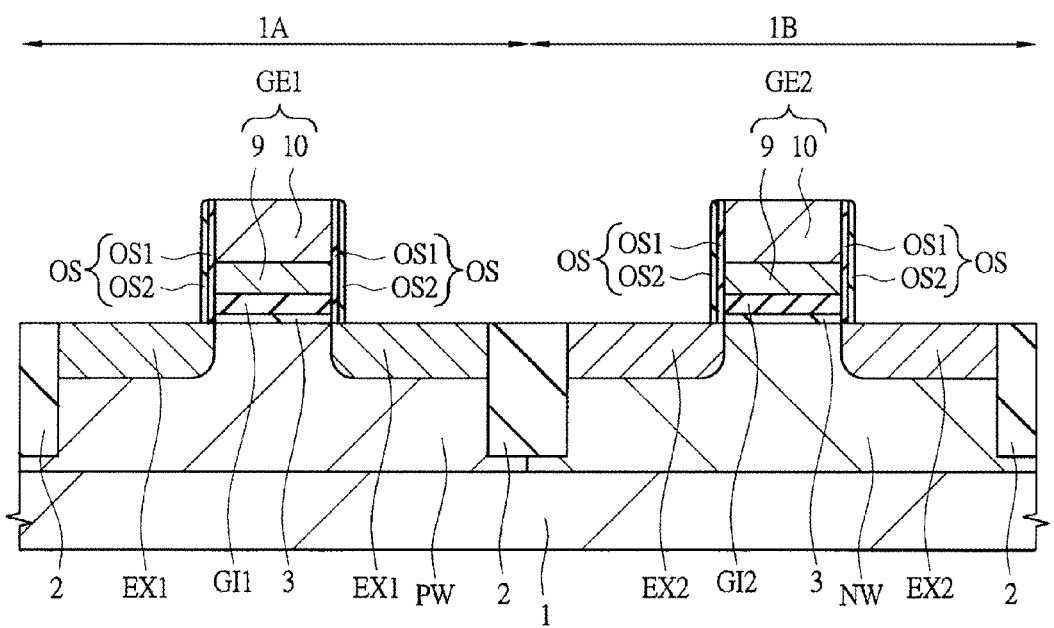
FIG. 19 is a main-portion cross-sectional view of the semiconductor device during the manufacturing steps thereof, which is subsequent to FIG. 18.

Next, as shown in FIG. 19, over the side walls of the gate electrodes GE1 and GE2 (i.e., over the side walls of the offset spacers OS1 formed over the side walls of the gate electrodes GE1 and GE2), the offset spacers (offset sidewall spacers or side wall insulating films) OS2 each made of an insulator (insulating film) such as a silicon nitride film are formed (Step S19 in FIG. 3). By, e.g., forming a silicon nitride film over the semiconductor substrate 1 so as to cover the gate electrodes GE1 and GE2 and the offset spacers OS1 and then anisotropically etching (etching back) the silicon nitride film, the offset spacers OS2 comprised of the silicon nitride films remaining over the side walls of the offset spacers OS1 over the side walls of the gate electrodes GE1 and GE2 can be formed.

By forming the offset spacers OS2, over the side walls of the gate electrodes GE1 and GE2, the offset spacers (offset sidewall spacers or side wall insulating films) OS comprised of laminates (laminate films) including the offset set spacers OS1 and the offset spacers OS2 are consequently formed. The offset spacers OS are thicker than the offset spacers OS1 by the thicknesses of the offset spacers OS2.

Next, in the state in which the n-channel MISFET formation region 1A is covered with a photoresist film (resist film for introducing p-type source/drain extension regions, which is not shown here) using a photolithographic technique, a p-type impurity such as boron (B) is ion-implanted into the regions of the n-type well NW located on both sides of the gate electrodes GE2 (and the offset spacers OS) in the p-channel MISFET formation region 1B to form the p⁻-type semiconductor regions EX2 (Step S20 in FIG. 3). During the ion implantation for forming the p⁻-type semiconductor regions EX2, the n-channel MISFET formation region 1A is covered with the foregoing photoresist film (not shown) as an ion implantation inhibiting mask so that the p-type impurity is ion-implanted into the semiconductor substrate 1 (n-type well NW) in the p-channel MISFET formation region 1B using the gate electrode GE2 and the offset spacers OS as a mask.

Figure 20:
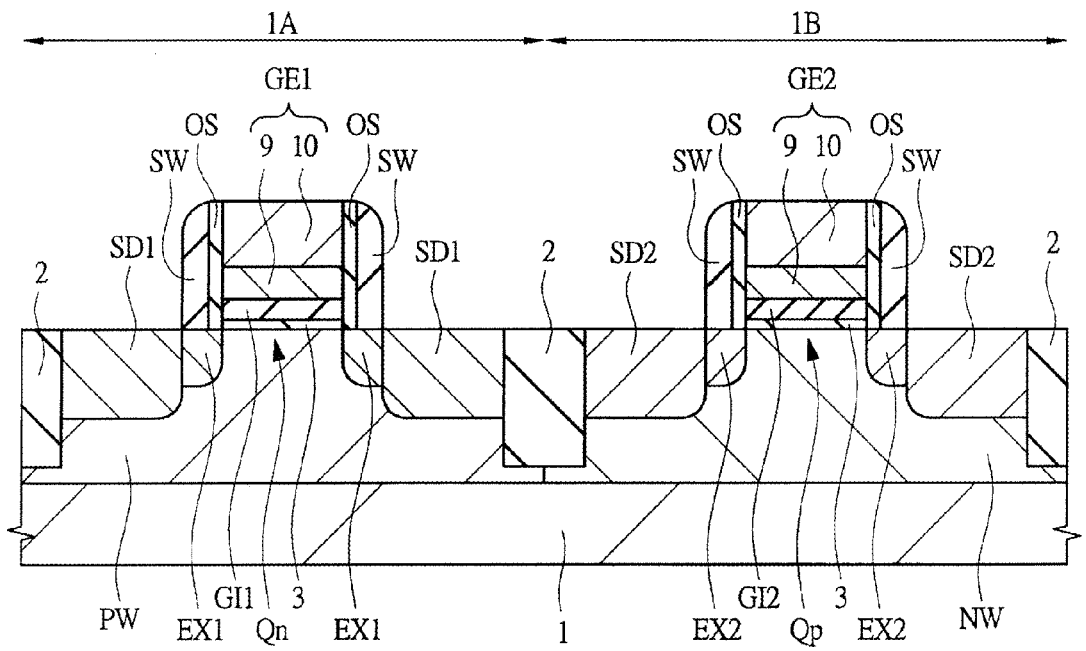
FIG. 20 is a main-portion cross-sectional view of the semiconductor device during the manufacturing steps thereof, which is subsequent to FIG. 19.

Next, as shown in FIG. 20, over the side walls of the gate electrodes GE1 and GE2 (i.e., over the side walls of the offset spacers OS), the sidewall spacers (side wall spacers, side wall insulating films, or sidewalls) SW each made of an insulator (insulating film) are formed (Step S21 in FIG. 3).

To form the sidewall spacers SW, e.g., a silicon oxide film and a silicon nitride film are successively formed in ascending order over the semiconductor substrate 1 so as to cover the gate electrodes GE1 and GE2 and the offset spacers OS. Then, a laminate film including the silicon oxide film and the silicon nitride film is anisotropically etched (etched back). In this manner, the sidewall spacers SW including the silicon oxide film and the silicon nitride film each remaining over the side walls of the gate electrodes GE1 and GE2 (i.e., over the side walls of the offset spacers OS) can be formed. The sidewall spacers SW are formed over the side walls of the gate electrodes GE1 and GE2 via the offset spacers OS. For simpler illustration, in FIG. 20 and the drawings subsequent thereto, the silicon oxide film and the silicon nitride film each included in the sidewall spacers SW are integrally shown. Also for simpler illustration, in FIG. 20 and the drawings subsequent thereto, the laminates (laminate films) including the offset spacers OS1 and OS2 are shown as the offset spacers OS.

Next, in the p-type well PW in the n-channel MISFET formation region 1A, the $n^+$-type semiconductor regions SD1 are formed by ion implantation and, in the n-type well NW in the p-channel MISFET formation region 1B, the $p^+$-type semiconductor regions SD2 are formed by another ion implantation (Step S22 in FIG. 3).

The $n^+$-type semiconductor regions SD1 can be formed by ion-implanting an n-type impurity such as phosphorus (P) or arsenic (As) into the regions of the p-type well PW located on both sides of the gate electrode GE1 and the side wall spacers SW in the n-channel MISFET formation region 1A. The $n^+$-type semiconductor regions SD1 have impurity concentrations higher than those of the $n^-$-type semiconductor regions EX1 and junction depths deeper than those of the $n^-$-type semiconductor regions EX1. During the ion implantation for forming the $n^+$-type semiconductor regions SD1, the p-channel MISFET formation region 1B is covered with a photoresist film (not shown) as an ion implantation inhibiting mask, and ion implantation into the semiconductor substrate 1 (p-type well PW) in the n-channel MISFET formation region 1A is performed using the gate electrode GE1 and the sidewall spacers SW over the side walls thereof as a mask. Consequently, the $n^-$-type semiconductor regions EX1 are formed by alignment with the gate electrode GE1 (the offset spacers OS1 over the side walls thereof), and the $n^+$-type semiconductor regions SD1 are formed by alignment with the sidewall spacers SW.

The $p^+$-type semiconductor regions SD2 can be formed by ion-implanting a p-type impurity such as boron (B) into the regions of the n-type well NW located on both sides of the gate electrode GE2 and the side wall spacers SW in the p-channel MISFET formation region 1B. The $p^+$-type semiconductor regions SD2 have impurity concentrations higher than those of the $p^-$-type semiconductor regions EX2 and junction depths deeper than those of the $p^-$-type semiconductor regions EX2. During the ion implantation for forming the $p^+$-type semiconductor regions SD2, the n-channel MISFET formation region 1A is covered with another photoresist film (not shown) as an ion implantation inhibiting mask, and ion implantation into the semiconductor substrate 1 (n-type well NW) in the p-channel MISFET formation region B1 is performed using the gate electrodes GE2 and the sidewall spacers SW over the side walls thereof as a mask. Consequently, the $p^-$-type semiconductor regions EX2 are formed by alignment with the gate electrode GE2 (the offset spacers OS over the side walls thereof), and the $p^+$-type semiconductor regions SD2 are formed by alignment with the sidewall spacers SW. Either the $n^+$-type semiconductor regions SD1 or the $p^+$-type semiconductor regions SD2 may be formed first.

Into the silicon film 10 forming the gate electrode GE1 in the n-channel MISFET formation region 1A, the n-type impurity is introduced in the ion implantation step for forming the $n^-$-type semiconductor regions EX1 and in the ion implantation step for forming the n-type semiconductor regions SD1 so that the silicon film 10 is changed to an n-type silicon film into the silicon film 10 forming the gate electrode GE2 in the p-channel MISFET formation region 1B, the p-type impurity is introduced in the ion implantation for forming the $p^-$-type semiconductor regions EX2 and in the ion implantation step for forming the $p^+$-type semiconductor regions SD2 so that the silicon film 10 is changed to a p-type silicon film.

Note that the $n^+$-type semiconductor regions SD1 function as the source/drain regions of the n-channel MISFET Qn and the $p^-$-type semiconductor regions SD2 function as the source/drain regions of the p-channel MISFET Qp. Therefore, Step S22 can be regarded as the step of performing the ion implantation for forming the source/drain regions of the n-channel MISFET Qn and the step of performing the ion implantation for forming the source/drain regions of the p-channel MISFET Qp.

After the ion implantation for forming the $n^+$-type semiconductor regions SD1 and the ion implantation for forming the $p^+$-type semiconductor regions SD2 are performed in Step S22, heat treatment (anneal treatment or activation anneal) for activating the introduced impurities is performed (Step S23 in FIG. 3).

The impurities introduced into the $n^-$-type semiconductor regions EX1, the $p^-$-type semiconductor regions EX2, the $n^+$-type semiconductor regions SD1, and the $p^+$-type semiconductor regions SD2 in the ion implantations in Steps S18, S20, and S22 can be activated by the heat treatment in Step S23. The heat treatment in Step S23 can be performed at a heat treatment temperature of, e.g., 900 to 1100° C. and in an inert gas atmosphere, more preferably a nitrogen atmosphere.

Thus, a structure as shown in FIG. 20 is obtained, the n-channel MISFET Qn is formed as a field effect transistor in the n-channel MISFET formation region 1A, and the p-channel MISFET Qp is formed as a field effect transistor in the p-channel MISFET formation region 1B.

The gate electrode GE1 functions as the gate electrode (metal gate electrode) of the n-channel MISFET Qn, and the Hf-containing insulating film GI1 located under the gate electrode GE1 (and the interfacial layer 3 located thereunder) functions as the gate insulating film of the n-channel MISFET Qn. N-type semiconductor regions (impurity diffusion layers) each functioning as the source or drain of the n-channel MISFET Qn are formed of the $n^+$-type semiconductor regions SD1 and the $n^-$-type semiconductor regions EX1. On the other hand, the gate electrode GE2 functions as the gate electrode (metal gate electrode) of the p-channel MISFET Qp, and the Hf-containing insulating film GI2 located under the gate electrode GE2 (and the interfacial layer 3 located thereunder) functions as the gate insulating film of the p-channel MISFET Qp. P-type semiconductor regions (impurity diffusion layers) each functioning as the source or drain of the p-channel MISFET Qp are formed of the $p^+$-type semiconductor regions SD2 and the $p^-$-type semiconductor regions EX2. The gate electrodes GE1 and GE2 have the metal films (which are the metal films 9 here) in contact with the gate insulating films, and are therefore so-called metal gate electrodes (metallic gate electrodes).

It is also possible that, by a salicide (Self Aligned Silicide) process, over the $n^-$-type semiconductor regions SD1 and the $p^+$-type semiconductor regions SD2 forming the source/drain regions and over the silicon films 10 forming the gate electrodes GE1 and GE2, metal silicide layers (not shown) each made of a cobalt silicide, a nickel silicide, or the like are formed.

Figure 21:
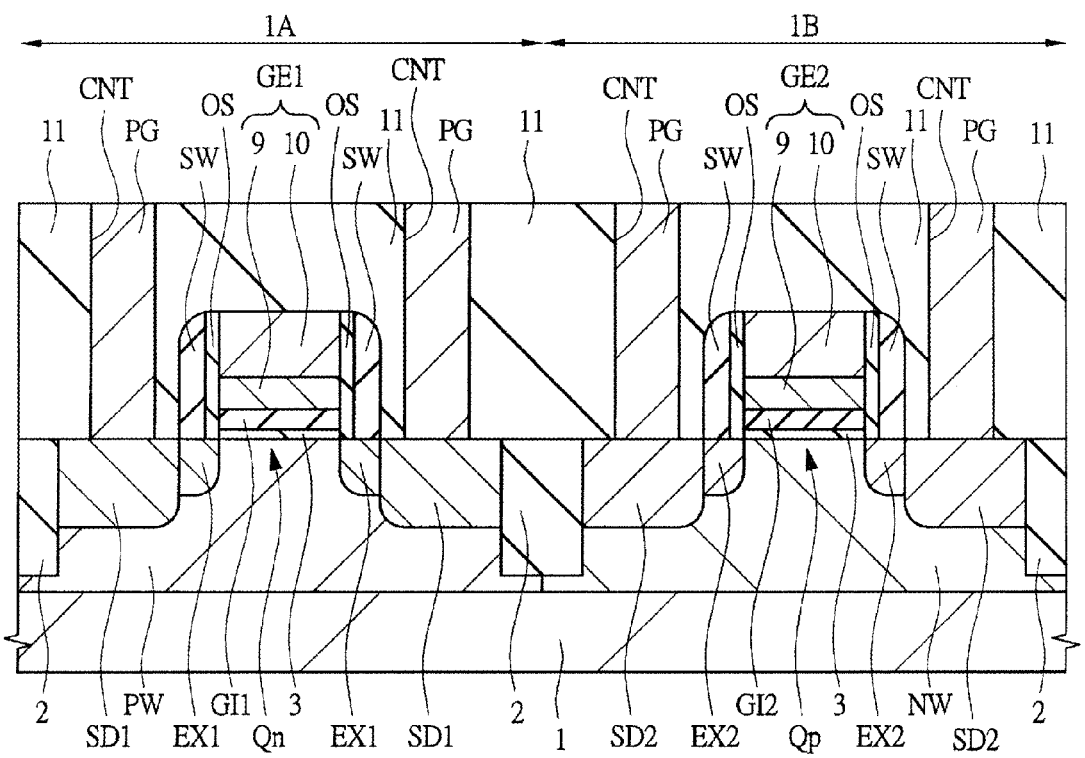
FIG. 21 is a main-portion cross-sectional view of the semiconductor device during the manufacturing steps thereof, which is subsequent to FIG. 20.

Next, as shown in FIG. 21, over the main surface of the semiconductor substrate 1, the insulating film (interlayer insulating film) 11 is formed so as to cover the gate electrodes GE1 and GE2, the offset spacers OS, and the sidewall spacers SW. The insulating film 11 is made of, e.g., a single-layer silicon oxide film, a laminate film including a thin silicon nitride film and a thick silicon oxide film stacked thereover, or the like. After the formation of the insulating film 11, the surface (upper surface) of the insulating film 11 is planarized using, e.g., a CMP (Chemical Mechanical Polishing) method.

Next, using a photoresist pattern (not shown) formed over the insulating film 11 as an etching mask, dry etching of the insulating film 11 is performed to form the contact holes (through holes or holes) CNT in the insulating film 11. The contact holes CNT are formed over the n$^+$-type semiconductor region SD1, the p$^+$-type semiconductor region SD2, the gate electrodes GE1 and GE2, and the like.

Next, in the contact holes CNT, the conductive plugs (connection conductor portions) PG each made of tungsten (W) or the like are formed. To form the plugs PG, e.g., over the insulating film 11 including the insides of the contact holes CNT (over the bottom portions and side walls thereof), a barrier conductor film (e.g., a titanium film, a titanium nitride film, or a laminate film thereof) is formed. Then, a main conductor film comprised of a tungsten film or the like is formed over the barrier conductor film so as to fill the contact holes CNT. By removing the unneeded main conductor film and barrier conductor film over the insulating film 11 by a CMP method, an etch-back method, or the like, the plugs PG can be formed. Note that, for simpler illustration, in FIG. 21, the barrier conductor film and the main conductor film (tungsten film) each included in the plugs PG are integrally shown.

Figure 22:
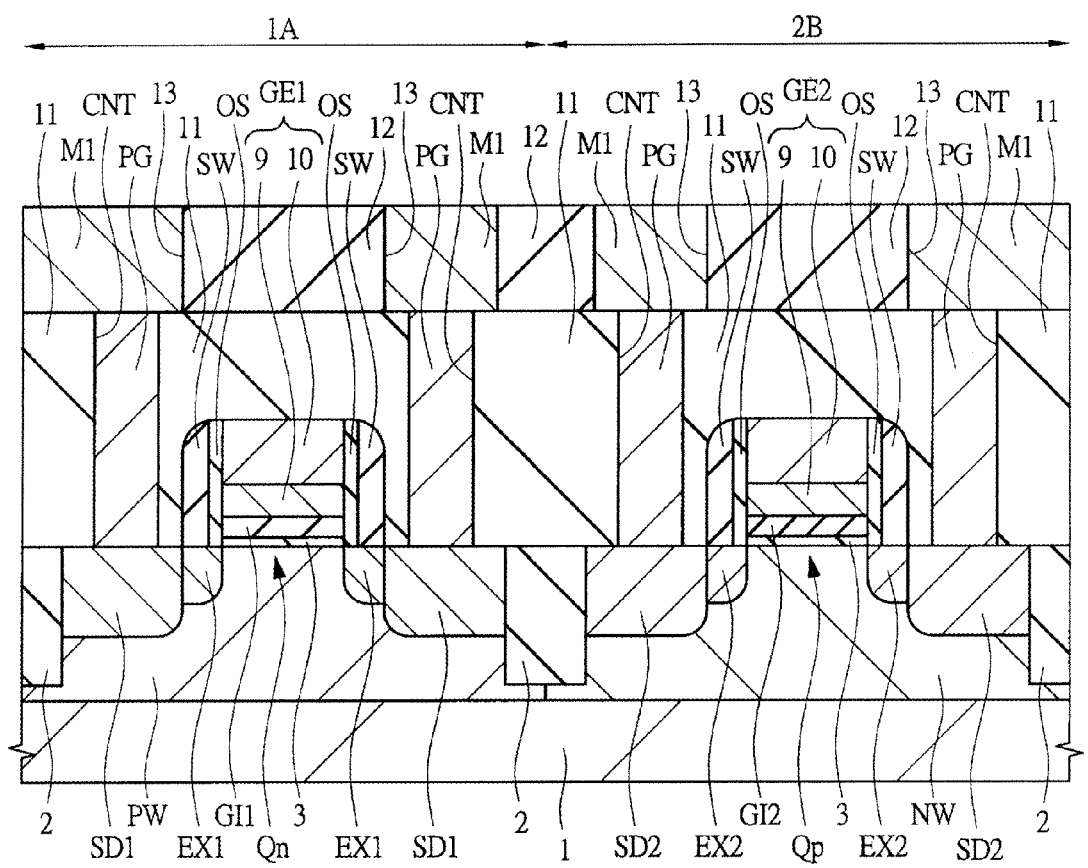
FIG. 22 is a main-portion cross-sectional view of the semiconductor device during the manufacturing steps thereof, which is subsequent to FIG. 21.

Next, as shown in FIG. 22, over the insulating film 11 in which the plugs PG are embedded, the insulating film (interlayer insulating film) 12 for forming interconnect wires is formed. The insulating film 12 can be comprised of a single-layer film (single-layer insulating film) or a laminate film (laminate insulating film).

Next, by a single damascene method, first-layer interconnect wires are formed. First, by dry etching using a photoresist pattern (not shown) as a mask, interconnect wire trenches 13 are formed in predetermined regions of the insulating film 12. Then, over the main surface of the semiconductor substrate 1 (i.e., over the insulating film 12 including the bottom portions and side walls of the interconnect wire trenches 13), a barrier conductor film (barrier metal film) is formed. As the barrier conductor film, e.g., a titanium nitride film, a tantalum film, a tantalum nitride film, or the like can be used. Subsequently, by a CVD method, a sputtering method, or the like, a copper seed layer is formed over the barrier conductor film. Further, using an electrolytic plating method or the like, a copper plating film (main conductor film) is formed over the seed layer to fill the interconnect wire trenches 13 with the copper plating film. Then, the copper plating film, the seed layer, and the barrier conductor film located in the region other than in the interconnect wire trenches 13 are removed by a CMP method to form the first-layer interconnect wires M1 containing copper as a main conductive material in the interconnect wire trenches 13. Note that, for simpler illustration, in FIG. 22, the copper plating film, the seed layer, and the barrier conductor film which are included in the interconnect wires M1 are integrally shown. Each of the interconnect wires M1 is electrically coupled to the plug PG and to the n$^+$-type semiconductor region SD1, the p$^+$-type semiconductor region SD2, the gate electrode GE1, the gate electrode GE2, or the like via the plug PG.

Thereafter, interconnect wires in the second and subsequent layers are formed by a dual damascene method, but the illustration and description thereof is omitted here. The interconnect wires M1 and the interconnect wires in the layers located thereabove are not limited to damascene wires, and can also be formed by patterning a conductor film for interconnect wires. For example, the interconnect wires M1 and the interconnect wires in the layers located thereabove can also be tungsten wires, aluminum wires, or the like.

Next, the characteristic features of the present embodiment will be described in greater detail.

In the present embodiment, as the gate insulating film of the n-channel MISFET Qn, the Hf-containing insulating film GI1 having a dielectric constant higher than that of a silicon oxide is used and, as the gate insulating film of the p-channel MISFET Qp, the Hf-containing insulating film GI2 having a dielectric constant higher than that of a silicon oxide is used. That is, the Hf-containing insulating films GI1 and GI2 which are material films each having a dielectric constant (specific permittivity) higher than that of a silicon oxide, i.e., so-called High-k films are used as the gate insulating films of the n-channel MISFET Qn and the p-channel MISFET Qp. Accordingly, compared to the case where silicon oxide films are used as the gate insulating films of the n-channel MISFET Qn and the p-channel MISFET Qp, the physical thicknesses of the Hf-containing insulating films GI1 and GI2 can be increased to allow reductions in gate leakage currents.

In the present embodiment, the gate electrodes GE1 and GE2 of the n-channel MISFET Qn and the p-channel MISFET Qp have the metal films 9 located over the gate insulating films (which are the interfacial layers 3 and the Hf-containing insulating films GI1 and GI2 here), and are so-called metal gate electrodes (metallic gate electrodes). Therefore, it is possible to suppress a depletion phenomenon in each of the gate electrodes and eliminate a parasitic capacitance to also allow reductions in the sizes of the MISFET elements (reductions in the thicknesses of the gate insulating films).

Also, in the present embodiment, in the p-channel MISFET Qp, aluminum (Al) has been introduced into the Hf-containing insulating film GI2 as the Hf-based high-dielectric-constant gate insulating film of the p-channel MISFET Qp to allow a reduction in the threshold of the p-channel MISFET Qp. On the other hand, in the n-channel MISFET Qn, a rare earth element (more specifically La) has been introduced into the Hf-containing insulating film GI1 as the Hf-based high-dielectric-constant gate insulating film of the n-channel MISFET Qn to allow a reduction in the threshold of the n-channel MISFET Qn. That is, the threshold of each of the n-channel MISFET Qn and the p-channel MISFET Qp can be reduced (the absolute value of the threshold voltage of each of the n-channel MISFET Qn and the p-channel MISFET Qp can be reduced).

Thus, in the present embodiment, the Hf-based gate insulating films which are high-dielectric-constant gate insulating films each containing Hf (which are the Hf-containing insulating films GI1 and GI2 here) are used. One of the main characteristic features of the present embodiment is that, in the formation of the Hf-based gate insulating films (Hf-containing insulating films GI1 and GI2), the laminate film (laminate structure) including the HfON film 4a and the HfSiON film 5a stacked thereover is used.

Unlike in the present embodiment, it can also be considered to use the single-layer HfO film instead of the laminate film including the HfON film 4a and the HfSiON film 5a stacked thereover. This case will be referred to as a first comparative example. However, in the case of the first comparative example, it is difficult to achieve each of the higher performance of transistors and the reliability thereof which can be ensured for ten or more years. A HfO film is highly likely to be crystallized by heat treatment (e.g., the heat treatment in Step S12 or the heat treatment in Step S23 each described above) and, once the HfO film is crystallized, gate leakage currents are likely to be increased.

To prevent this, it can be considered to use a single-layer HfON film instead of the laminate film including the HfON film 4a and the HfSiON film 5a stacked thereover, unlike in the present embodiment. This case will be referred to as a second comparative example. Since the HfON film is less likely to be crystallized than the HfO film, the second comparative example is advantageous over the first comparative example in terms of suppressing gate leakage currents.

However, there is a phenomenon in which, from the isolation region 2 (the silicon oxide film forming the isolation region 2), oxygen (O) is diffused into any of the gate insulating films to increase the thickness of the gate insulating film and the EOT (Equivalent oxide thickness) of the gate insulating film, thereby degrading the driving force of the transistor (this phenomenon will be hereinafter referred to as "the phenomenon of the increased thickness of the gate insulating film resulting from oxygen diffusion"). The phenomenon undesirably occurs not only in the first comparative example using the single-layer HfO film, but also in the second comparative example using the single-layer HfON film.

To prevent this, it can be considered to use a single-layer HfSiO film or a single-layer HfSiON film instead of the laminate film including the HfON film 4a and the HfSiON film 5a stacked thereover, unlike in the present embodiment. This case will be referred to as a third comparative example. The HfSiO film or the HfSiON film containing Si is a film (amorphous film) far less likely to be crystallized than the HfO film and the HfON film which do not contain Si. Therefore, the HfSiO film or the HfSiON film is less likely to transmit oxygen so that the phenomenon of the increased thickness of the gate insulating film resulting from oxygen diffusion described above is less likely to occur. Note that, in the third comparative example, the effect of suppressing the phenomenon of the increased thickness of the gate insulating film resulting from oxygen diffusion described above is higher when the HfSiON film is used than when the HfSiO film is used.

However, the HfSiO film or the HfSiON film containing Si has a dielectric constant lower than that of the HfO film or the HfON film not containing Si. Accordingly, when the EOT of each of the Hf-based gate insulating films is controlled to be equal, in the third comparative example using the single-layer HfSiO film or the single-layer HfSiON film, the physical thickness of the Hf-based gate insulating film is thinner than in the first comparative example using the single-layer HfO film and in the second comparative example using the single-layer HfON film. This may increase a gate leakage current.

By contrast, in the present embodiment, in the formation of the Hf-based gate insulating film, the laminate film including the HfON film 4a and the HfSiON film 5a stacked thereover is used. The HfON film 4a and the HfSiON film 5a stacked thereover react with each other during the heat treatment to form the Hf-containing insulating films GI1 and GI2 so that the Hf-containing insulating films GI1 and GI2 contain Hf (hafnium), O (oxygen), N (nitrogen), and Si (silicon) as main components. However, it can be considered that, because the HfON film 4a is formed in the lower layer and the HfSiON film 5a is formed in the upper layer, the concentration distribution of Si (silicon) in each of the Hf-containing insulating films GI1 and GI2 in the manufactured semiconductor device is not uniform (constant) in the thickness direction, and the Si concentration (atomic ratio) is higher in the upper part thereof (closer to the gate electrodes GE1 and GE2) and lower in the lower part thereof (closer to the semiconductor substrate 1). That is, in the semiconductor device of the present embodiment, the concentration of silicon (Si) in the thickness direction of the Hf-based gate insulating films (Hf-containing insulating films GI1 and GI2) is conceivably distributed to be higher in the upper part (closer to the gate electrodes GE1 and GE2) than in the lower part (closer to the semiconductor substrate 1).

Figure 23A:
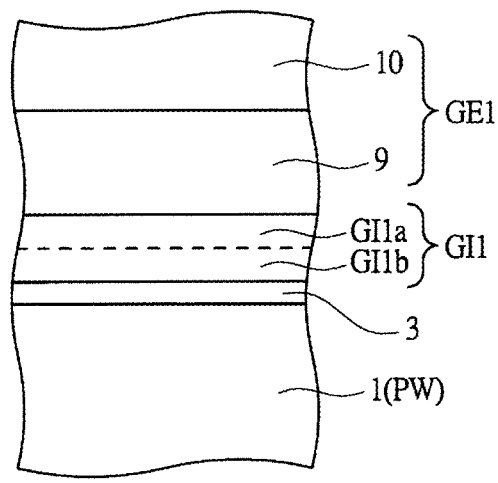
FIGS. 23A and 23B are illustrative views of a Hf-containing insulating film.
Figure 23B:
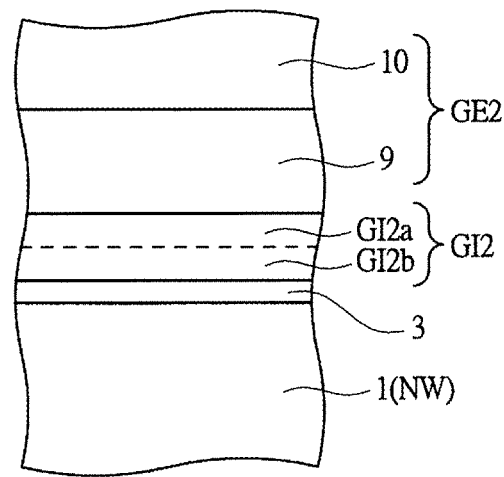

FIGS. 23A and 23B are illustrative views of the Hf-containing insulating films GI1 and GI2. FIG. 23A shows a partially enlarged cross-sectional view of the laminate structure of the semiconductor substrate 1 (p-type well PW), the interfacial layer 3, the Hf-containing insulating film GI1, and the gate electrode GE1. FIG. 23B snows a partially enlarged cross-sectional view of the laminate structure of the semiconductor substrate 1 (n-type well NW), the interfacial layer 3, the Hf-containing insulating film GI2, and the gate electrode GE2. For improved clarity of illustration, hatching is omitted. In FIG. 23A, if a comparison is made between an upper part (upper-layer part) GI1a of the Hf-containing insulating film GI1 and a lower part (lower-layer part) GI1b thereof, the Si concentration (atomic ratio) is conceivably higher in the upper part GI1a than in the lower part GI1b. Also, in FIG. 23B, if a comparison is made between an upper part (upper-layer part) GI2a of the Hf-containing insulating film GI2 and a lower part (lower-layer part) GI2b thereof, the Si concentration (atomic ratio) is conceivably higher in the upper part GI2a than in the lower part GI2b. This is because, as a result of using the HfON film 4a and the HfSiON film 5a stacked thereover in the formation of the Hf-based gate insulating films (Hf-containing insulating films GI1 and GI2), the composition of the HfSiON film 5a tends to be left mainly in the upper parts GI1a and GI2a of the Hf-containing insulating films GI1 and GI2 to increase the Si concentration, while the composition of the HfON film 4a tends to be left mainly in the lower parts GI1b and GI2b of the Hf-containing insulating films GI1 and GI2. Here, the thickness of each of the upper parts GI1a and GI2a substantially corresponds to the thickness of the HfSiON film 5a, and the thickness of each of the lower parts GI1b and GI2b substantially corresponds to the thickness of the HfON film 4a. However, in the Hf-containing insulating films GI1 and GI2, there are no distinct interfaces formed between the upper parts GI1a and GI2a and the lower parts GI1b and GI2b (the portions shown by the dotted lines in FIGS. 23A and 23B).

In the present embodiment, the HfSiON film 5a is used in the formation of the Hf-based gate insulating films so that N (nitrogen) and Si (silicon) are contained in the Hf-based gate insulating films (which are the Hf-containing insulating films GI1 and GI2 here). Due to N (nitrogen) and Si (silicon) contained therein, the Hf-based gate insulating films (which are the Hf-containing insulating films GI1 and GI2 here) are less likely to be crystallized (are amorphous films) and therefore less likely to transmit oxygen (O). As a result, the phenomenon of the increased thickness of the gate insulating film resulting from oxygen diffusion described above is less likely to occur, and the degradation of the driving force of each of the transistors in a channel region (where a width $W1 \leq 1$ μm is satisfied) having a short channel length and a narrow channel width can be prevented.

In the present embodiment, in the formation of the Hf-based gate insulating films, the single-layer HfSiON film containing Si is not used, but the laminate film including the HfON film 4a not containing Si and the HfSiON film 5a containing Si is used. Accordingly, compared to the third comparative example using the single-layer HfSiON film (or the single-layer HfSiO film) containing Si, the dielectric constant of each of the Hf-based gate insulating films (which are the Hf-containing insulating films GI1 and GI2 here) can be increased and, when the EOT is controlled to be equal, the physical thickness of each of the Hf-containing gate insulating films (which are the Hf-containing insulating films GI1 and GI2 here) can be increased. Therefore, gate leakage currents can be suppressed.

In addition, the metal films 9 of the gate electrodes GE1 and GE2 are metal nitride films and contain nitrogen (N). If nitrogen (N) in the metal films 9 of the gate electrodes GE1 and GE2 is diffused toward the semiconductor substrate 1 to reach the vicinity of the interface between the semiconductor substrate 1 (each of the p-type well PW and the n-type well NW) and the interfacial layer 3, the deterioration of NBTI (Negative Bias Temperature Instability) may occur (a change in threshold voltage due to the NBTI may occur). By contrast, in the present embodiment, as a result of using the HfSiON film 5a in the formation of the Hf-based gate insulating films, N (nitrogen) and Si (silicon) are contained in the Hf-based gate insulating films (which are the Hf-containing insulating films GI1 and GI2 here). Due to N (nitrogen) and Si (silicon) contained therein, the Hf-based gate insulating films (which are the Hf-containing insulating films GI1 and GI2 here) are less likely to be crystallized (are amorphous films) and therefore less likely to transmit not only oxygen (O), but also nitrogen (N). As a result, it is possible to inhibit or prevent the deterioration of the NBTI (a change in threshold voltage due to the NBTI) from occurring due to the diffusion of nitrogen (N) in the metal films 9 of the gate electrodes GE1 and GE2 described above toward the semiconductor substrate 1 (to the vicinity of the interface between the semiconductor substrate 1 and the interfacial layer 3).

On the other hand, it can also be considered to use a laminate film including a HfSiON film and a HfON film stacked thereover instead of the laminate film including the HfON film 4a and the HfSiON film 5a stacked thereover, unlike in the present embodiment. This case will be referred to as a fourth comparative example. That is, in the present embodiment, the HfON film 4a is in the lower layer and the HfSiON film 5a is in the upper layer while, in the fourth comparative example, the HfON film is in the upper layer and the HfSiON film is in the lower layer. In the present embodiment and the fourth comparative example, the order of lamination of the HfON film and the HfSiON film is different.

However, in terms of preventing the diffusion of nitrogen (N) in the metal films 9 of the gate electrodes GE1 and GE2 toward the semiconductor substrate 1 (to the vicinity of the interface between the semiconductor substrate 1 and the interfacial layer 3), the present embodiment (the case where the HfON film is in the lower layer and the HfSiON film is in the upper layer) is more effective than the fourth comparative example (the case where the HfON film is in the upper layer and the HfSiON film is in the lower layer). The reason for this will be described below.

That is, in the present embodiment, in the formation of the Hf-based gate insulating films, the laminate film including the HfON film 4a and the HfSiON film 5a stacked thereover is used. The HfON film 4a not containing Si is in the lower layer, and the HfSiON film 5a containing Si is in the upper layer. Therefore, in the present embodiment, the Si concentrations in the formed Hf-based gate insulating films (which are the Hf-containing insulating films GI1 and GI2 here) can be increased in the upper parts (closer to the gate electrodes GE1 and GE2) thereof. On the other hand, in the fourth comparative example, in the formation of the Hf-based gate insulating films, the laminate film including the HfSiON film and the HfON film stacked thereover is used, but the HfSiON film containing Si is in the lower layer and the HfON film not containing Si is in the upper layer. As a result, in the case of the fourth comparative example, the Si concentrations in the formed Hf-based gate insulating films are higher in the lower parts (closer to the semiconductor substrate) thereof than in the upper parts (closer to the gate electrodes) thereof. Therefore, the Si concentrations in the Hf-based gate insulating films are difficult to increase in the vicinities of the interfaces between the gate electrodes and the Hf-based gate insulating films.

To prevent the diffusion of nitrogen (N) in the metal films 9 of the gate electrodes GE1 and GE2 toward the semiconductor substrate 1 (to the vicinity of the interface between the semiconductor substrate 1 and the interfacial layer 3), it is effective to increase the Si concentrations in the Hf-based gate insulating films in the vicinities of the interfaces between the gate electrodes GE1 and GE2 and the Hf-based gate insulating films (which are the Hf-containing insulating films GI1 and GI2 in the present embodiment). This is because, to prevent the diffusion of nitrogen (N) in the metal films 9 of the gate electrodes GE1 and GE2 toward the semiconductor substrate 1, it is effective to have a high diffusion barrier function against nitrogen (N) in the portions (interfacial portions) in contact with the gate electrodes GE1 and GE2 and, to enhance the diffusion barrier function, the Si concentrations need to be increased.

In the case in the fourth comparative example, the HfSiON film is formed under the HfON film. As a result, the Si concentrations in the Hf-based gate insulating films are difficult to increase in the vicinities of the interfaces between the gate electrodes and the Hf-based gate insulating films, and the diffusion barrier function against nitrogen (N) is difficult to enhance in the portions (interfacial portions) in contact with the gate electrodes. Accordingly, the effect of allowing prevention of the diffusion of nitrogen (N) in the metal films of the gate electrodes toward the semiconductor substrate is limited.

By contrast, in the present embodiment, the HfSiON film 5a is formed over the HfON film 4a. As a result, the Si concentrations in the Hf-based gate insulating films (Hf-containing insulating films GI1 and GI2) are easy to increase in the vicinities of the interfaces between the gate electrodes GE1 and GE2 and the Hf-based gate insulating films (Hf-containing insulating films GI1 and GI2), and the diffusion barrier function against nitrogen (N) is easy to enhance in the portions (interfacial portions) in contact with the gate electrodes GE1 and GE2. Therefore, it is possible to more reliably prevent the diffusion of nitrogen (N) in the metal films 9 of the gate electrodes GE1 and GE2 toward the semiconductor substrate 1 (to the vicinity of the interface between the semiconductor substrate 1 and the interfacial layer 3). Accordingly, it is possible to more reliably inhibit or prevent the occurrence of deterioration of the NBTI (a change in threshold voltage due to the NBTI).

That is, to reliably prevent the diffusion of nitrogen (N) in the metal films 9 of the gate electrodes GE1 and GE2 toward the semiconductor substrate 1 (to the vicinity of the interface between the semiconductor substrate 1 and the interfacial layer) 3, it is effective to dispose the diffusion barrier layer (HfSiON film) against nitrogen (N) as close as possible to the gate electrodes GE1 and GE2 (metal films 9). In the present embodiment, the diffusion barrier layer (HfSiON film) against nitrogen (N) is disposed closer to the gate electrodes GE1 and GE2 (metal films 9) than in the fourth comparative example. Therefore, it is possible to more reliably prevent the diffusion of nitrogen (N) in the metal films 9 of the gate electrodes GE1 and GE2 toward the semiconductor substrate 1 (to the vicinity of the interface between the semiconductor substrate 1 and the interfacial layer 3).

Thus, in the present, embodiment, when the Si concentrations in the entire Hf-based gate insulating films (Hf-containing insulating films GI1 and GI2) are increased, the dielectric constants of the Hf-based gate insulating films decrease. Accordingly, the Si concentrations are increased in regions which are most effective in preventing the diffusion of nitrogen (N) in the metal films 9 of the gate electrodes GE1 and GE2 toward the semiconductor substrate 1, while the Si concentrations are reduced in the other regions (i.e., under the Hf-based gate insulating films). This is achieved by using the laminate film (laminate structure) including the HfON film 4a and the HfSiON film 5a stacked thereover in the formation of the Hf-based high-dielectric-constant gate insulating films (Hf-containing insulating films GI1 and GI2). Thus, it is possible to increase the dielectric constants of the Hf-based gate insulating films and also prevent the deterioration of the NBTI (a change in threshold voltage due to the NBTI) resulting from the diffusion of nitrogen (N) from the metal gate electrodes.

In the present embodiment, in the formation of the Hf-based high-dielectric-constant gate insulating films (Hf-containing insulating films GI1 and GI2), the laminate film (laminate structure) including the HfON film 4a and the HfSiON film 5a stacked thereover is used. To obtain the laminate film, the HfO film 4 is formed in Step S5, the HfSiO film 5 is formed over the HfO film 4 in Step S6, and then nitridation treatment is performed in Step S7 to nitride the HfO film 4 and the HfSiO film 5, thereby forming the HfON film 4a and the HfSiON film 5a. In another method for obtaining the laminate film including the HfON film 4a and the HfSiON film 5a stacked thereover, it is also possible to deposit the HfO film 4 in Step S5, then perform nitridation treatment to nitride the HfO film 4 into a HfON film, subsequently deposit the HfSiO film 5 over the HfON film in Step S6, and then perform nitridation treatment to nitride the HfSiO film 5 into a HfSiON film.

However, in the case of providing an additional nitridation treatment step (nitridation treatment step for the HfO film 4) between the step of depositing the HfO film 4 in Step S5 and the step of depositing the HfSiO film 5 in Step S6, the HfO film 4 is accordingly nitrided twice in the additional nitridation treatment and in the nitridation treatment in Step S7. Consequently, the HfO film 4 may be excessively nitrided. Therefore, after the step of depositing the HfO film 4 in Step S5, it is more preferable to perform the step of depositing the HfSiO film 5 in Step S6 without performing the nitridation treatment of the HfO film 4. That is, it is more preferable to perform the nitridation treatment of the HfO film 4 and the HfSiO film 5 in Step S7 without performing the nitridation treatment of the HfO film 4 between Steps S5 and S6. Accordingly, at the stage prior to performing the nitridation treatment in Step S7, the HfSiO film 5 and the HfO film 4 are not nitrided, but are nitrided in the nitridation treatment in Step S7. Therefore, it is possible to prevent excessive nitridation of the HfO film 4.

Preferably, the step of depositing the HfO film 4 in Step S5 and the step of depositing the HfSiO film 5 in Step S6 are continuously performed without exposing the semiconductor substrate 1 to an atmosphere. This allows the HfSiO film 5 to be continuously formed over the HfO film 4 and can prevent an unneeded interfacial layer from being formed between the HfO film 4 and the HfSiO film 5. If the unneeded interfacial layer is formed between the HfO film 4 and the HfSiO film 5, the EOT of each of the gate insulating films may vary (fluctuate) due to the interfacial layer. By continuously performing the step of depositing the HfO film 4 in Step S5 and the step of depositing the HfSiO film 5 in Step S6 without exposing the semiconductor substrate 1 to an atmosphere, it is possible to prevent the unneeded interfacial layer from being formed between the HfO film 4 and the HfSiO film 5 and inhibit or prevent variations in the EOT of each of the gate insulating films.

If a comparison is made between the thickness of the HfO film 4 formed in Step S5 described above (film thickness or the thickness of the formed film) and the thickness of the HfSiO film 5 formed in Step S6 described above (film thickness or the thickness of the formed film), the thickness of the HfO film 4 is preferably larger than the thickness of the HfSiO film 5 (the HfO film 4 is preferably thicker than the HfSiO film 5). Accordingly, when a comparison is made between the thickness of the HfON film 4a and the thickness of the HfSiON film 5a at the stage at which the nitridation treatment in Step S7 has been performed, the thickness of the HfON film 4a is preferably larger than the thickness of the HfSiON film 5a (the HfON film 4a is preferably thicker than the HfSiON film 5a). This is because it is sufficient to ensure, for the HfSiON film 5a (HfSiO film 5), a thickness which allows the diffusion preventing function against oxygen (O) and nitrogen (N) to be performed. If the HfSiON film 5a (HfSiO film 5) is excessively thickened, the dielectric constants of the Hf-based gate insulating films may deteriorate. Therefore, the HfON film 4a (HfO film 4) is used as the major film to suppress reductions in the dielectric constants of the Hf-based gate insulating films.

In terms of ensuring a thickness which allows the diffusion preventing function against oxygen (O) and nitrogen (N) to performed, the thickness of the HfSiON film 5a is preferably not less than 0.2 nm. In terms of additionally inhibiting the deterioration of the dielectric constants of the Hf-based gate insulating films, the thickness of the HfSiON film 5a is more preferably 0.2 to 0.55 nm. If consideration is given to a preferred thickness of the HfSiON film 5a and a preferred thickness of the entire Hf-based gate insulating film, the thickness of the HfON film 4a can preferably be controlled to be about 0.6 to 0.85 nm.

If a comparison is made between the Hf concentration (atomic ratio) in the HfON film 4a and the Hf concentration (atomic ratio) in the HfSiON film 5a, the Hf concentration in the HfSiON film 5a containing Si is accordingly lower than the Hf concentration in the HfON film 4a.

The atomic ratio between Hf and Si contained in the HfSiON film 5a (HfSiO film 5) is preferably such that Hf atoms account for 40 to 60% (at %) of the total number of Hf atoms and Si atoms (Si atoms account for the remaining 60 to 40%). In other words, the atomic ratio (i.e., Hf:Si) between Hf and Si in the HfSiON film 5a (HfSiO film 5) is preferably between 4:6 and 6:4. That is, in the HfSiON film 5a (HfSiO film 5), the Hf concentration (atomic ratio) is preferably ⅔ to 1.5 times as high as the Si concentration (atomic ratio). The statement that the Hf concentration (atomic ratio) is ⅔ to 1.5 times as high as the Si concentration (atomic ratio) in the HfSiON film 5a (HfSiO film 5) is synonymous to the statement that the Si concentration (atomic ratio) is ⅔ to 1.5 times as high as the Hf concentration (atomic ratio) in the HfSiON film 5a (HfSiO film 5). By setting the ratio between Hf and Si to a value within the range, the HfSiON film 5a (HfSiO film 5) having an excellent film quality can be formed.

Figure 24:
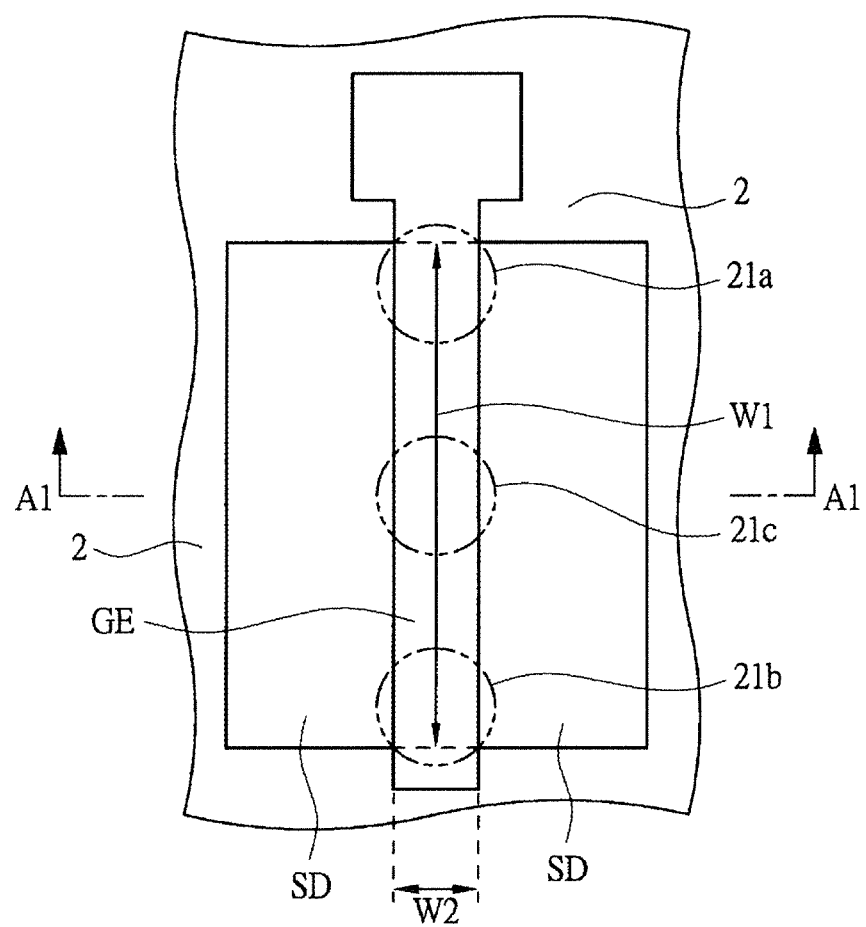
FIG. 24 is an illustrative view of a gate width.

FIG. 24 is an illustrative view of a gate width. FIG. 24 shows a two-dimensional layout of a gate electrode GE (corresponding to the gate electrode GE1 or the gate electrode GE2 of the present embodiment) and source/drain regions SD (corresponding to combinations of the n⁻-type semiconductor regions EX1 and the n⁺-type semiconductor regions SD1 or combinations of the p⁻-type semiconductor regions EX2 and the p⁺-type semiconductor regions SD2). When the gate electrode GE shown in FIG. 24 is the gate electrode GE1, a cross-sectional view of the n-channel MISFET formation region 1A in FIG. 1 described above roughly corresponds to a cross-sectional view at a position along the line A1-A1 of FIG. 24. When the gate electrode GE shown in FIG. 24 is the gate electrode GE2, a cross-sectional view of the p-channel MISFET formation region 1B in FIG. 1 described above roughly corresponds to a cross-sectional view at the position along the line A1-A1 of FIG. 24. A gate width is shown by the reference numeral W1 in FIG. 24. A gate length is shown by the reference numeral W2 in FIG. 24. In FIG. 24, the periphery of the source/drain regions SD is surrounded by the isolation region 2. The gate width W1 can also be regarded as a channel width.

The influence given to the characteristics of a MISFET by the phenomenon of the increased thickness of the gate insulating film resulting from oxygen diffusion described above is particularly remarkable when the gate width W1 is not more than 1 μm (W1≤1 μm is satisfied). The reason for this is as follows. When the gate width W1 is large, oxygen (O) is diffused from the isolation region 2 (silicon oxide film forming the isolation region 2) into the gate insulating film to increase the thickness of the gate insulating film in an area close to the isolation region 2 but, in an area sufficiently away from the isolation region 2, the thickness of the gate insulating film barely changes. In addition, the area where the thickness of the gate insulating film has increased is limited relative to the entire gate insulating film, and the influence thereof is relatively small. That is, when the gate width W1 is large, if oxygen (O) is diffused from the isolation region 2 (silicon oxide film forming the isolation region 2) into the gate insulating film, in areas 21a and 21b close (adjacent) to the isolation region 2, the thickness of the gate insulating film considerably increases. By contrast, in an area (distant from the isolation region 2) 21c located at substantially the middle in the direction of the gate width W1, the thickness of the gate insulating film barely changes. However, when the gate width W1 decreases, if oxygen (O) is diffused from the isolation region 2 (silicon oxide film forming the isolation region 2) into the gate insulating film to increase the thickness of the gate insulating film, the ratio of the area where the thickness of the gate insulating film has increased to the entire gate insulating film increases so that the influence given to the characteristics of the MISFET increases. That is, when the gate width W1 is small, if oxygen (O) is diffused from the isolation region 2 (silicon oxide film forming the isolation region 2) into the gate insulating film, the thickness of the gate insulating film considerably increases not only in the areas 21a and 21b, but also in the area 21c.

As a result of conducting study, the present inventors have found that, when the gate width W1 is larger than 1 μm (W1>1 μm is satisfied), even if the phenomenon of the increased thickness of the gate insulating film resulting from oxygen diffusion occurs, the influence given thereby to the characteristics of the MISFET is small but, when the gate width W1 is not more than 1 μm (W1≤1 μm is satisfied), if the phenomenon of the increased thickness of the gate insulating film resulting from oxygen diffusion occurs, the influence given thereby to the characteristics of the MISFET considerably increases. By contrast, in the present embodiment, the gate insulating film is improved as described above (the HfSiON film is used) to be able to inhibit or prevent the phenomenon of the increased thickness of the gate insulating film resulting from the diffusion of oxygen (O) from the isolation region 2 (silicon oxide film forming the isolation region 2) not only in the areas 21a and 21b, but also in the area 21c. Accordingly, in the present embodiment, even when the gate width W1 is reduced to be not more than 1 μm (W1≤1 μm is satisfied), it is possible to inhibit or prevent the phenomenon of the increased thickness of the gate insulating film resulting from oxygen diffusion described above irrespective of the dimension of the gate width W1. Therefore, the present embodiment achieves a large effect if applied to a semiconductor device having a MISFET in which the gate width W1 is not more than 1 μm (W1≤1 μm is satisfied).

Figure 25:
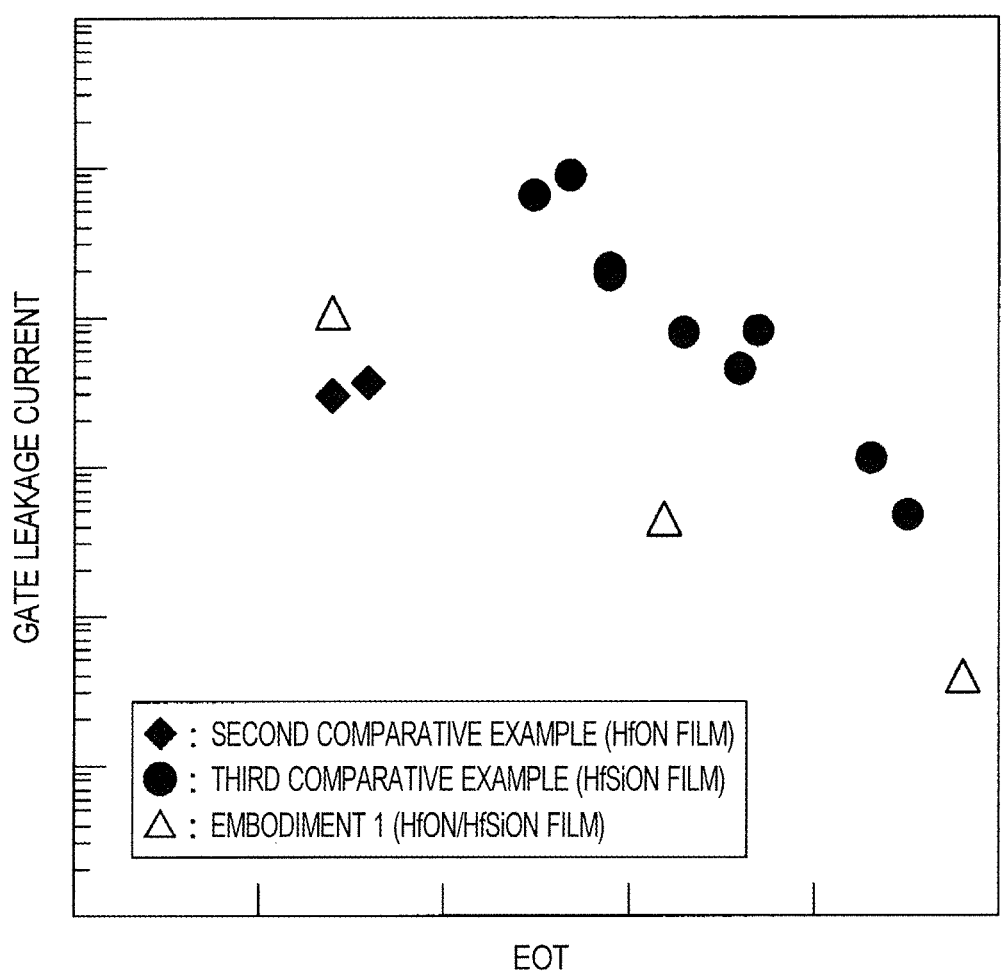
FIG. 25 is a graph showing an example of the correlation between the EOT of a gate insulating film and a gate leakage current.
Figure 26:
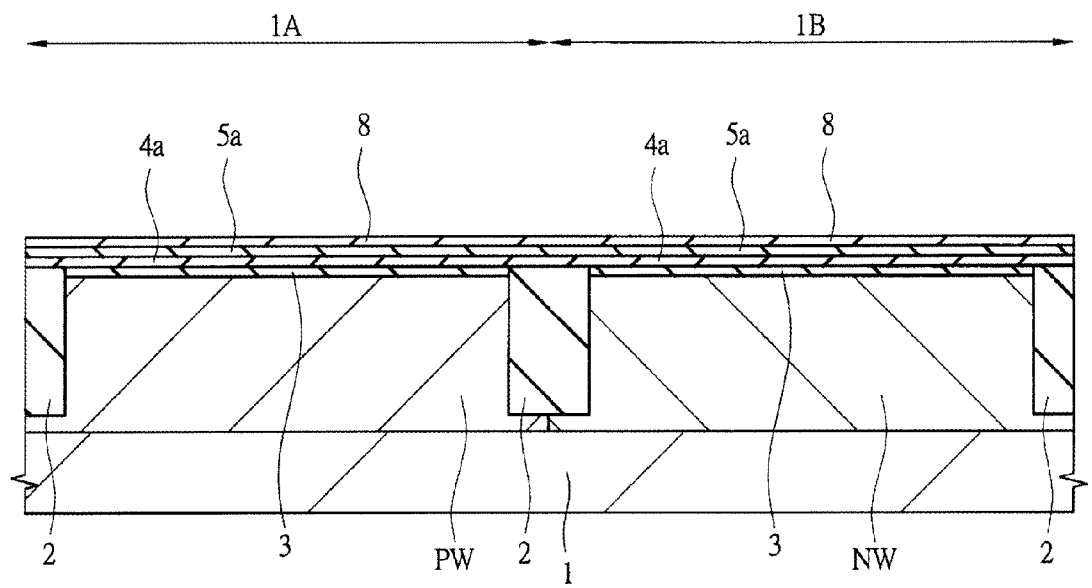
FIG. 26 is a main-portion cross-sectional view of a semiconductor device as another embodiment of the present invention during the manufacturing steps thereof.
Figure 27:
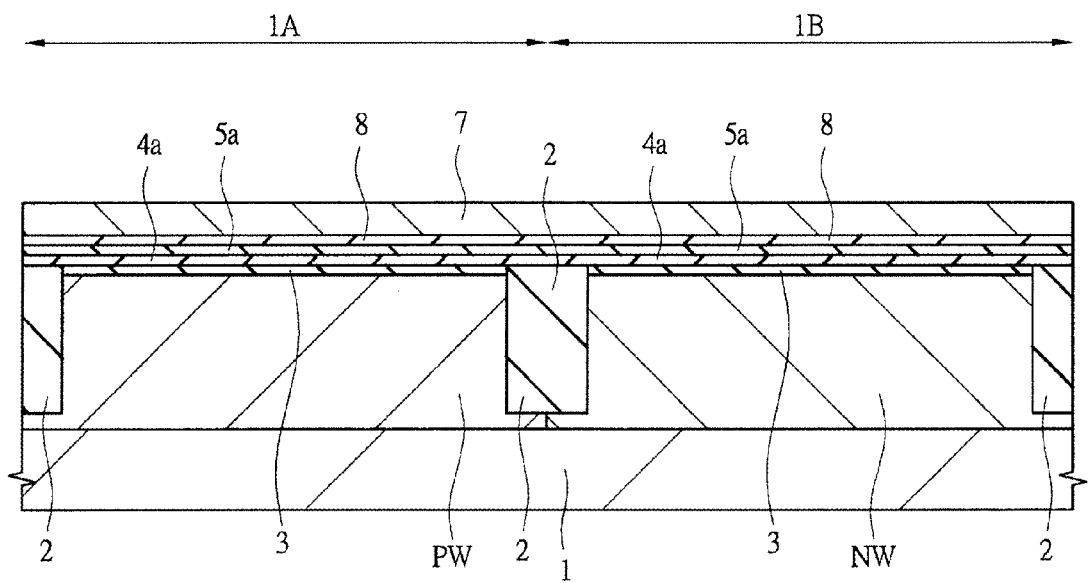
FIG. 27 is a main-portion cross-sectional view of the semiconductor device during the manufacturing steps thereof, which is subsequent to FIG. 26.

FIG. 25 is a graph (illustrative view) showing an example of the correlation between the EOT (Equivalent Oxide Thickness) of a gate insulating film and a gate leakage current. The abscissa axis of the graph of FIG. 25 corresponds to the EOT of the gate insulating film, and the ordinate axis of the graph of FIG. 25 corresponds to the gate leakage current. The graph of FIG. 25 shows the case of the second comparative example using the single-layer HfON film as the Hf-based insulating film for the gate insulating film, the case of the third comparative example using the single-layer HfSiON film as the Hf-based insulating film for the gate insulating film, and the case of the present embodiment using the laminate film including the HfON film 4a and the HfSiON film 51a stacked thereover as the Hf-based insulating film for the gate insulating film.

As can be also seen from the graph of FIG. 25, in the case of the third comparative example using the single-layer HfSiON film as the Hf-based insulating film for the gate insulating film, compared to the case of the second comparative example using the single-layer HfON film as the Hf-based insulating film for the gate insulating film and the case of the present embodiment using the laminate film including the HfON film 4a and the HfSiON film 5a stacked thereover as the Hf-based insulating film for the gate insulating film, the gate leakage current increases when the EOT is equal. The conceivable reason for the increased gate leakage current is that, in the case of the third comparative example, compared to the case of the second comparative example and the case of the present embodiment, the dielectric constant of the gate insulating film is reduced and therefore the physical thickness of the gate insulating film is reduced when the EOT is equal.

By contrast, in the present embodiment, as the Hf-based insulating film for the gate insulating film, not the single-layer HfSiON film, but the laminate film including the HfON film 4a and the HfSiON film 5a stacked thereover is used to be able to ensure a high dielectric constant to the gate insulating film. As a result, the physical thickness of the gate insulating film can be increased when the EOT is equal to allow the gate leakage current to be suppressed.

In the case of the second comparative example using the single-layer HfON film as the Hf-based insulating film for the gate insulating film, a high dielectric constant can be ensured for the gate insulating film. As a result, the physical thickness of the gate insulating film can be increased when the EOT is equal. Therefore, as can be also seen from the graph of FIG. 25, the gate leakage current can be suppressed. However, in the case of the second comparative example, the phenomenon of the increased thickness of the gate insulating film resulting from oxygen diffusion described above may occur to possibly degrade the driving force of the transistor. Also, in the case of the second comparative example, nitrogen (N) in the metal nitride film forming the metal gate electrode may be diffused toward the semiconductor substrate 1 (to the vicinity of the interface between the semiconductor substrate 1 and the interfacial layer 3) to possibly cause the deterioration of the NBTI (a change in threshold voltage due to the NBTI).

By contrast, in the present embodiment, as described above, it is possible to inhibit or prevent the phenomenon of the increased thickness of the gate insulating film resulting from the diffusion of oxygen (O) from the isolation region 2.

It is also possible to inhibit or prevent the deterioration of the NBTI (a change in threshold voltage due to the NBTI) resulting from the diffusion of nitrogen (N) from the metal nitride film forming the metal gate electrode. This allows an improvement in the characteristics (performance) of the transistor.

When the reaction between the HfON film 4a and the HfSiON film 5a (mixture, mixing, or interdiffusion) is small, in the manufactured semiconductor device, it may also be possible that each of the Hf-based gate insulating films (Hf-containing insulating films GI1 and GI2) has the laminate film including the HfON film 4a and the HfSiON film 5a located over the HfON film 4a (when the laminate structure of the HfON film 4a and the HfSiON film 5a stacked thereover is maintained without change). This similarly applies also to Embodiments 2 to 4 shown below.

(Embodiment 2)

In Embodiment 1 of the present invention described above, the description has been given to the manufacturing steps (manufacturing steps described with reference to FIGS. 9 to 14) when the mask layer 7 is selectively provided in the p-channel MISFET formation region 1B to prevent a reaction between the rare-earth-element-containing film 8 and each of the HfON film 4a and the HfSiON film 5a in the n-channel MISFET formation region 1B.

In the present embodiment, as a modification of Embodiment 1 described above, a description will be given to the manufacturing steps when the mask layer 7 is selectively provided in the n-channel MISFET formation region 1A to prevent a reaction between the Al-containing film 6 and each of the HfON film 4a and the HfSiON film 5a in the n-channel MISFET formation region 1A with reference to FIGS. 26 to 31. Note that the description will be given mainly to differences with the manufacturing steps of Embodiment 1 described above with reference to FIGS. 9 to 14 mentioned above. FIGS. 26 to 31 are main-portion cross-sectional views of a semiconductor device of Embodiment 2 of the present invention during the manufacturing steps thereof.

The manufacturing steps in the process flow of FIG. 2 described above are performed in the same manner as in Embodiment 1 described above up to the nitridation treatment (the step of forming the HfON film 4a and the HfSiON film 5a) in Step S7. Then, in the present embodiment, in Step S8 described above, the rare-earth-element-containing film 8 is formed over the HfSiON film 5a instead of the Al-containing film 6 (See FIG. 26) and, in Step S9 described above, the mask layer 7 is formed over the rare-earth-element-containing film 8 (See FIG. 27).

Figure 28:
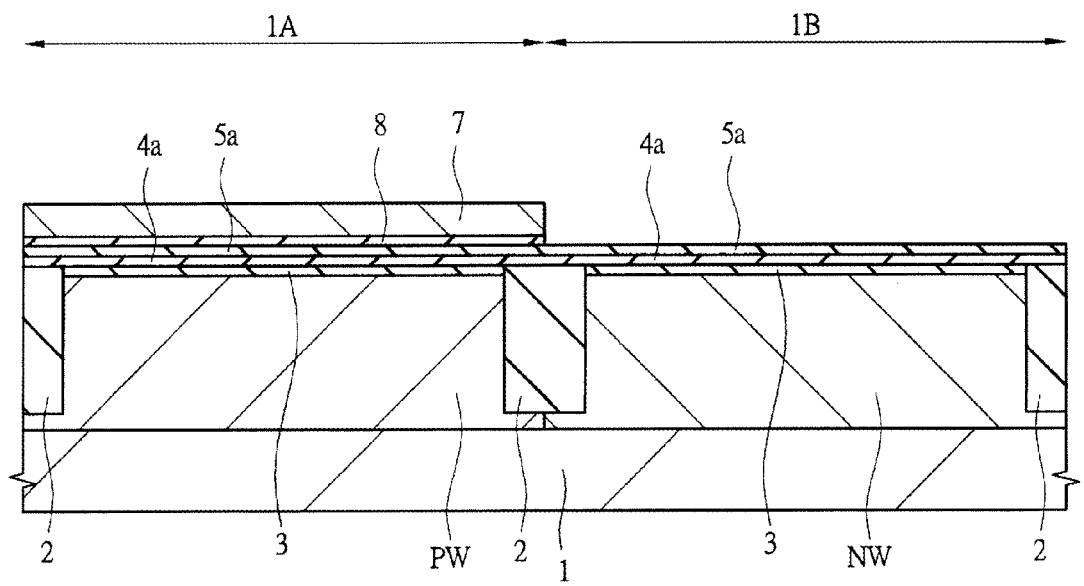
FIG. 28 is a main-portion cross-sectional view of the semiconductor device during the manufacturing steps thereof, which is subsequent to FIG. 27.
Figure 29:
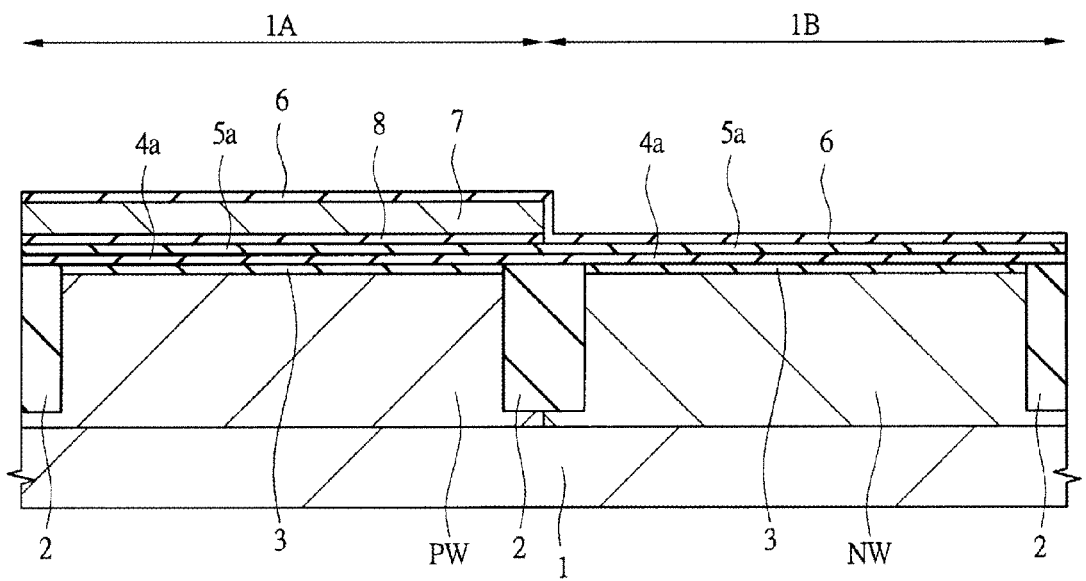
FIG. 29 is a main-portion cross-sectional view of the semiconductor device during the manufacturing steps thereof, which is subsequent to FIG. 28.

Then, in Step S10 described above, the mask layer 7 and the rare-earth-element-containing film 8 in the p-channel MISFET formation region 1B are removed, while the mask layer 7 and the rare-earth-element-containing film 8 in the n-channel MISFET formation region 1A are left (See FIG. 28).

Then, in Step S11 described above, the Al-containing film 6 is formed instead of the rare-earth-element-containing film 8. That is, over the mask layer 7 in the n-channel MISFET formation region 1A and over the HfSiON film 5a in the p-channel MISFET formation region 1B, the Al-containing film 6 is formed (See FIG. 29). At this stage, the state is achieved in which, in the n-channel MISFET formation region 1A, the interfacial layer 3, the HfON film 4a, the HfSiON film 5a, the raze-earth-element-containing film 8, the mask layer 7, and the Al-containing film 6 are successively stacked in ascending order over the p-type well PW and, in the p-channel MISFET formation region 1B, the interfacial layer 3, the HfON film 4a, the HfSiON film 5a, and the Al-containing film 6 are successively stacked in ascending order over the n-type well NW.

Figure 30:
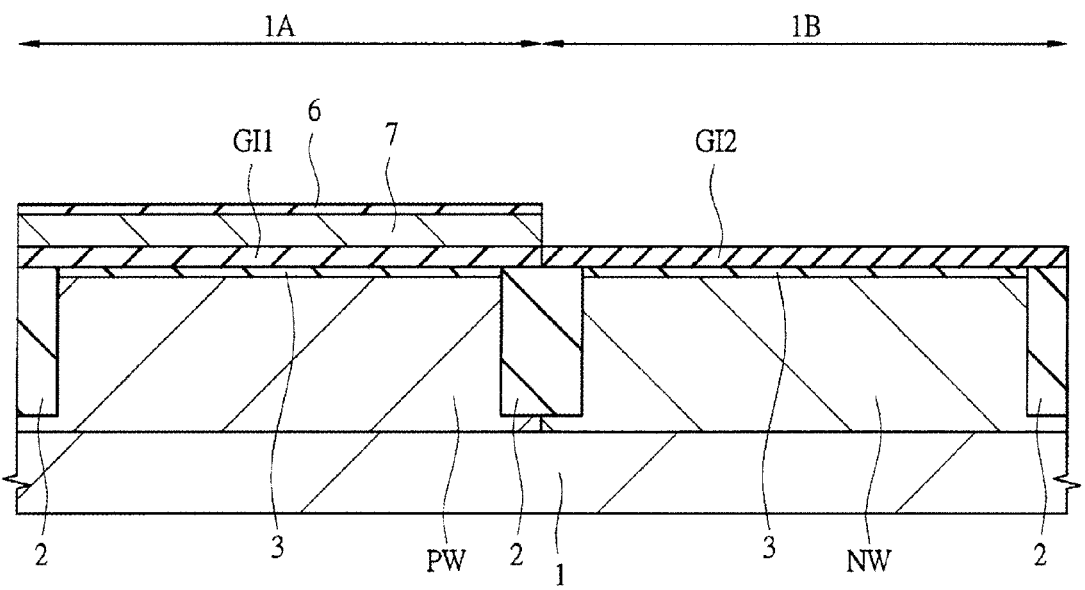
FIG. 30 is a main-portion cross-sectional view of the semiconductor device during the manufacturing steps thereof, which is subsequent to FIG. 29.
Figure 31:
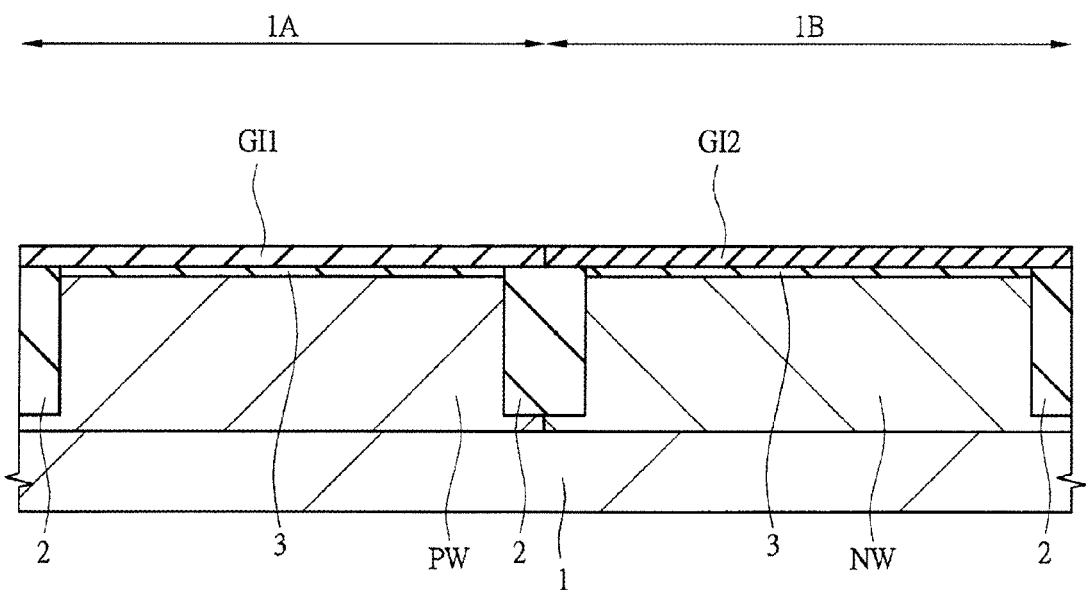
FIG. 31 is a main-portion cross-sectional view of the semiconductor device during the manufacturing steps thereof, which is subsequent to FIG. 30.

Then, by the heat treatment in Step S12 described above, a reaction (mixture, mixing, or interdiffusion) is caused between each of the HfON film 4a and the HfSiON film 5a and the rare-earth-element-containing film 8 in the n-channel MISFET formation region 1A to form the Hf-containing insulating film GI1 which is the reaction layer therebetween and a reaction (mixture, mixing, or interdiffusion) is caused between each of the HfON film 4a and the HfSiON film 5a and the Al-containing film 6 in the p-channel MISFET formation region 1B to form the Hf-containing insulating film GI2 which is the reaction layer therebetween (See FIG. 30). At this time, the mask layer 7 is interposed between the Al-containing film 6 and the HfSiON film 5a in the n-channel MISFET formation region 1A to function to prevent the Al-containing film 6 in the n-channel MISFET formation region 1A from reacting with the HfSiON film 5a and the HfON film 4. Thereafter, in Step S13 described above, the Al-containing film 6 over the mask layer 7 is removed and the mask layer 7 is further removed (See FIG. 31). By the steps performed heretofore, the structure of FIG. 31 which is the same structure as in FIG. 14 described above is obtained.

The subsequent steps are the same as in Embodiment 1 described above so that the illustration and description thereof is omitted here. That is, the step of forming the metal film 9 in Step S14 described above and the subsequent steps are performed in the same manner as in Embodiment 1 described above. The configuration of the semiconductor device thus manufactured is the same as in FIG. 1 described above.

In the present embodiment also, substantially the same effects as obtained in Embodiment 1 described above can be obtained.

(Embodiment 3)

In each of Embodiments 1 and 2 described above, a rare earth element is introduced into the Hf-containing insulating film GI1 serving as the gate insulating film of the n-channel MISFET and aluminum (Al) is introduced into the Hf-containing insulating film GI2 serving as the gate insulating film of the p-channel MISFET to achieve reductions in the thresholds of the n-channel MISFET and the p-channel MISFET.

In the present embodiment, as another modification of Embodiment 1 described above, a description will be given to the manufacturing steps when neither rare earth element nor aluminum (Al) is introduced into the Hf-containing insulating film GI1 serving as the gate insulating film of the n-channel MISFET and the Hf-containing insulating film GI2 serving as the gate insulating film of the p-channel MISFET with reference to FIGS. 32 to 35. Note that the description will be given mainly to differences with the manufacturing steps of Embodiment 1 described above. FIGS. 32 to 35 are main-portion cross-sectional views of a semiconductor device of Embodiment 3 of the present invention during the manufacturing steps thereof.

Figure 32:
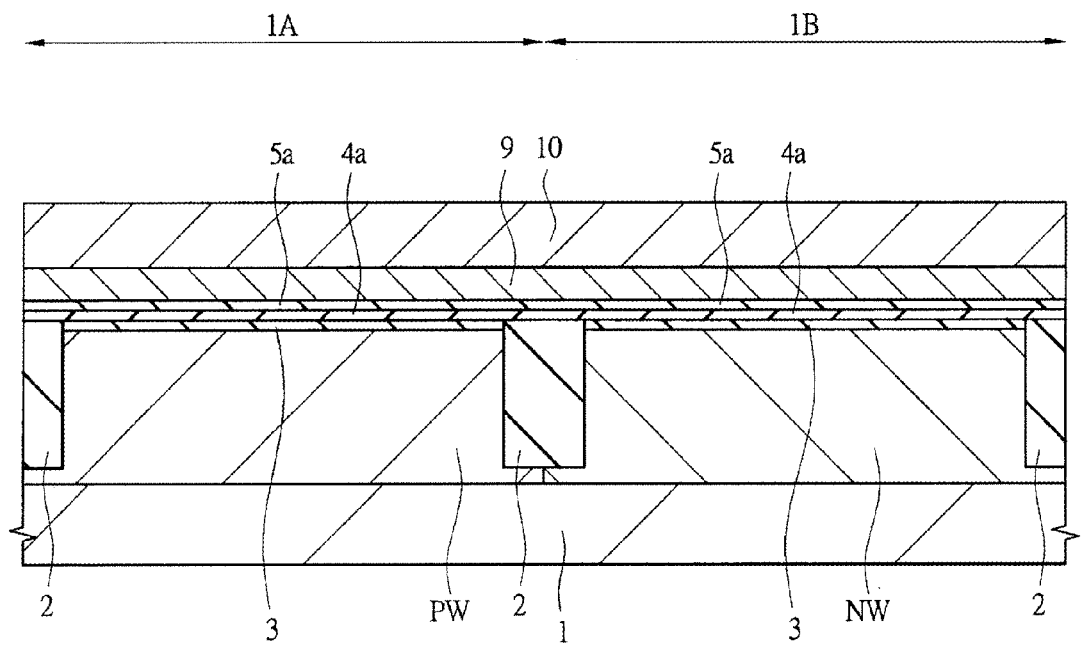
FIG. 32 is a main-portion cross-sectional view of a semiconductor device as still another embodiment of the present invention during the manufacturing steps thereof.

The manufacturing steps in the process flow of FIG. 2 described above are performed in the same manner as in Embodiment 1 described above up to the nitridation treatment (the step of forming the HfON film 4a and the HfSiON film 5a) in Step S7 to provide the structure of FIG. 8 described above. Then, in the present embodiment, the step of forming the metal film 9 in Step S14 and the step of forming the silicon film 1G in Step S15 each described above are formed without performing Steps S8 (step of forming the Al-containing film 6) to S13 (step of removing the rare-earth-element-containing film 8 and the mask layer 7). As a result, as shown in FIG. 32, the metal film 9 is formed over the HfSiON film 5a and the silicon film 10 is formed over the metal film 9. At this stage, the state is achieved in which, in each of the n-channel MISFET formation region 1A and the p-type MISFET formation region 1B, the interfacial layer 3, the HfON film 4a, the HfSiON film 5a, the metal film 9, and the silicon film 10 are successively stacked in ascending order over the semiconductor substrate 1 (each of the p-type well PW and the n-type well NW).

Figure 33:
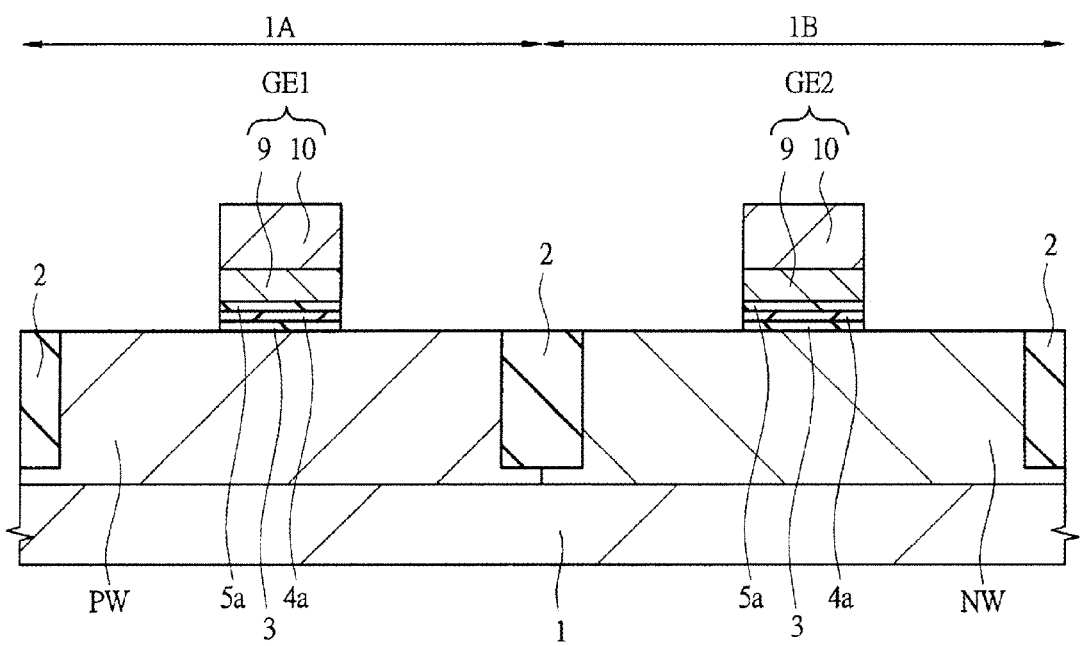
FIG. 33 is a main-portion cross-sectional view of the semiconductor device during the manufacturing steps thereof, which is subsequent to FIG. 32.

Then, the step of patterning the laminate film including the silicon film 10 and the metal film 9 in Step S16 described above is performed to form the gate electrodes GE1 and GE2 each including the metal film 9 and the silicon film 10 stacked over the metal film 9, as shown in FIG. 33. The portions of HfON film 4a and the HfSiON film 5a uncovered with the gate electrodes GE1 and GE2 are removed by dry etching when the silicon film 10 and the metal film 9 are patterned in Step S16 and by the subsequent wet etching. On the other hand, the HfON film 4a and the HfSiON film 5a which are located under the gate electrodes GE1 and GE2 remain without being removed by the dry etching in Step S16 and by the subsequent wet etching. That is, in Embodiment 1 described above, at the stage at which the gate electrodes GE1 and GE2 are formed in Step S16, the Hf-containing insulating film GI1 remains under the gate electrode GE1 and the Hf-containing insulating film GI2 remains under the gate electrode GE2. By contrast, in Embodiment 3, at the stage at which the gate electrodes GE1 and GE2 are formed in Step S16, the laminate film including the HfON film 4a and the HfSiON film 5a stacked thereover remains under each of the gate electrodes GE1 and GE2.

Figure 34:
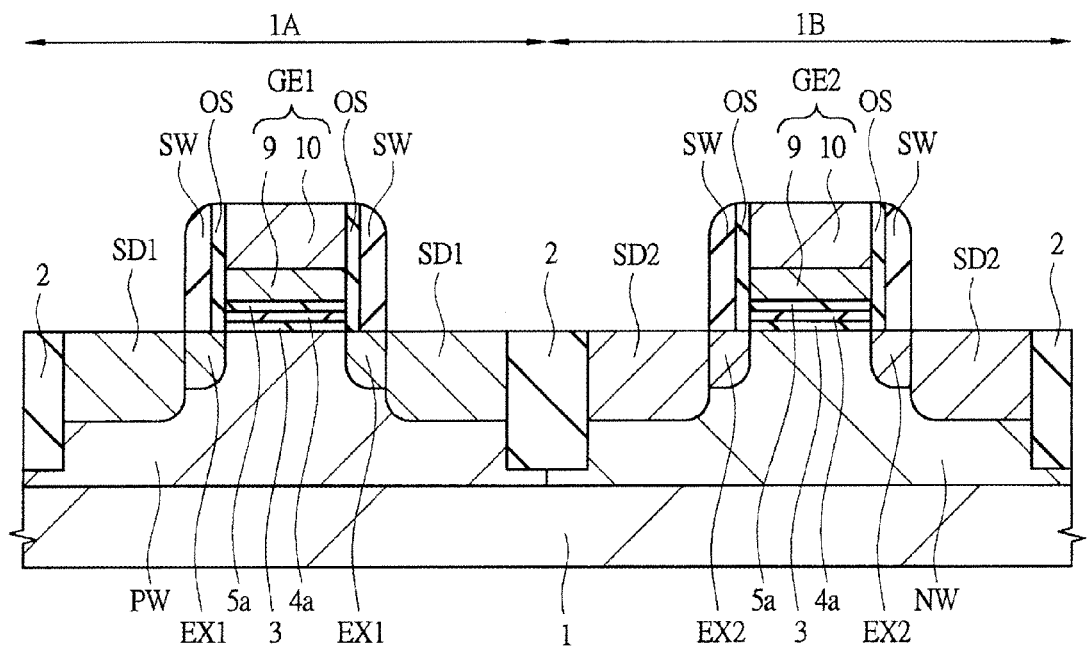
FIG. 34 is a main-portion cross-sectional view of the semiconductor device during the manufacturing steps thereof, which is subsequent to FIG. 33.

Then, in the same manner as in Embodiment 1 described above, Steps S17, S18, S19, and S20 described above are performed to form the offset spacers OS1, the n⁻-type semiconductor regions EX1, the offset spacers OS2 and the p⁻-type semiconductor regions EX2, Step S21 described above is performed to form the sidewall spacers SW, and Step S22 described above is performed to form the n⁺-type semiconductor regions SD1 and the p⁺-type semiconductor regions SD2, thereby providing the structure of FIG. 34. In FIG. 34, the offset spacers OS comprised of laminates (laminate films) including the offset spacers OS1 and the offset spacers OS2 are shown. At the stage at which Step S22 is performed, in Embodiment 3, the state is achieved in which, between each of the gate electrodes GE1 and GE2 and the semiconductor substrate 1 (p-type well PW and n-type well NW), a laminate film including the interfacial layer 3, the HfON film 4a stacked over the interfacial layer 3, and the HfSiON film 5a over the HfON film 4a is formed.

Figure 35:
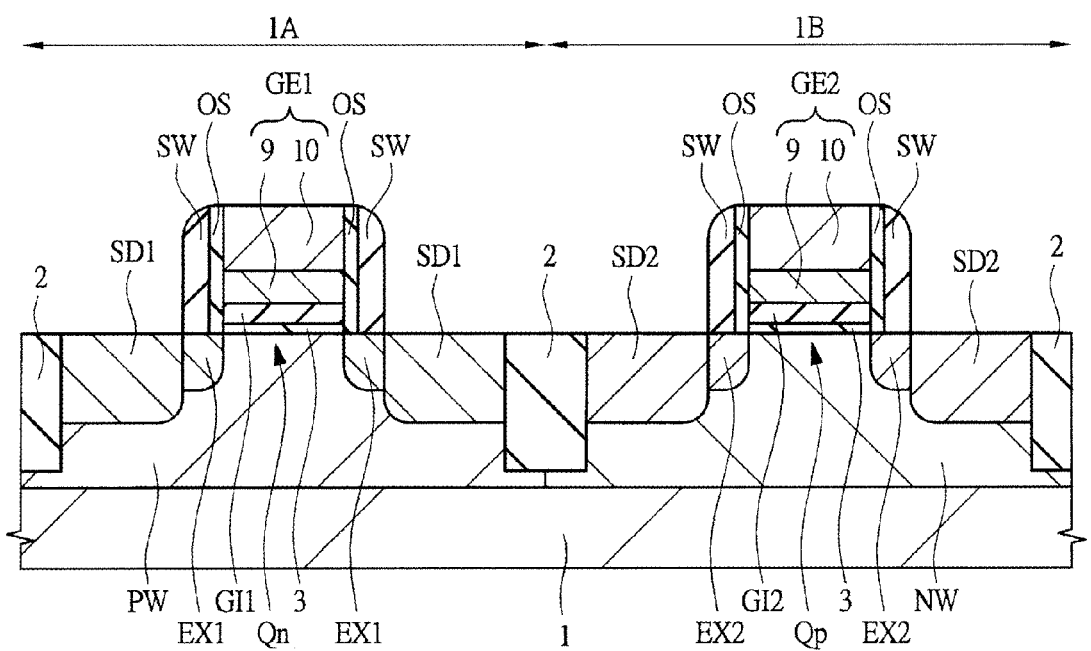
FIG. 35 is a main-portion cross-sectional view of the semiconductor device during the manufacturing steps thereof, which is subsequent to FIG. 34.

Then, the heat treatment (activation anneal) in Step S23 described above is performed. By the heat treatment in Step S23, in the present embodiment also, in the same manner as in Embodiment 1 described above, the impurities introduced into the n⁻-type semiconductor regions EX1, the p⁻-type semiconductor regions EX2, the n⁺-type semiconductor regions SD1, and the p⁺-type semiconductor regions SD2 in the ion implantations in Steps S18, S20, and S22 can be activated. Further, in the present embodiment, the heat treatment in Step S23 causes a reaction (mixture, mixing, or interdiffusion) between the HfON film 4a and the HfSiON film 5a to form the Hf-containing insulating films GI1 and GI2 each as the reaction layer (mixture layer or mixing layer) between the HfON film 4a and the HfSiON film 5a, as shown in FIG. 35. That is, by the heat treatment in Step S23, in the n-channel MISFET formation region 1A, the HfON film 4a and the HfSiON film 5a react with each other to form the Hf-containing insulating film GI1 and, in the p-channel MISFET formation region 1B, the HfON film 4a and the HfSiON film 5a react with each other to form the Hf-containing insulating film GI2. As a result, the Hf-containing insulating film GI1 is formed under the gate electrode GE1 and the Hf-containing insulating film GI2 is formed under the gate electrode GE2.

Thus, the structure of FIG. 35 corresponding to FIG. 20 described above is obtained. However, the Hf-containing insulating film GI1 and GI2 formed in the present embodiment are different from the Hf-containing insulating films GI1 and GI2 in Embodiment 1 described above in the following points. That is, in Embodiment 1 described above, the Hf-containing insulating film GI1 contains a rare earth element but, in the present embodiment, the Hf-containing insulating film GI1 does not contain a rare earth element. Also, in Embodiment 1 described above, the Hf-containing insulating film GI2 contains aluminum (Al) but, in the present embodiment, the Hf-containing insulating film GI2 does not contain aluminum (Al). The structure of FIG. 35 is basically the same as the structure of FIG. 20 described above except that the Hf-containing insulating films GI1 and GI2 do not contain a rare earth element and aluminum (Al).

The subsequent steps are the same as in Embodiment 1 described above so that the illustration and description thereof is omitted here. That is, the steps described above with reference to FIGS. 21 and 22 are performed in the same manner as in Embodiment 1 described above.

In the present embodiment, a rare earth element is not introduced into the Hf-containing insulating film GI1 functioning as the gate insulating film of the n-channel MISFET and aluminum (Al) is not introduced into the Hf-containing insulating film GI2 functioning as the gate insulating film of the p-channel MISFET. Accordingly, compared to the case of Embodiment 1 described above, in the case of the present embodiment, the threshold voltages (the absolute values thereof) of the n-channel MISFET and the p-channel MISFET are increased.

However, in the same manner as in Embodiment 1 described above, in the present embodiment also, the laminate film (laminate structure) including the HfON film 4a and the HfSiON film 5a stacked thereover is used in the formation of the Hf-based gate insulating films (Hf-containing insulating films GI1 and GI2), though a rare earth element and aluminum (Al) are not introduced into the Hf-based gate insulating films. Accordingly, in the same manner as in Embodiment 1 described above, in the present embodiment also, in the formed Hf-based gate insulating films (which are the Hf-containing insulating films GI1 and GI2 here), the Si concentrations can be increased to be higher in the upper parts thereof (closer to the gate electrodes GE1 and GE2) than in the lower parts thereof (closer to the semiconductor substrate 1). That is, since the HfSiON film 5a is formed over the HfON film 4a, the Si concentrations in the Hf-based gate insulating films (Hf-containing insulating films GI1 and GI2) are easy to increase in the vicinities of the interfaces between the gate electrodes GE1 and GE2 and the Hf-based gate insulating films (Hf-containing insulating films GI1 and GI2) and the diffusion barrier function against nitrogen (N) is easy to enhance in the portions (interfacial portions) in contact with the gate electrodes GE1 and GE2. Therefore, it is possible to more reliably prevent nitrogen (N) in the metal films 9 of the gate electrodes GE1 and GE2 from being diffused toward the semiconductor substrate 1 (to the vicinity of the interface between the semiconductor substrate 1 and the interfacial layer 3). As a result, it is possible to more reliably inhibit or prevent the occurrence of the deterioration of the NBTI (a change in threshold voltage due to the NBTI).

Thus, in the present embodiment also, when the Si concentrations in the entire Hf-based gate insulating films (Hf-containing insulating films GI1 and GI2) are increased, the dielectric constants of the Hf-based gate insulating films decrease. Accordingly, the Si concentrations are increased in regions which are most effective in preventing the diffusion of nitrogen (N) in the metal film 9 of the gate electrode GEL or GE2 toward the semiconductor substrate 1, while the Si concentrations are reduced in the other regions (i.e., under the Hf-based gate insulating films). This is achieved by using the laminate film (laminate structure) including the HfON film 4*a* and the HfSiON film 5*a* stacked thereover in the formation of the Hf-based high-dielectric-constant gate insulating films (Hf-containing insulating films GI1 and GI2). Thus, It is possible to increase the dielectric constants of the Hf-based gate insulating films and also prevent the deterioration of the NBTI (a change in threshold voltage due to the NBTI) resulting from the diffusion of nitrogen (N) from the metal gate electrodes.

In the present embodiment also, the HfSiON film 5*a* is used in the formation of the Hf-based gate insulating films so that N (nitrogen) and Si (silicon) are contained in the Hf-based gate insulating films (Hf-containing insulating films GI1 and GI2). Consequently, the Hf-based gate insulating films (Hf-containing insulating films GI1 and GI2) are less likely to be crystallized (are amorphous films) and therefore less likely to transmit oxygen (O). As a result, the phenomenon of the increased thickness of the gate insulating film resulting from oxygen diffusion described above is less likely to occur, and the degradation of the driving forces of transistors can be prevented.

In the present embodiment also, in the formation of the Hf-based gate insulating films, the single-layer HfSiON film containing Si is not used, but the laminate film including the HfON film 4*a* not containing Si and the HfSiON film 5*a* containing Si is used. Accordingly, compared to the third comparative example using the single-layer HfSiON film (or the single-layer HfSiO film) containing Si, the dielectric constant of each of the Hf-based gate insulating films can be increased and, when the EOT is controlled to be equal, the physical thickness of each of the Hf-containing gate insulating films (Hf-containing insulating films GI1 and GI2) can be increased. Therefore, gate leakage currents can be suppressed.

(Embodiment 4)

Each of Embodiments 1 to 3 described above uses a process (so-called gate first process) in which gate electrodes are formed first, and then source/drain regions are formed).

In the present embodiment, as a modification of each of Embodiments 1 to 3 described above, a description will be given to manufacturing steps when a process (so-called gate last process) in which source/drain regions are formed first, and then gate electrodes are formed is used appropriately with reference to FIGS. 36 to 43. Note that the "gate last process" mentioned in the present embodiment refers to a method which performs the formation of the main components of a real gate stack after the activation heat treatment of the source/drain regions. Among gate last methods, a method which performs the formation of an interfacial gate insulating film (interfacial real gate insulating film) and a High-k gate insulating film (real gate insulating film) prior to the activation heat treatment of the source/drain regions and performs the formation of the main components of a real gate stack in layers located thereover after the activation heat treatment of the source/drain regions is referred to as a "High-k first/metal gate last process". FIGS. 36 to 43 are main-portion cross-sectional views of a semiconductor device of Embodiment 4 of the present invention during the manufacturing steps thereof.

First, the manufacturing steps prior to and including Step S23 (heat treatment step for activating the impurities) in FIG. 3 described above are performed in the same manner as in any of Embodiments 1, 2, and 3 described above to provide the structure of FIG. 20 described above. However, in the present embodiment, the gate electrodes GE1 and GE2 are dummy gate electrodes (fake gate electrodes) and removed later. Accordingly, in the present embodiment, at this stage (stage in FIG. 20), the n-channel MISFET Qn and the p-channel MISFET Qp are not completed.

Figure 36:
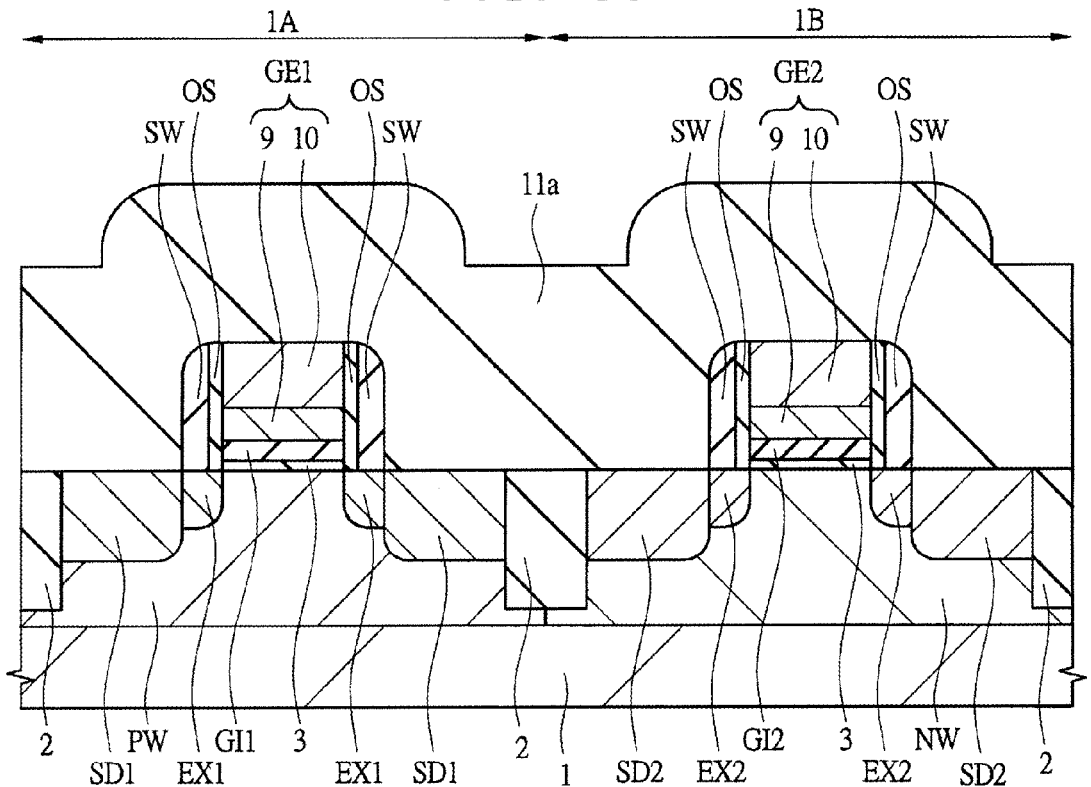
FIG. 36 is a main-portion cross-sectional view of a semiconductor device as yet another embodiment of the present invention during the manufacturing steps thereof.

Next, as shown in FIG. 36, over the main surface of the semiconductor substrate 1, an insulating film (interlayer insulating film) 11*a* is formed so as to cover the gate electrodes GE1 and GE2, the offset spacers OS, and the sidewall spacers SW. The insulating film 11*a* is comprised of, e.g., a single-layer silicon oxide film, a laminate film including a thin silicon nitride film and a thick silicon oxide film stacked thereover, or the like and can be formed by, e.g., a CVD method. Similarly to the foregoing insulating film 11, the insulating film 11*a* is formed so as to cover the gate electrodes GE1 and GE2 and the sidewall spacers SW and fill the space between the adjacent gate electrodes. Accordingly, the thickness of the insulating film 11*a* (thickness of the deposited insulating film 11*a*) is controlled to be preferably larger than the thickness (dimension in a direction perpendicular to the main surface of the semiconductor substrate 1) of each of the gate electrodes GE1 and GE2.

Figure 37:
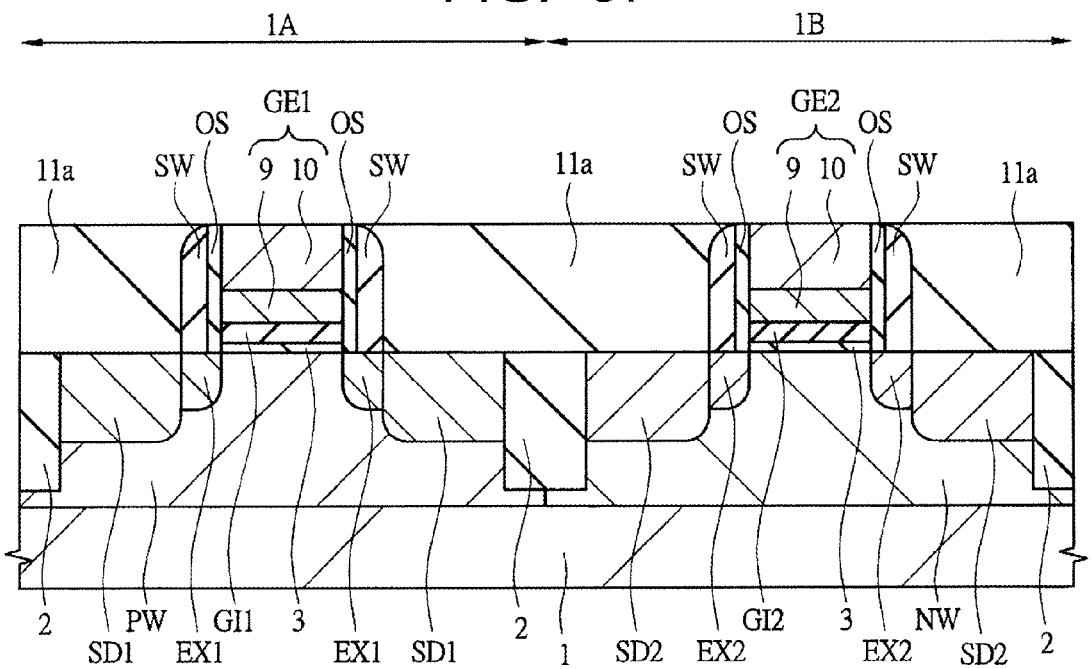
FIG. 37 is a main-portion cross-sectional view of the semiconductor device during the manufacturing steps thereof, which is subsequent to FIG. 36.

Next, as shown in FIG. 37, the surface (upper surface) of the insulating film 11 is polished by a CMP method or the like to expose the upper surfaces of the gate electrodes GE1 and GE2. The polishing step is treatment for planarizing the upper surface of the insulating film 11*a* and also exposing the upper surfaces of the gate electrodes GE1 and GE2. At the stage at which the polishing step is completed, the upper surface of the insulating film 11*a* and the upper surfaces of the gate electrodes GE1 and GE2 exposed from the insulating film 11*a* are in substantially the same plane (the same flat plane).

Figure 38:
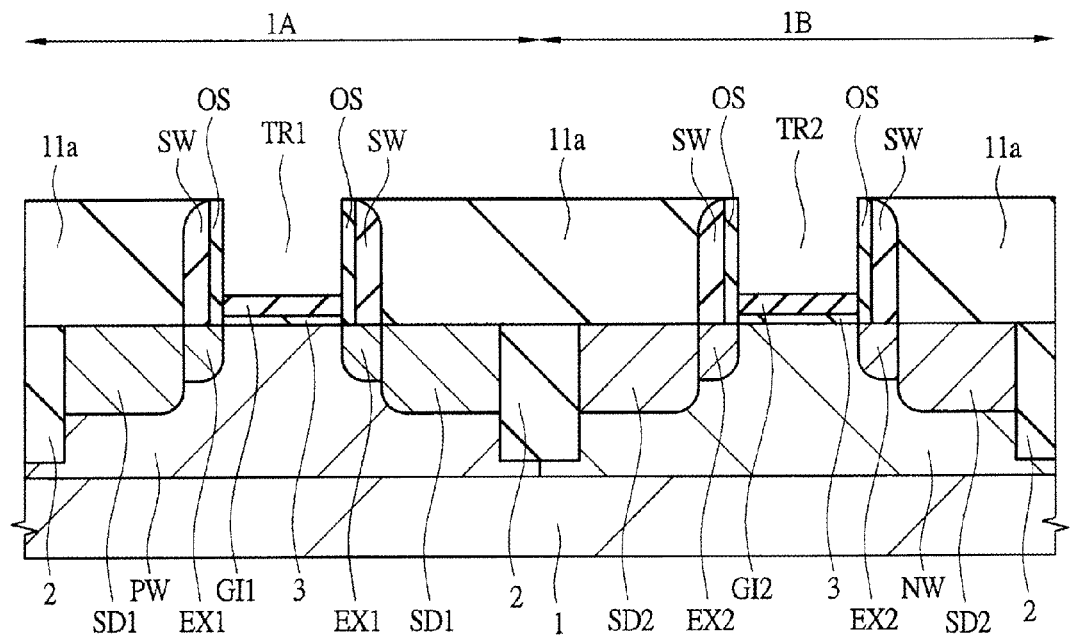
FIG. 38 is a main-portion cross-sectional view of the semiconductor device during the manufacturing steps thereof, which is subsequent to FIG. 37.

Next, as shown in FIG. 38, the gate electrodes GE1 and GE2 exposed from the insulating film 11*a* are removed by etching. At the time of etching, etching of the silicon film is performed first under etching conditions under which the insulating film 11*a*, the offset spacers OS (sidewall spacers SW), and the metal films 9 are less likely to be etched than the silicon film 10 to remove the silicon film 10 forming the gate electrodes GE1 and GE2 and expose the metal films 9. Then, etching of the metal films 9 is performed under etching conditions under which the insulating film 11*a*, the offset spacers OS (sidewall spacers SW), and the Hf-containing insulating films GI1 and GI2 are less likely to be etched than the metal films 9 to remove the metal films 9 forming the gate electrodes GE1 and GE2 and expose the Hf-containing insulating films GI1 and GI2. Thus, it is possible to etch away the gate electrodes GE1 and GE2 and also inhibit or prevent the insulating film 11*a*, the offset spacers OS (sidewall spacers SW), and the Hf-containing insulating films GI1 and GI2 from being etched. For the etching of the gate electrodes GE1 and GE2, dry etching, wet etching, or a combination thereof can be used.

By etching away the gate electrodes GE1 and GE2, the upper surfaces of the Hf-containing insulating films GI1 and GI2 and the inner walls (side walls) of the silicon-nitride-based offset spacers OS are exposed. That is, by removing the gate electrode GE1, a trench (depressed portion, opening, or recessed portion) TR1 is formed and, at the bottom portion of the trench TR1, the Hf-containing insulating film GI1 (the upper surface thereof) is exposed. Also, by removing the gate electrode GE2, a trench (depressed portion, opening, or recessed portion) TR2 is formed and, at the bottom portion of the trench TR2, the Hf-containing insulating film GI2 (the upper surface thereof) is exposed. The trench TR1 is comprised of a region (space) where the gate electrode GE1 had been present before the removal of the gate electrode GE1. The bottom surface of the trench TR1 is comprised of the upper surface of the Hf-containing insulating film GI1 and the side walls (side surfaces) of the trench TR1 are comprised of the inner walls (side walls) of the offset spacers OS. The trench TR2 is comprised of a region (space) where the gate electrode GE2 had been present before the removal of the gate electrode GE2. The bottom surface of the trench TR2 is comprised of the upper surface of the Hf-containing insulating film GI2 and the side walls (side surfaces) of the trench TR2 are comprised of the inner walls (side walls) of the offset spacers OS. Here, the inner walls (side walls) of the offset spacers OS correspond to the side walls of the offset spacers OS which had been in contact with the gate electrode GE1 or the gate electrode GE2 till the gate electrodes GE1 and GE2 were removed.

In the present embodiment, etching is terminated at the stage at which the gate electrodes GE1 and GE2 are removed and the Hf-containing insulating films GI1 and GI2 are exposed. Consequently, the Hf-containing insulating films GI1 and GI2 remain without being removed.

Unlike in Embodiments 1 to 3 described above, in the present embodiment, the gate electrodes GE1 and GE2 are the dummy gate electrodes and removed in the step of FIG. 38. Accordingly, each of the gate electrodes GE1 and GE2 need not have the laminate structure of the metal film 9 and the silicon film 10. It is also possible to, e.g., omit the step of forming the metal film in Step S14 described above and form each of the gate electrodes GE1 and GE2 of the single-layer silicon film 10. In this case, the step of removing the gate electrodes GE1 and GE2 is performed more easily.

Figure 39:
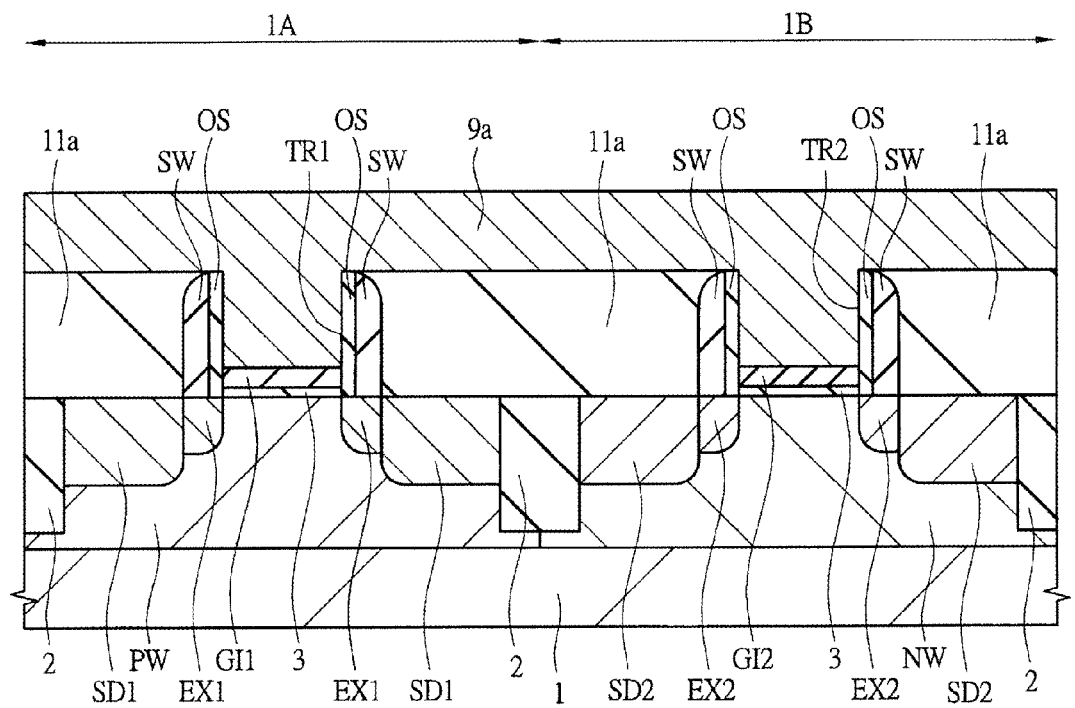
FIG. 39 is a main-portion cross-sectional view of the semiconductor device during the manufacturing steps thereof, which is subsequent to FIG. 38.

Next, as shown in FIG. 39, over the main surface of the semiconductor substrate 1, i.e., over the insulating film 11$a$ including the insides of the trenches TR1 and TR2, a metal film 9$a$ for the gate electrodes is formed. At this time, the metal film 9$a$ is formed over the insulating film 11$a$ so as to fill the trenches TR1 and TR2. The metal film 9$a$ can be made of the same material film as the foregoing metal film 9. A preferred material thereof is as described above with respect to the metal film 9 in Embodiment 1. The metal film 9$a$ can be formed by, e.g., a sputtering method or the like.

Figure 40:
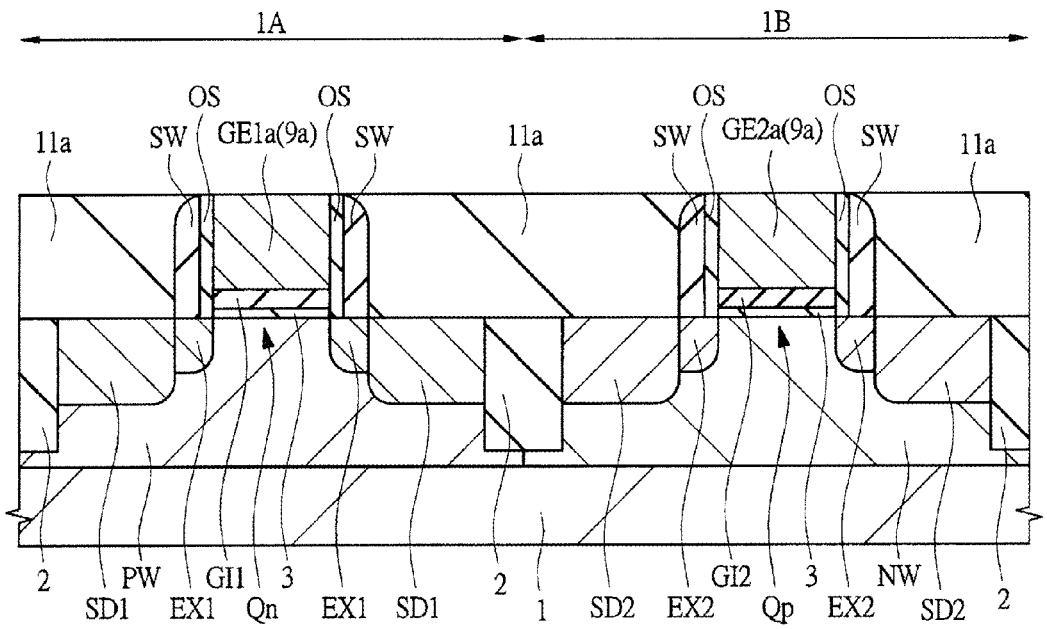
FIG. 40 is a main-portion cross-sectional view of the semiconductor device during the manufacturing steps thereof, which is subsequent to FIG. 39.

Next, as shown in FIG. 40, the metal film 9$a$ is left in each of the trenches TR1 and TR2, while the metal film 9$a$ outside the trenches TR1 and TR2 is removed by a CMP method or the like, thus forming gate electrodes GE1$a$ and GE2$a$. That is, the metal, film 9$a$ is polished till the upper surface of the insulating film 11$a$ is exposed to be thereby removed from outside the trenches TR1 and TR2 and left in each of the trenches TR1 and TR2 to form the gate electrodes GE1$a$ and GE2$a$. The gate electrode GE1$a$ is comprised of the metal film 9$a$ remaining in the trench TR1. The gate electrode GE2$a$ is comprised of the metal film 9$a$ remaining in the trench TR2. Under the gate electrode GE1$a$ embedded in the trench TR1, there is the Hf-containing insulating film GI1. Under the gate electrode GE2$a$ embedded in the trench TR2, there is the Hf-containing insulating film GI2.

The gate electrode GE1$a$ functions as the gate electrode (metal gate electrode) of the n-channel MISFET Qn, and the Hf-containing insulating film GI1 (and the interfacial layer 3 located thereunder) under the gate electrode GE1$a$ functions as the gate insulating film of the n-channel MISFET Qn. N-type semiconductor regions (impurity diffusion layers) each functioning as the source or drain of the n-channel MISFET Qn are formed of the n$^+$-type semiconductor regions SD1 and the n$^-$-type semiconductor regions EX1. The gate electrode GE2$a$ functions as the gate electrode (metal gate electrode) of the p-channel MISFET Qp, and the Hf-containing insulating film GI2 (and the interfacial layer 3 located thereunder) under the gate electrode GE2$a$ functions as the gate insulating film of the p-channel MISFET Qp. The p-type semiconductor regions (impurity diffusion layers) each functioning as the source or drain of the p-channel MISFET Qp are formed of the p$^+$-type semiconductor regions SD2 and the p$^-$-type semiconductor regions EX2. The gate electrodes GE1$a$ and GE2$a$ have the metal films (which are the metal films 9$a$ here) in contact with the gate insulating films, and are therefore so-called metal gate electrodes (metallic gate electrodes).

Thus, the n-channel MISFET Qn is formed in the n-channel MISFET formation region 1A and the p-channel MISFET Qp is formed in the p-channel MISFET formation region 1B.

In another form, it is also possible to use a laminate film including a metal film and a silicon film stacked thereover instead of the metal film 9$a$. In this case, the gate electrode GE1$a$ is formed of a metal film extending from the bottom portion (i.e., over the Hf-containing insulating film GI1) of the trench TR1 to the side walls thereof (i.e., the inner walls of the offset spacers OS) and a silicon film spaced apart from the Hf-containing insulating film GI1 and the offset spacers OS via the metal film. On the other hand, the gate electrode GE2$a$ is formed of a metal film extending from the bottom portion (i.e., over the Hf-containing insulating film GI2) of the trench TR2 to the side walls thereof (i.e., the inner walls of the offset spacers OS) and a silicon film spaced apart from the Hf-containing insulating film GI2 and the offset spacers OS via the metal film.

In still another form, it is also possible to remove the metal film 9$a$ from the p-channel MISFET formation region 1B after the formation of the metal film 9$a$, form another metal film over the main surface of the semiconductor substrate 1 so as to fill the trench TR2, and subsequently remove the metal film 9$a$ and the other metal film each outside the trenches TR1 and TR2 by a CMP method to form the gate electrodes GE1$a$ and GE2$a$. In this case, the gate electrode GE1$a$ is comprised of the metal film 9$a$ embedded in the trench TR1 and the gate electrode GE2$a$ is comprised of the foregoing other metal film embedded in the trench TR2. Therefore, it is possible to form the gate electrodes GE1$a$ and GE2$a$ of different metals. In yet another form, it is also possible to remove the metal film 9$a$ from the n-channel MISFET formation region 1A after the formation of the metal film 9$a$, then form another metal film over the main surface of the semiconductor substrate 1 so as to fill the trench TR1, and subsequently remove the metal film 9$a$ and the foregoing other metal film each outside the trenches TR1 and TR2 by a CMP method to form the gate electrodes GE1$a$ and GE2. In this case, the gate electrode GE1$a$ is comprised of the foregoing other metal film embedded in the trench TR1, while the gate electrode GE2$a$ is comprised of the metal film 9$a$ embedded in the trench TR2. Therefore, it is possible to form the gate electrodes GE1$a$ and GE2$a$ of different metals.

Figure 41:
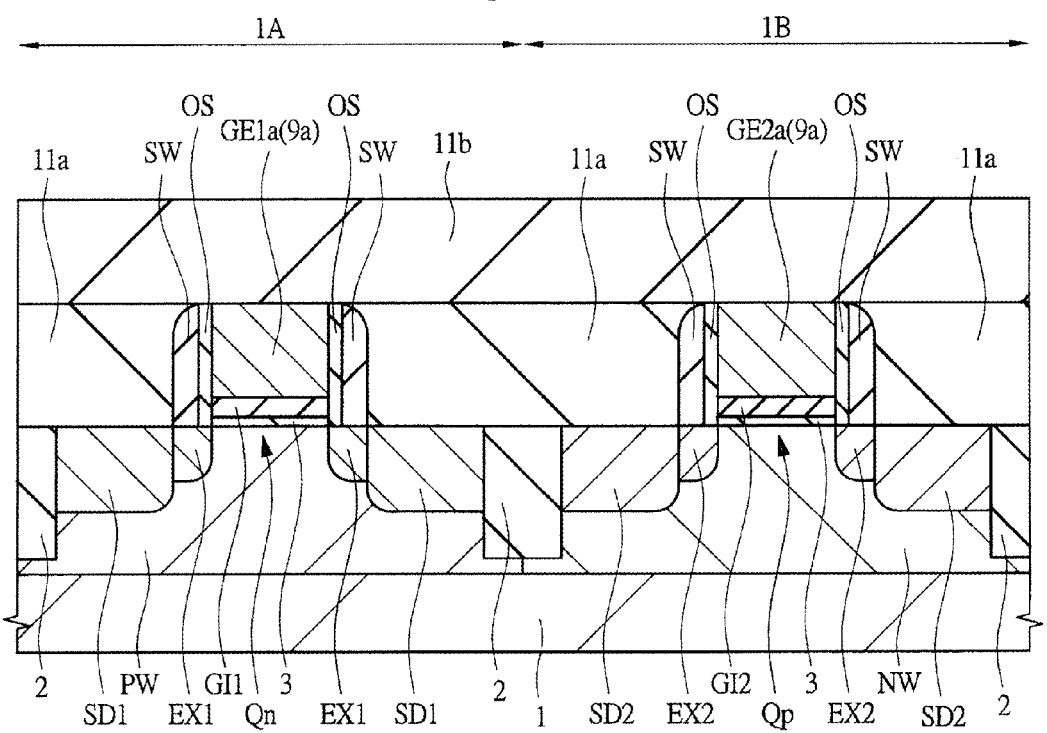
FIG. 41 is a main-portion cross-sectional view of the semiconductor device during the manufacturing steps thereof, which is subsequent to FIG. 40.
Figure 42:
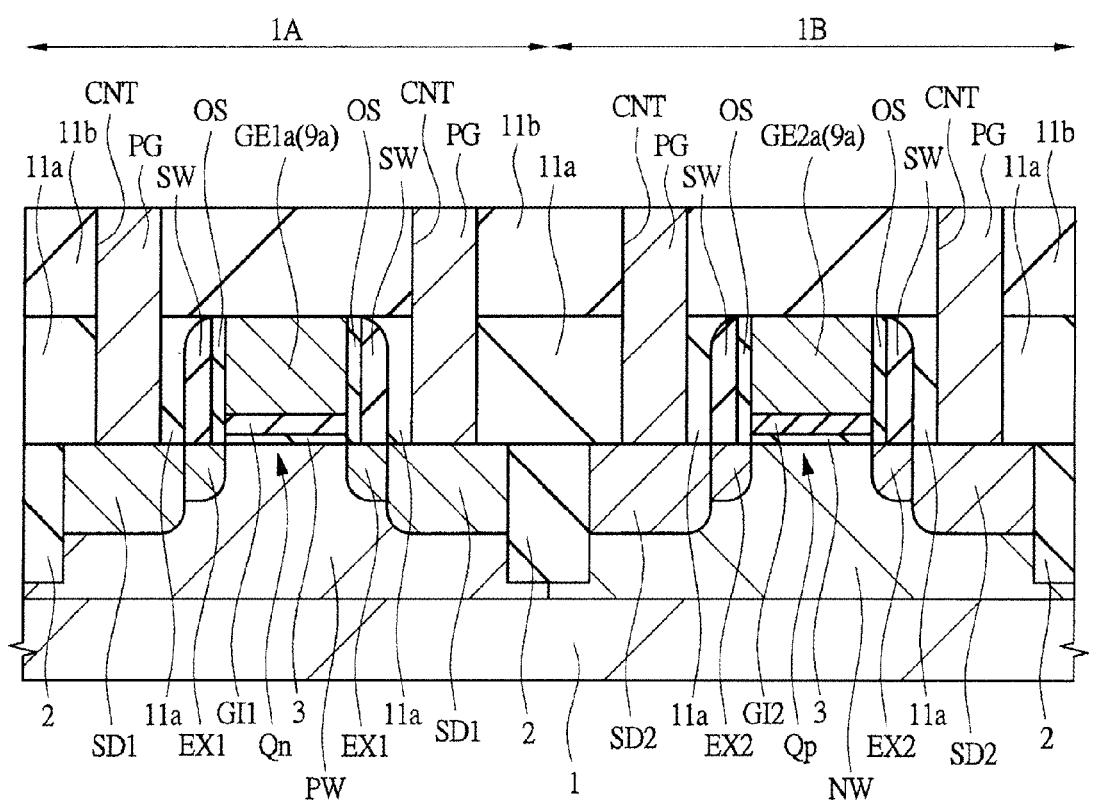
FIG. 42 is a main-portion cross-sectional view of the semiconductor device during the manufacturing steps thereof, which is subsequent to FIG. 41.
Figure 43:
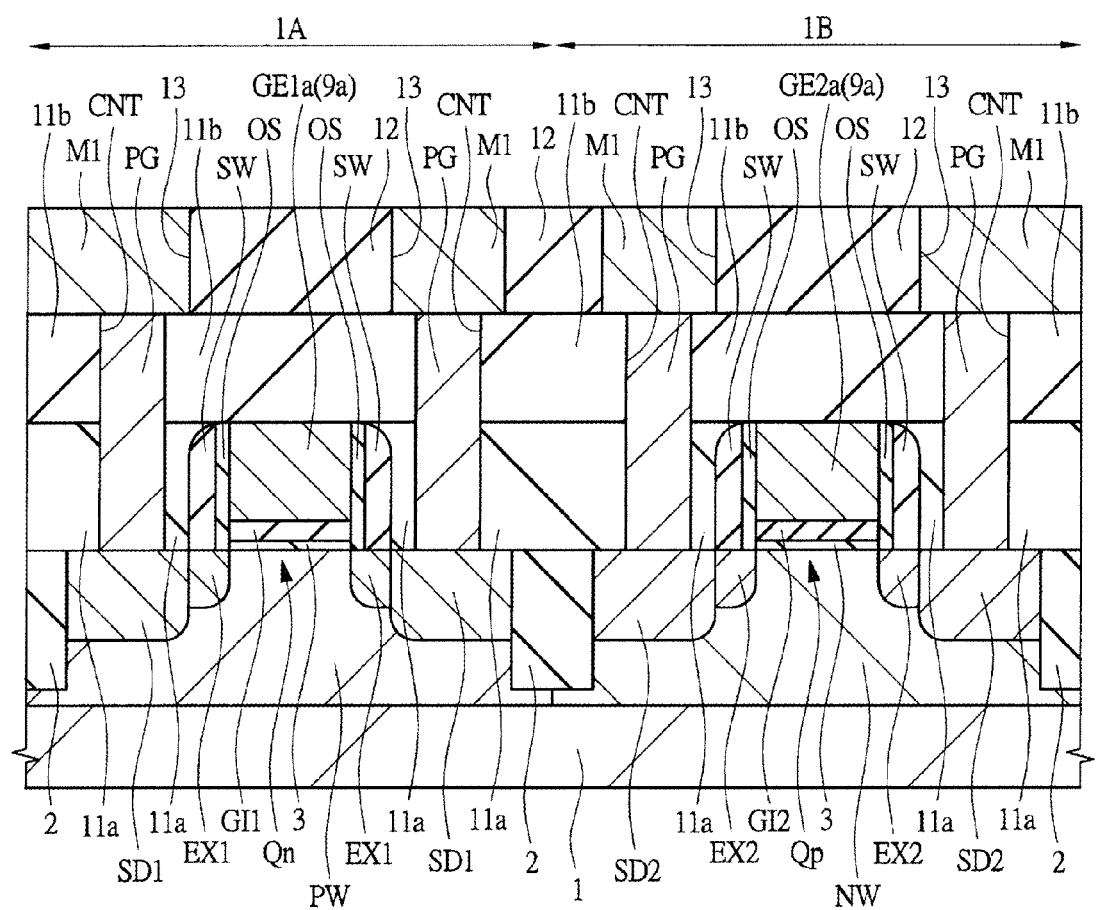
FIG. 43 is a main-portion cross-sectional view of the semiconductor device during the manufacturing steps thereof, which is subsequent to FIG. 42.

Next, as shown in FIG. 41, over the entire main surface of the semiconductor substrate 1, i.e., over the insulating film 11$a$ in which the gate electrodes GE1$a$ and GE2$a$ are embedded, an insulating film (interlayer insulating film) 11$b$ is formed. The insulating film 11$b$ is comprised of, e.g., a silicon oxide film, and can be formed using a CVD method or the like. The insulating film 11b is formed over the insulating film 11a so as to cover the upper surfaces of the gate electrodes GE1 and GE2a. After the formation of the insulating film 11b, polishing of the surface (upper surface) of the insulating film 11b or the like may also be performed by a CMP method to allow the planarity of the upper surface of the insulating film 11b to be enhanced.

Next, using a photoresist pattern (not shown) formed over the insulating film 11b as an etching mask, dry etching of the insulating films 11b and 11a is performed to form the contact holes (through holes or holes) CNT in the insulating films 11a and 11b. The contact holes CNT are formed so as to extend through the laminate film (laminate insulating film) including the insulating films 11a and 11b. The contact holes CNT are formed over, e.g., the n$^+$-type semiconductor region SD1, the p$^+$-type semiconductor region SD2, the gate electrodes GE1 and GE2, or the like.

Next, in the same manner as in Embodiment 1 described above, the plugs PG are formed (embedded) in the contact holes CNT.

The subsequent steps are the same as in Embodiment 1 described above. In the same manner as in Embodiment 1 described above, as shown in FIG. 43, the foregoing insulating film 12 is formed, the foregoing interconnect wire trenches 13 are formed, and the foregoing wires M1 are formed.

In the present embodiment also, the steps of forming the Hf-based gate insulating films (Hf-containing insulating films GI1 and GI2) and the structures thereof are the same as in any of Embodiments 1 to 3 described above. Therefore, the effects obtained in Embodiments 1 to 3 described above, which have derived from the steps of forming the Hf-based gate insulating films (Hf-containing insulating films GI1 and GI2) and the structures thereof, can also be obtained in the present embodiment.

Also, in the present embodiment, after the Hf-based gate insulating films (Hf-containing insulating films GI1 and GI2), the dummy gate electrodes (gate electrodes GE1 and GE2), and the source/drain regions are formed, the dummy gate electrodes (gate electrodes GE1 and GE2) are removed, and then the gate electrodes (gate electrodes GE1a and GE2a) are formed (a so-called gate last process is used).

On the other hand, in each of Embodiments 1 to 3 described above, the Hf-based gate insulating films (Hf-containing insulating films GI1 and GI2), the gate electrodes (gate electrodes GE1 and GE2), and the source/drain regions are formed, and the gate electrodes (gate electrodes GE1 and GE2) are not formed again (a so-called gate first process is used). This offers the advantage of being able to inhibit or prevent the phenomenon of the increased thickness of the gate insulating film resulting from the diffusion of oxygen (O) from the isolation region 2 (silicon oxide film forming the isolation region 2).

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The present invention is effective when applied to a semiconductor device and a manufacturing technique therefor.

What is claimed is:

1. A semiconductor device including a Metal Insulator Semiconductor Field Effect Transistor (MISFET), the semiconductor device comprising:
   a semiconductor substrate;
   a gate insulating film of the MISFET formed over the semiconductor substrate; and
   a metal gate electrode of the MISFET including a metal nitride film formed over the gate insulating film,
   wherein an upper part and a lower part of the gate insulating film each contain hafnium, oxygen, and nitrogen, at least the upper part additionally containing silicon,
   wherein a concentration of the silicon in a thickness direction of the gate insulating film is distributed to be higher in the upper part thereof than in the lower part thereof, and
   wherein the gate insulating film does not include a distinct interface therein.

2. The semiconductor device according to claim 1, wherein the metal nitride film is a titanium nitride film.

3. The semiconductor device according to claim 2, further comprising:
   an interfacial layer made of a silicon oxide or a silicon oxynitride and formed at an interface between the gate insulating film and the semiconductor substrate.

4. The semiconductor device according to claim 3, wherein the MISFET has a gate width of not more than 1 μm.

5. The semiconductor device according to claim 1, wherein the gate insulating film includes a laminate film including a HfON film and a HfSiON film stacked over the HfON film.

* * * * *